(12) United States Patent
Higuchi et al.

(10) Patent No.: US 6,637,008 B1
(45) Date of Patent: Oct. 21, 2003

(54) ELECTRONIC HOLDING CIRCUIT AND ADJUSTING METHOD THEREOF USING A PROBABILISTIC SEARCHING TECHNIQUE

(75) Inventors: Tetsuya Higuchi, 706-203, Azuma 2-Chome, Tsukuba City, Ibaraki Pref. (JP); Masahiro Murakawa, Tsukuba (JP); Yuji Kasai, Tsukuba (JP); Shogo Kiryu, Tsukuba (JP); Toshio Adachi, Atsugi (JP); Shiro Suzuki, Atsugi (JP)

(73) Assignees: Agency of Industrial Science and Technology, Tokyo (JP); Tetsuya Higuchi, Tsukuba (JP); Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/397,636

(22) Filed: Sep. 16, 1999

(30) Foreign Application Priority Data

Sep. 18, 1998 (JP) .......................................... 10-265363
Aug. 26, 1999 (JP) .......................................... 11-240034

(51) Int. Cl.$^7$ ............................................. G06F 17/50
(52) U.S. Cl. ......................................................... 716/2
(58) Field of Search ............................... 716/2, 5, 7, 10

(56) References Cited

U.S. PATENT DOCUMENTS 6,067,409 A * 5/2000 Scepanovic et al. ........... 716/8
6,097,073 A * 8/2000 Rostoker et al. ............ 257/401

FOREIGN PATENT DOCUMENTS

| JP | 8-204504 | 8/1996 |
| JP | 9-294069 | 11/1997 |
| JP | 10-307805 | 11/1998 |

OTHER PUBLICATIONS

Kajitani, et al.; "Implementation of the Circuit for Determining the Neural Network Structure with Gas"; Journal of Japanese Neural Network Society, 1998, vol. 5, pp. 145–153.

Goldberg, D.; Genetic Algorithms in Search, Optimization, and Machine Learning; Addison–Wesley Publishing Co., 1989.

Fogel, D.B.; "Evolutionary computation: Toward a New Philosophy of Machine Intelligence"; IEEE Press, 1995.

"Monolithic Microwave Integrated Circuit"; The Institute of Electronics, Information and Communication Engineers of Japan., 1997, pp. 169–175. (Japanese Language).

Aarts and Korst; "Simulated Annealing and Boltzmann Machines"; John Wiley & Sons; 1989.

* cited by examiner

*Primary Examiner*—Matthew Smith
*Assistant Examiner*—Thuan Do
(74) *Attorney, Agent, or Firm*—Oliff & Berridge, PLC

(57) ABSTRACT

In an electronic circuit being provided with a plurality of circuit elements and performing a specified function, a plurality of specific circuit elements related to a circuit performing the specified function out of the plurality of circuit elements are composed of circuit elements changing their element parameters according to values indicated by control signals. The electronic circuit is provided with a plurality of holding circuits for holding a plurality of control signals to be given to the plurality of specific circuit elements. The values of the plurality of control signals which these holding circuits hold are changed by external or internal apparatuses according to a probabilistic searching technique (for example genetic algorithms or simulated annealing algorithms) so that the function of the electronic circuit satisfies designated specifications.

30 Claims, 40 Drawing Sheets

FIG. 2a
RELATED ART
Adjusting point     Adjustment result
FIG. 2b
RELATED ART
Adjusting point     Adjustment result

ELECTRONIC HOLDING CIRCUIT AND ADJUSTING METHOD THEREOF USING A PROBABILISTIC SEARCHING TECHNIQUE

BACKGROUND OF THE INVENTION

1. Field of the Invention

The present invention relates to an electronic circuit provided with a plurality of circuit elements performing a specified basic function and its adjusting method, including an analog filter circuit and its adjusting method, a high-frequency circuit and its adjusting method, and an integrated circuit and its adjusting method. The present invention can be effectively applied to an electronic circuit in which analog values such as the amplitude, phase, frequency of a signal are important.

2. Related Art

Previously, (1) effort in a circuit design, (2) adjustment of adjusting points provided on an electronic circuit, (3) effort to reduce errors in production of a semiconductor integrated circuit and (4) selection of manufactured electronic circuits have been used as methods for improving the accuracy attained by an electronic circuit in producing a target value.

However, method (1), making an effort in a circuit design, needs to be repeated until a good result can be obtained. The design process is repeated until variation in the function of an electronic circuit caused by variation in characteristics of elements forming the electronic circuit becomes as insensitive as possible. In the case that a target function has a high energy content, it is necessary to exactly grasp such parameters as transfer characteristics of the circuit elements and when it is difficult to do so, it is technically difficult to design such a circuit.

Moreover, since there is also the method of item (2), adjusting points are provided on an electronic circuit. Usually, the number of adjusting points is made as small as possible during of design. In case the number of adjusting points becomes large, an effort in a circuit design is made so that adjustment results are independent of one another, as shown in FIG. 2(*a*). But when performing such a circuit design that makes it possible to obtain adjustment results independent of one another this method has an advantage of making adjustment easy. But, on the other hand, it requires a special circuit design to obtain its adjustment results. Additionally, the circuit design becomes complicated and needs to adopt a number of high-accuracy elements. For example, adding a trimmer capacitor TC at a point of a signal source impedance Z where a signal s appears, it is possible to adjust the phase delay quantity of the signal s but at the same time as this adjustment occurs, the amplitude of this signal is also changing. In order to change only the phase and not to change the amplitude, it is necessary to add a circuit for compensating for the amplitude change or to use a separate complicated phase delay adjustment circuit.

A circuit to make only a single parameter variable as described above, or a circuit to perform compensation so as to make only a single parameter variable is here referred to as an "equalizing circuit". An equalizing circuit needs a greater number of circuit elements in comparison with a simple circuit and often needs more accurate elements.

Therefore, the prior method is expensive in design cost and long in design time. And it is sometimes necessary to adopt expensive elements that are highly redefined in an electronic circuit when designing the circuit.

Further, when adjusting the adjusting points of item (2), the effects which adjustment points have on circuit characteristics are not independent of one another as shown in FIG. 2(*b*). When the design is simple, a small number of elements can do and high-accuracy elements are not necessary. However, it is still necessary to divide an electronic circuit into very small parts and adjust operation of the electronic circuit individually. With these small parts, the adjustment is very complicated and when individual measurements cannot be performed, the adjustment is very difficult.

Sometimes, when a plurality of adjusting points, as described above, cannot be adjusted independently of one another, the size of an adjustment range has the same number of dimensions as the number of adjusting points linked with one another, the adjusting and search space expands in proportion to the number of adjusting points at an exponential rate. The adjustment then requires an impractical time or becomes impossible. Considering as an example, a case in which there are ten adjusting points to be adjusted by a setting signal of 8 bits and all of them are linked to one another. The search space for adjustment has an enormous number of combinations of "$2^{\wedge}80 \approx 10^{\wedge}24$", and it has been impossible using the prior methods to perform adjustment in a practical time.

Additionally, a pre-set resistor or trimmer capacitor used at an adjusting point can be made large in size so that it can be operated by an adjusting bar or the like in order to adjust a parameter by a mechanical means. Such a method has a disadvantage that it is expensive to adjust. Furthermore, an alternate adjustment method using a laser trimming operation gives a physically unrestorable change to the adjusting point. Thereafter, once the circuit fails in adjustment the electronic circuit cannot adjusted.

Last, the method of making errors in production small in item (3) is problematic in that there is limitation in processing accuracy of a semiconductor material. A high-accuracy process is expensive.

And the method of selecting electronic circuits in item (3) has a problem, since an electronic circuit whose function does not meet the specified target value is treated as a defective product and is generally discarded, the electronic circuit manufacturing process can be very low in its yield rate and becomes remarkably uneconomical.

Furthermore, considering individual circuits, an analog filter circuit (filter circuit) performs a process of removing a specific frequency-band signal component of an input signal or a process of taking out only a specific frequency-band signal component (filtering process). In the case of mass production it sometimes occurs that individual filter circuits vary greatly in filter characteristics due to irregularities in material and manufacturing errors. Then a desired signal component and an unnecessary signal component (a frequency component out of the passing band of a filter circuit) are sometimes not completely separated. Filter circuits have been made into an LSI (large scale integrated circuit) in recent years. Since such an LSI filter circuit cannot replace individual components, an LSI filter circuit whose filter characteristics are not within an acceptable range is treated as a defective product and discarded.

A mixer circuit sometimes outputs unnecessary signal components (image frequency components, local oscillation frequency components, harmonic components of a total frequency or a differential frequency of the mixer circuit) due to variation in characteristics of circuit elements.

Since a high-frequency circuit handles a signal having high-frequency components (radio frequency components of 100 kHz or higher in general), it has a problem of parasitic inductance and parasitic capacitance. Furthermore, it often needs to consider frequency dependence in transfer characteristics of a circuit elements, and scattering and reflection of a signal at a characteristic impedance discontinuity point. Therefore, it has typically required a long time for design and manufacture, and has been high in development cost and manufacturing cost.

A high-frequency integrated circuit is a circuit obtained by integrating a high-frequency circuit conventionally composed of discrete components into an LSI by means of a semiconductor integrated circuit technology. In order to attain a specified performance in this integrated circuit, it is necessary to perform impedance matching and accurately set the parameters of individual electronic circuits contained in the integrated circuit to specific values. In order to do so, it is necessary to know accurate parameter values of circuit elements and exactly manage its manufacturing process, and therefore a high-frequency integrated circuit has needed a longer time for design and manufacture, and a higher development cost and higher manufacturing cost in comparison with a low-frequency integrated circuit.

In conventional integrated circuit design, a designed circuit has been verified by performing simulations of circuit operations by means of a computer. However, it is impossible to exactly simulate nonlinearly of element parameters, interference among signals in a substrate and additionally delay caused by parasitic capacitance or parasitic inductance in the case of handling a high frequency. Practically it has been necessary to evaluate characteristics of an integrated circuit manufactured on an experimental basis and redesign it. Therefore, conventional methods require a long time for design and manufacture, and have a high development and manufacturing cost.

Attempts to apply a genetic algorithm to optimization of an electronic circuit have been performed. Those conventional attempts have been performed to determine the layout of an electronic circuit by means of a genetic algorithm at the time of a circuit design. However, the former method has been applicable only when simulations of a circuit operation can be performed completely without error on a computer. When analog values of signals are important, therefore, the above-mentioned technique has been unsuccessful.

SUMMARY OF THE INVENTION

In consideration of the above-mentioned points, therefore, an object of the present invention is to provide an electronic circuit and its adjusting method capable of obtaining a higher function and higher performance than the prior art with less design labor than the prior art even when parameters of circuit elements cannot be exactly grasped or when errors occur in parameters of circuit elements in a manufacturing process, and furthermore to provide a method for preventing deterioration in function and performance of an electronic circuit caused by variation of circuit elements.

In order to attain the above-mentioned goals, an electronic circuit, like its concept shown in FIG. 1, is characterized by an electronic circuit, being provided with a plurality of circuit elements and performing a specified basic function, wherein a plurality of specific circuit elements 2 related to a basic circuit 3 performing said specified basic function out of said plurality of circuit elements are composed of circuit elements changing their element parameters according to values indicated by control signals and said electronic circuit 1 is provided with a plurality of holding circuits 5 for holding a plurality of control signals to be given, for example, through digital/analog (D/A) converter circuits 4 to said plurality of specific circuit elements 2, and the values of said plurality of control signals which said plurality of holding circuits 5 hold are changed by external apparatuses 8 and 9 according to a probabilistic searching technique so that said basic function of said electronic circuit 1 satisfies designated specifications. In FIG. 1, symbol 6 is an input terminal of the basic circuit 3 and symbol 7 is an output terminal of the basic circuit 3.

A method for adjusting an electronic circuit of the present invention, its concept shown in FIG. 1, is characterized by a method for adjusting an electronic circuit 1 being provided with a plurality of circuit elements and performing a specified basic function, wherein a plurality of specific circuit elements 2 related to a basic circuit 3 performing said specified basic function out of said plurality of circuit elements are composed of circuit elements changing their element parameters according to values indicated by control signals, and a plurality of holding circuits 5 provided in said electronic circuit 1 hold a plurality of control signals to be given, for example, through digital/analog (D/A) converter circuits 4 to said plurality of specific circuit elements 2, and the values of said plurality of control signals which said plurality of holding circuits 5 hold are changed by external apparatuses 8 and 9 according to a probabilistic searching technique so that said basic function of said electronic circuit 1 satisfies designated specifications.

According to such an electronic circuit and its adjusting method, a plurality of specific circuit elements 2 related to a basic circuit 3 performing said specified basic function out of said plurality of circuit elements of an electronic circuit 1 performing said specified basic function are composed of circuit elements changing their element parameters according to values indicated by control signals, and a plurality of holding circuits 5 provided in said electronic circuit 1 hold a plurality of control signals to be given, for example, through digital/analog (D/A) converter circuits 4 to said plurality of specific circuit elements 2, and the values of said plurality of control signals which said plurality of holding circuits 5 hold are changed by external apparatuses 8 and 9 according to a probabilistic searching technique so that said basic function of said electronic circuit 1 satisfies the designated specifications, and therefore even in case that circuit element parameters related to said basic circuit 3 performing said specified basic function cannot be exactly grasped or in case that errors occur in circuit element parameters in a manufacturing process, it is possible to obtain a higher function and higher performance with respect to its basic function than the prior art with less design labor than the prior art and furthermore it is possible also to prevent deterioration in function and performance of an electronic circuit caused by variation of circuit elements.

The performance of an electronic circuit can be represented by a function F having as a parameter the transfer characteristic of each of a plurality of adjustable circuit elements which the electronic circuit is provided with. Making the function of an electronic circuit satisfy the designated specifications is equivalent to finding a solution for the function F. The present inventors pay attention to this point and have found that a genetic algorithm can be applied to adjustment of an electronic circuit.

A genetic algorithm is an algorithm which uses probabilistic searching techniques and (1) effectively works on a wide area search, (2) does not need such derivative information as differential values other than an evaluation function F, and (3) is easy to install. Therefore, the present invention may use a genetic algorithm in changing values of a plurality of control signals by said external apparatuses 8 and 9.

In the case that evaluation function F satisfies a specific condition, it is possible to improve a searching efficiency by using a simulated annealing method (one of the probabilistic searching techniques used in place of a genetic algorithm). Therefore, the present invention may use a simulated annealing method in changing values of a plurality of control signals by said external apparatuses 8 and 9.

And the present invention may use an evaluation function for weighting and integrating a plurality of evaluation results of said electronic circuit 1 when external apparatuses search the optimum values.

An electronic circuit of the present invention is characterized that in the electronic circuit 1, the electronic circuit itself is provided with a setting means instead of using external apparatuses 8 and 9, and a method for adjusting an electronic circuit of the present invention is characterized in that the values of a plurality of control signals are changed by said setting means provided in said electronic circuit instead of using external apparatuses 8 and 9 in a method for adjusting an electronic circuit. According to an electronic circuit of the present invention and a method for adjusting an electronic circuit of the present invention, the same action and effect as said electronic circuit and its adjusting method can be obtained. Moreover, since a setting means provided in the electronic circuit itself is used in place of external apparatuses, it is possible to further make it possible to perform adjustment by using only the electronic circuit at any time and place.

These electronic circuits and their adjusting methods of the present invention may use a genetic algorithm in changing the values of a plurality of control signals by said setting means.

And these electronic circuits and their adjusting methods of the present invention may use a simulated annealing method in changing the values of a plurality of control signals by said setting means.

Moreover, these inventions may use an evaluation function for weighting and integrating a plurality of evaluation results of said electronic circuit when a setting means searches the optimal values.

And an electronic circuit of the present invention as described above and a basic circuit 3 in a method for adjusting an electronic circuit of the present invention may be an analog filter circuit, and particularly may be a Gm-C filter circuit.

Furthermore, an electronic circuit of the present invention and a basic circuit 3 in a method for adjusting an electronic circuit of the present invention may be a high-frequency circuit, and may be an integrated circuit, and an integrated circuit in this case may be a high-frequency integrated circuit in particular.

BRIEF DESCRIPTION OF THE DRAWINGS

FIGS. 2a and 2b are explanatory diagrams showing the problem in the prior art.

DETAILED DESCRIPTION OF PREFERRED EMBODIMENTS

Figure 1:
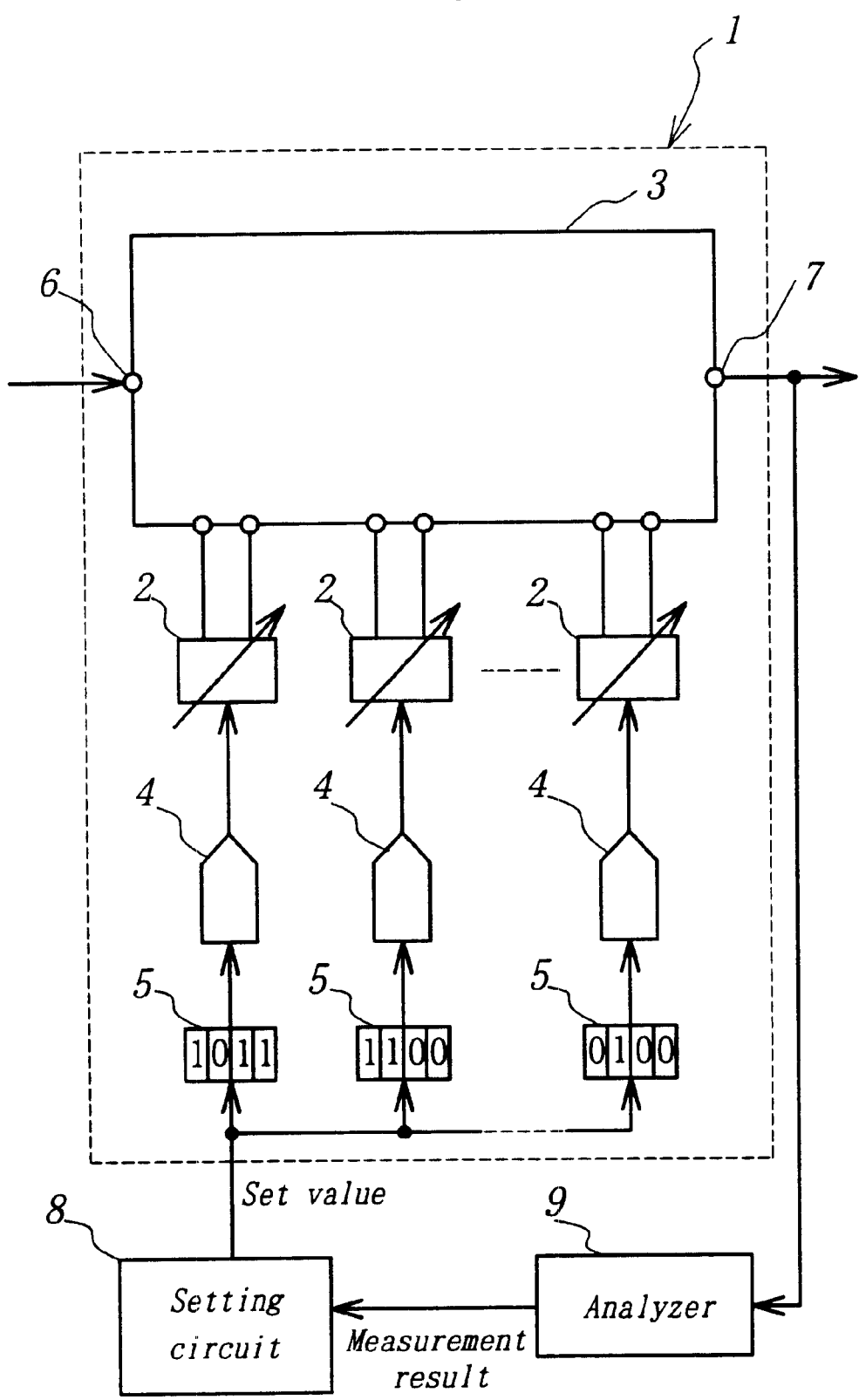
FIG. 1 is a conceptual diagram showing an electronic circuit of the present invention and a method for adjusting an electronic circuit of the present invention.

Embodiments of the present invention are described in detail with reference to the drawings in the following. In the drawings, illustration of power supply circuit or the like is omitted since they are not directly related to the novel aspects of the present invention.

Figure 3:
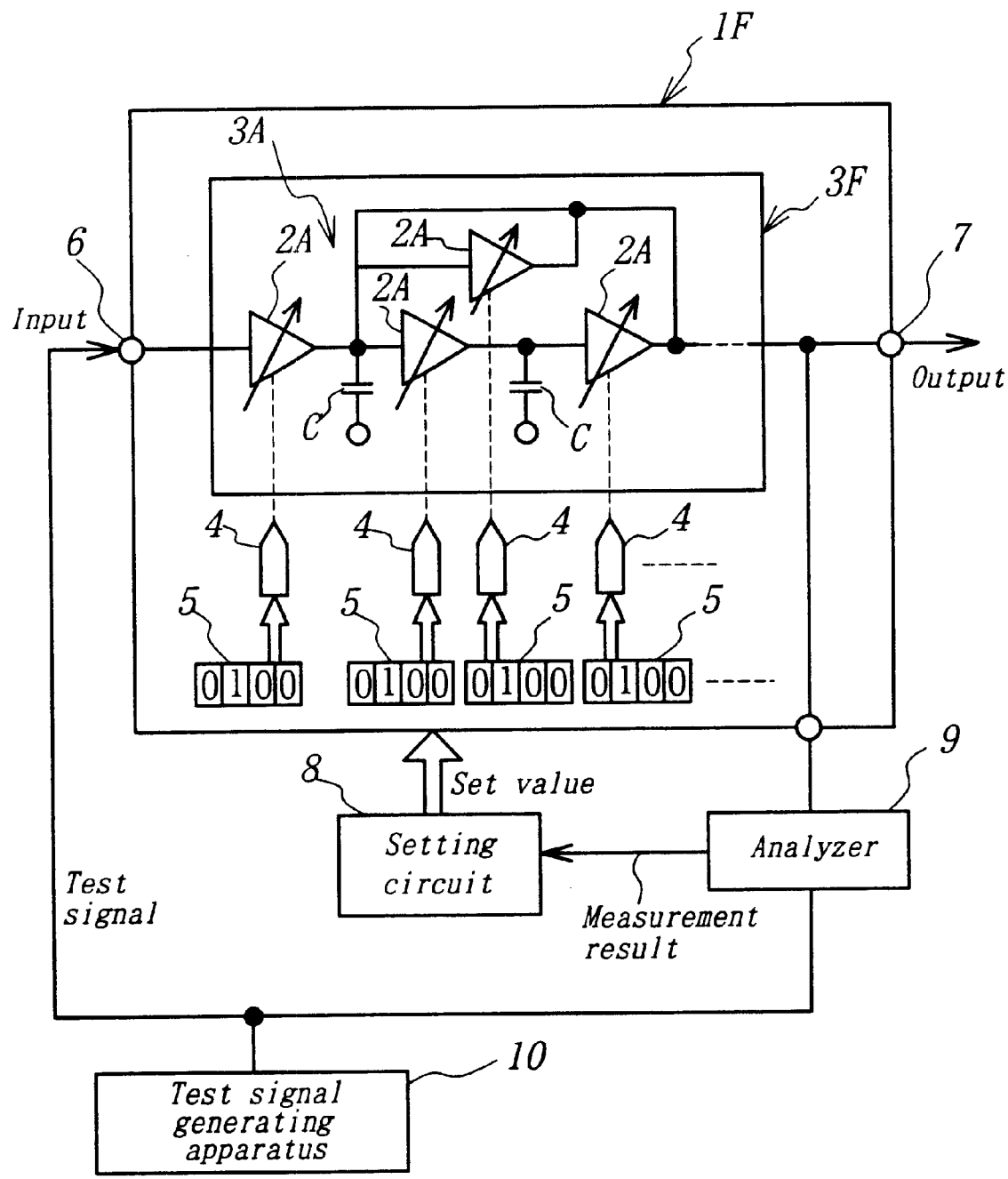
FIG. 3 is a composition diagram illustrating a first embodiment of an electronic circuit.

FIG. 3 is a composition diagram illustrating a Gm-C filter circuit as a first embodiment of an electronic circuit of the present invention. In FIG. 3, symbol 1F shows a Gm-C filter circuit as an electronic circuit 1, and a setting circuit 8 and an analyzer 9, described later, are external apparatus. The Gm-C filter circuit 1F in this case is provided with a filter circuit main part 3F as a basic circuit to be adjusted, and the filter circuit main part 3F is composed of three filter circuits 3A connected in series to one another. Each of the filter circuits 3A is composed of an ordinary fixed-capacitance capacitor C and a Gm amplifier (whose gain or transconductance can be variably set) 2A, for example, 2A1 to 2A13, as a circuit element for changing its element parameter according to a value indicated by a control signal. In this embodiment, the capacitor C is not of a variable-capacitance type, but if using as the capacitor C a variable-capacitance capacitor changing its element parameter according to a value indicated by a control signal, it is possible to further improve the uniformity in a manufacturing process.

Table 1 shows an example of the required specifications for the Gm-C filter circuit. This filter circuit is to function as a band-pass filter having a center frequency of 455 kHz and a bandwidth of 21 kHz, and among the required specifications it is especially important that its attenuation is −3 dB at 444.5±1 kHz and 465.5±1 kHz. Such required specifications are so strict that they cannot be satisfied even if its center frequency is slipped by only 1%.

TABLE 1

| Frequency characteristics | MIN. | TYP. | MAX. |
| --- | --- | --- | --- |
| Attenuation at 455 ± 10.5 kHz |  | −3 dB |  |
| Attenuation at 455 ± 30 kHz | −48 dB |  |  |
| Attenuation at 455 ± 50 kHz | −72 dB |  |  |

In a digital filter circuit composed of a digital signal processor (DSP), since its output is uniquely determined with respect to input data so long as there is no error in its digital circuit, it is not necessary to perform adjustment. However, since the Gm-C filter circuit of this embodiment is an analog filter circuit and the Gm amplifier 2A varies greatly in performance from its design specifications due to manufacturing errors, adjustment is indispensable in order to satisfy the above-mentioned specifications.

Figure 4:
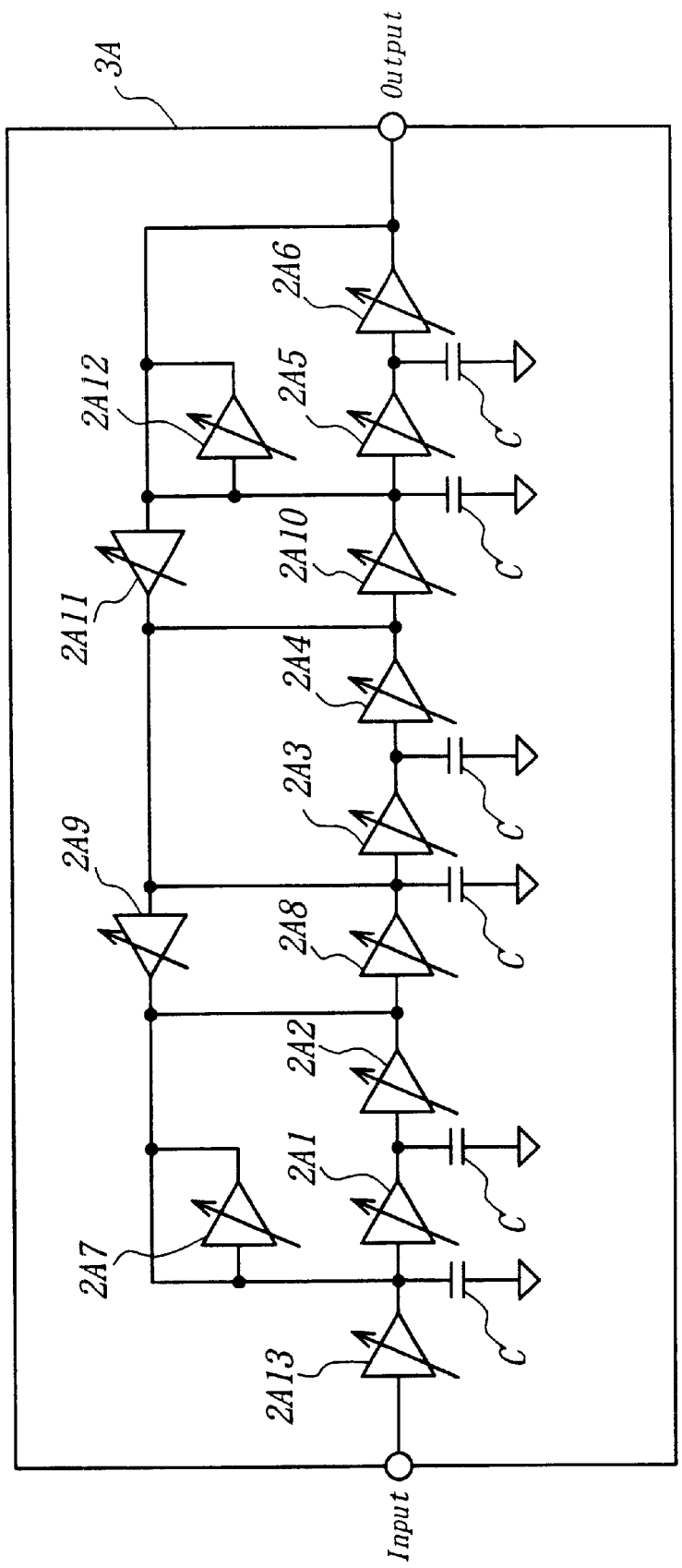
FIG. 4 is a composition diagram showing a filter circuit used in the electronic circuit of the embodiment of FIG. 3.

In the filter circuit 3A shown in FIG. 4 there are thirteen Gm amplifiers 2A, and the Gm amplifier 2A having input and output short-circuited functions as a variable load resistor. The Gm amplifiers 2A1 to 2A6 are amplifiers associated with the center frequency, the Gm amplifiers 2A7 to 2A12 are amplifiers associated with the bandwidth, and the Gm amplifier 2A13 associated with a pass band gain. Thus the filter circuit main part 3F to be adjusted is composed of the thirty-nine (13×3=39) Gm amplifiers 2A in total, and in this embodiment the filter circuit main part 3F as well as the Gm-C filter circuit 1F are made satisfy the required specifications in characteristic by finely adjusting the transconductance values of these thirty-nine Gm amplifiers. As illustrated in FIG. 2(b), however, since this filter circuit main part 3F is such a circuit that adjustment of a certain Gm amplifier 2A has an influence on an adjustment result of another Gm amplifier 2A, an ordinary method results in making an adjusting and search space generate a large number of combinations. Therefore, an adjusting technique described later using a genetic algorithm according to the present invention is very effective.

In FIG. 3, symbol 4 represents a digital/analog (D/A) conversion circuit and these D/A conversion circuits 4 each provide an electric current corresponding in magnitude to a digital value held by a register 5 as a holding circuit to a corresponding Gm amplifier 2A as a control signal (bias current). Since the D/A conversion circuits 4 and the registers 5 each have a one-to-one correspondence to a Gm amplifier 2A, they are provided equal in number to the Gm amplifiers 2A. The register 5 can output a digital value which it holds to the D/A conversion circuit 4 and the digital value it holds can be changed by the setting circuit 8. It is particularly preferred that the register 5 comprises a non-volatile memory capable of holding its digital value even after power is turned off, for example, an EEPROM, an FeRAM, a fuse ROM. Alternatively, however, the register 5 may comprise a memory holding its digital value by being backed up by an internal battery.

Furthermore, in FIG. 3, symbol 6 represents a terminal for inputting a signal to be filtered and symbol 7 represents a terminal for outputting a filter-processed signal.

Figure 5:
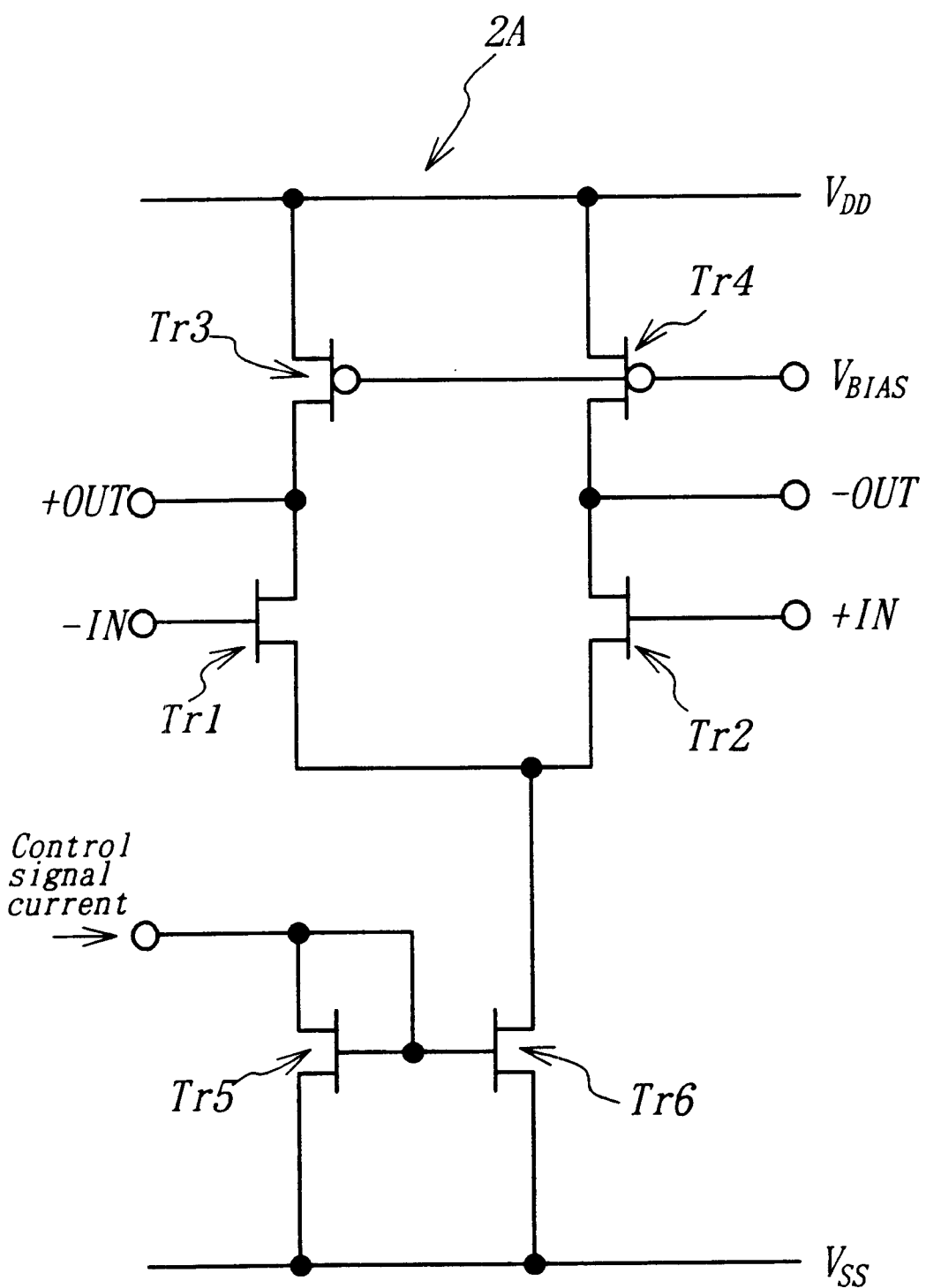
FIG. 5 is a composition diagram illustrating a Gm amplifier used in the filter circuit of FIG. 4.

FIG. 5 is a composition diagram illustrating the composition of said Gm amplifier 2A, and the Gm amplifier 2A of this example is composed of MOS FETs Tr1 and Tr2 which are formed on the same semiconductor substrate and output signals obtained by amplifying positive and negative signals +IN and −IN inputted to gate terminals to their drains, MOS FETs Tr3 and Tr4 which are used as load resistors, and Tr5 and Tr6 which form a current mirror circuit for supplying a bias current proportional to a control signal current, wherein the source sides of Tr3 and Tr4 are connected to a power line VDD, the drains of Tr1 and Tr3 are connected to "+OUT" and similarly the drains of Tr2 and Tr4 are connected to "−OUT", and output is taken out from the "+OUT" and "−OUT". And therefore, the sources of Tr5 and Tr6 forming a current mirror circuit are connected to a ground line VSS, the sources of Tr1 and Tr2 are connected to the drain of Tr6, and the output current (bias current) of the D/A converter 4 which is a control signal current is inputted to the connection point of the gate and drain of Tr5.

Figure 6:
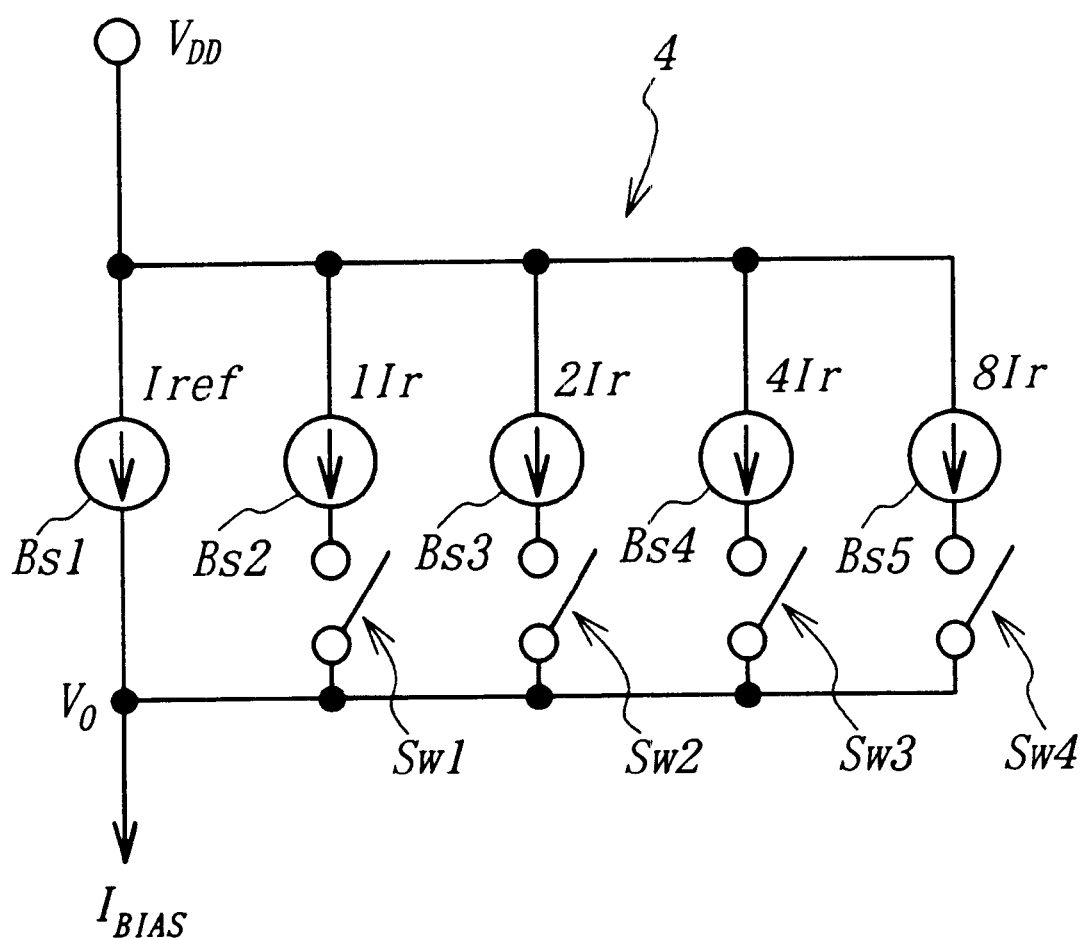
FIG. 6 is a composition diagram illustrating a D/A converter circuit used in the electronic circuit of the embodiment.

FIG. 6 is a composition diagram illustrating the composition of said D/A conversion circuit 4, and the D/A conversion circuit 4 of this example corresponds to a case where a register 5 holds data of 4 bits. In this D/A conversion circuit 4, the bits of a register value held by the register 5 respectively correspond to switch circuits Sw1 to Sw4 through decoder circuits not illustrated, and the switch circuits Sw1 to Sw4 are composed so as to operate according to a register value, and a bias current generated as a result is inputted into said Gm amplifier 2A as a control signal.

That is to say, the D/A conversion circuit 4 is composed of bias current sources Bs1 to Bs5 as adjusting signal generating sources which are constant current sources for generating currents being respectively different in generated current, and the switch circuits Sw1 to Sw4 for selecting these bias current sources Bs2 to Bs5, and the bias current source Bs1 generates a reference bias current whose value is determined by design. Therefore, the respective series circuits in which the bias current sources Bs2 to Bs5 and the switch circuits Sw1 to Sw4 corresponding respectively to the bias current sources are connected in series to each other are connected in parallel between the power line VDD and the bias line VO, and thereby currents generated by the bias current sources Bs1 to Bs5 are added to a bias reference current Iref and a bias current IBIAS formed on the basis of the currents generated from the bias current sources Bs1 to Bs5, and the bias current IBIAS is supplied to the Gm amplifier 2A.

Whereupon, the bias current source Bs2 generates a small current of 1Ir proportional to the bias reference current Iref, and in the same way the bias current source Bs3 generates a small current of 2Ir being double said bias current 1Ir, the bias current source Bs4 generates a small current of 4Ir being 4 times said bias current 1Ir, and the bias current source Bs5 generates a small current of 8Ir being 8 times said bias current Ir. And the switch circuits Sw1 to Sw4 corresponding to the respective bias current sources Bs2 to Bs5 are on/off-controlled on the basis of the register value of a register 5, and when a bit out of the four bits of the register value is "1", a switch circuit corresponding to this bit is brought into the on state and a specified small current is generated from the corresponding bias current source. And when a bit out of the four bits of the register value is "0", a switch circuit corresponding to this bit is brought into the off state and a current output from the corresponding bias current source is stopped.

Therefore, since the currents generated from the bias current sources Bs2 to Bs5 are respectively set as 1Ir, 2Ir, 4Ir and 8Ir, and are added to the bias reference current Iref, the bias current IBIAS can be adjusted in a range from "the bias reference current Iref +0Ir" to "the bias reference current Iref+15Ir" according to combination of the switch circuits to be brought into the on state.

In FIG. 3, symbol 8 is a setting circuit, and this setting circuit 8 searches the optimum values as values to be held by a plurality of registers 5 according to a genetic algorithm described later. The setting circuit 8 can be composed of a personal computer or a microcomputer, and can be also composed of a programmable LSI disclosed in Japanese Patent Publication No. Hei 9-294,069, or a circuit described in Kajitani et al. article, "Implementation of the Circuit for Determining the Neural Network Structure by GA" (Journal of Japanese Neural Network Society, Vol.5, No.4, pp.145 to 153, 1998).

And in FIG. 3, symbol 9 is an analyzer and 10 is a test signal (inspection signal) generating apparatus, and the test signal generating apparatus 10 generates a test signal for adjusting a filter circuit main part 3F as well as a filter circuit IF, and this test signal is inputted into the filter circuit main part 3F and the analyzer 9. The analyzer 9 has an output signal of the filter circuit main part 3F and a test signal from the test signal generating apparatus 10 inputted, analyzes these input signals and computes a frequency response value of the filter circuit main part 3F corresponding to the test signal, and delivers this value to the setting circuit 8. The analyzer 9 and the test signal generating apparatus 10 can be also formed into one body.

Next, a first embodiment of an adjusting method of the present invention for adjusting said Gm-C filter circuit 1F.

Figure 7:
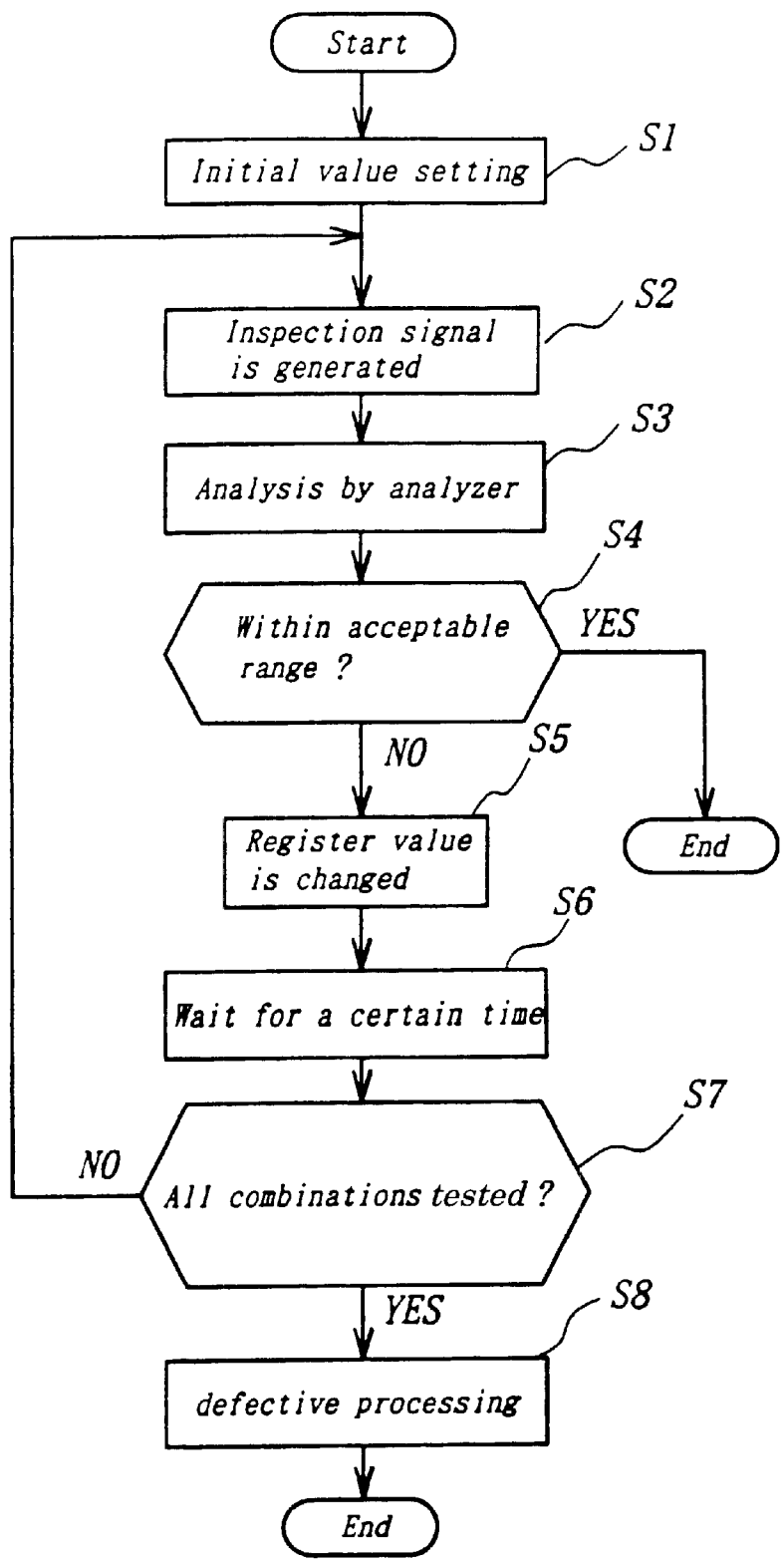
FIG. 7 is a flowchart roughly showing the procedure of the first embodiment of an electronic circuit adjusting method.

After said Gm-C filter circuit 1F has been manufactured, in an inspection process, as shown in FIG. 3, a setting circuit 8, an analyzer 9 and a test signal generating circuit 10 are connected to the said Gm-C filter circuit 1F, and the test signal generating circuit 10 inputs an inspection signal to an input terminal 6 of the filter circuit 1F and the setting circuit 8 sets the register value of a register 5 according to a procedure shown in FIG. 7.

According to this procedure, first in step S1, the setting circuit 8 writes a predetermined initial set value into the register 5 to hold it as a register value. In the next step S2, the inspection signal generating circuit 10 outputs an inspection signal and the filter circuit 1F performs a filtering process for said inspection signal according to the characteristics of the filter circuit initialized with said initial set values onto the said inspection signal. In the next step S3, the analyzer 9 analyzes the filtering process output of the filter circuit 1F and sends the analysis result to the setting circuit 8. In the next step S4, the setting circuit 8 judges whether or not the performance of the filter circuit 1F is within such an acceptable range that meets designated specifications, for example, the specifications shown in Table 1. Therefore, in case that it is not within the acceptable range, in step 5 the setting circuit 8 changes the register value which the register holds, and in the next step S6 it waits for a certain time until the changed result becomes stable, and in the next step S7 the setting circuit 8 judges whether or not all combinations have been tested, and if all the combinations have been tested, then in step S8 it performs a defective product process and then ends the said process, but if all the combinations have not ended it returns to step S2 and it repeats a series of steps described above. And in case that in step S4 the setting circuit 8 has judged that the performance of the filter circuit 1F meets designated specifications, it ends the said process.

As a method for determining said initial set value and changing a register value from the initial set value, some methods can be used and their examples are described in the following. A first method is a method which changes over the set values one after another in proper order with respect to all combinations in a range of possible register values, and a second method is a method of generating set values randomly. And a third method is a method which performs the initial setting operation using a conductance obtained at the design and finely changes the set value from the initial set value in the positive and negative directions.

In case that the number of Gm elements 2A in the filter circuit main part 3F to be adjusted is small and no large number of combinations of register values occur, the first and second methods can be used. However, since in this embodiment the number of Gm elements 2A is as many as 39 and occurrence of a large number of combinations is expected, the third method is used. A circuit adjusting method using a genetic algorithm is described in the following.

As a reference paper for said genetic algorithm, there is for example "Genetic Algorithms in Search, Optimization, and Machine Learning" written by David E. Goldberg, published by ADDISON-WESLEY PUBLISHING COMPANY, INC. in 1989. A genetic algorithm referred by the present invention means an evolutionary computing technique and includes an evolutionary programming (EP) technique. As a reference paper for an evolutionary programming, there is for example "Evolutionary Computation: Toward a New Philosophy of Machine Intelligence" written by D. B. Fogel, published by IEEE Press in 1995.

The performance of the filter circuit main part 3F can be represented by an evaluation function F taking transfer characteristics of a plurality of Gm elements 2A as parameters. Making the performance of the filter circuit main part 3F meet designated specifications is equivalent to finding parameter values which optimize the evaluation function F. The present inventors pay attention to this point and have found that said genetic algorithm can be applied to adjustment of the filter circuit main part 3F. The setting circuit 8 changes register values of the registers 5 according to this genetic algorithm.

A genetic algorithm first sets a population of virtual creatures having genes, and makes the individuals adapted to the environment survive and leave their descendants more adapted. Then it makes a child inherit the genes of its parents by means of a procedure called a genetic operation. Individuals having a high fitness become the majority of a population by performing such inheritance between generations and making the genes and the population evolve. As a genetic operation in this case, there are used techniques of gene crossover, mutation which occur also in actual reproduction.

Figure 8:
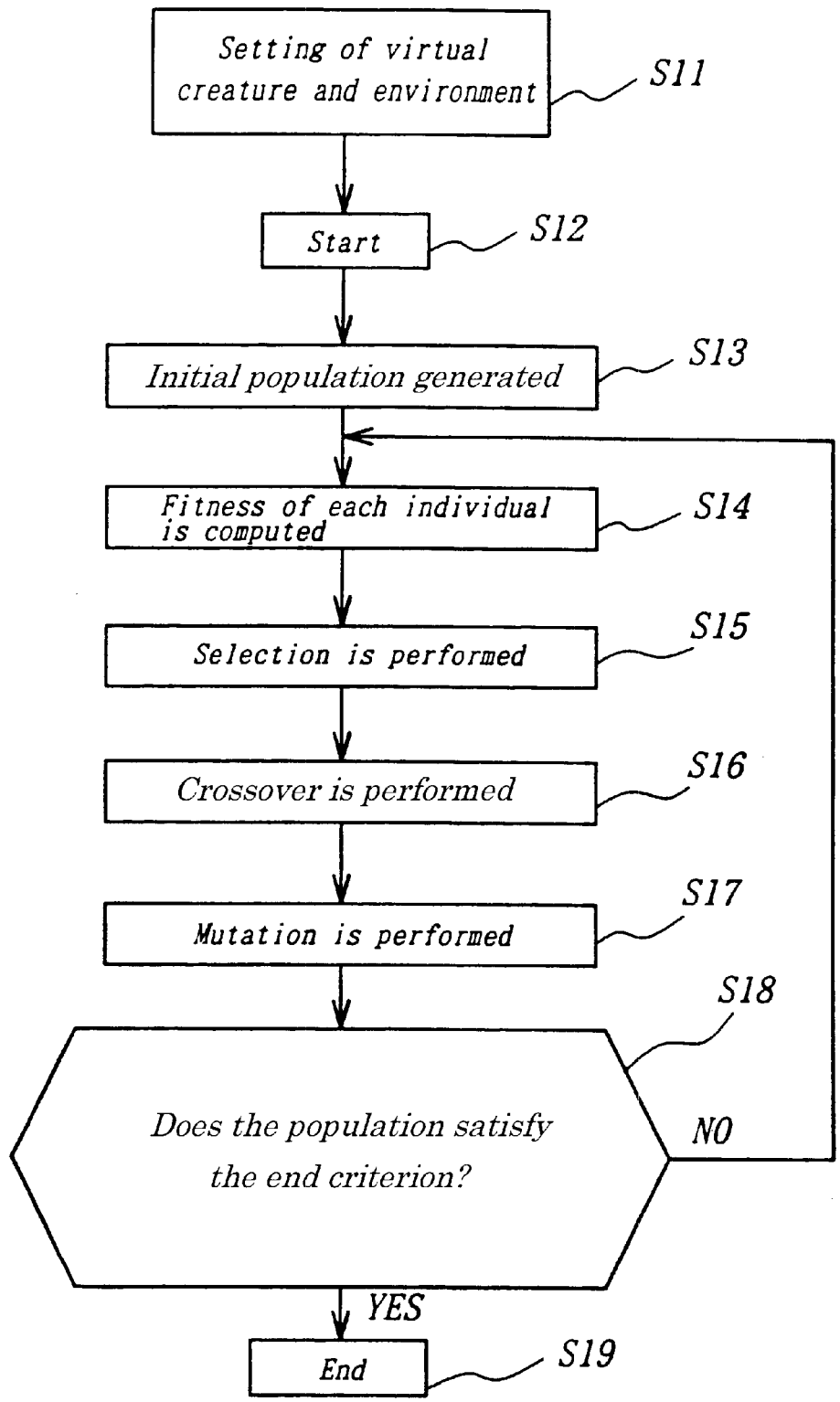
FIG. 8 is a flowchart roughly showing the procedure of a general genetic algorithm.

FIG. 8 is a flowchart showing a rough procedure of such a genetic algorithm, where first in step S11 the chromosome of an individual is determined. That is to say, in what form the content is to be transmitted between parent individuals and their child individuals in successive generations is determined.

Figure 9:
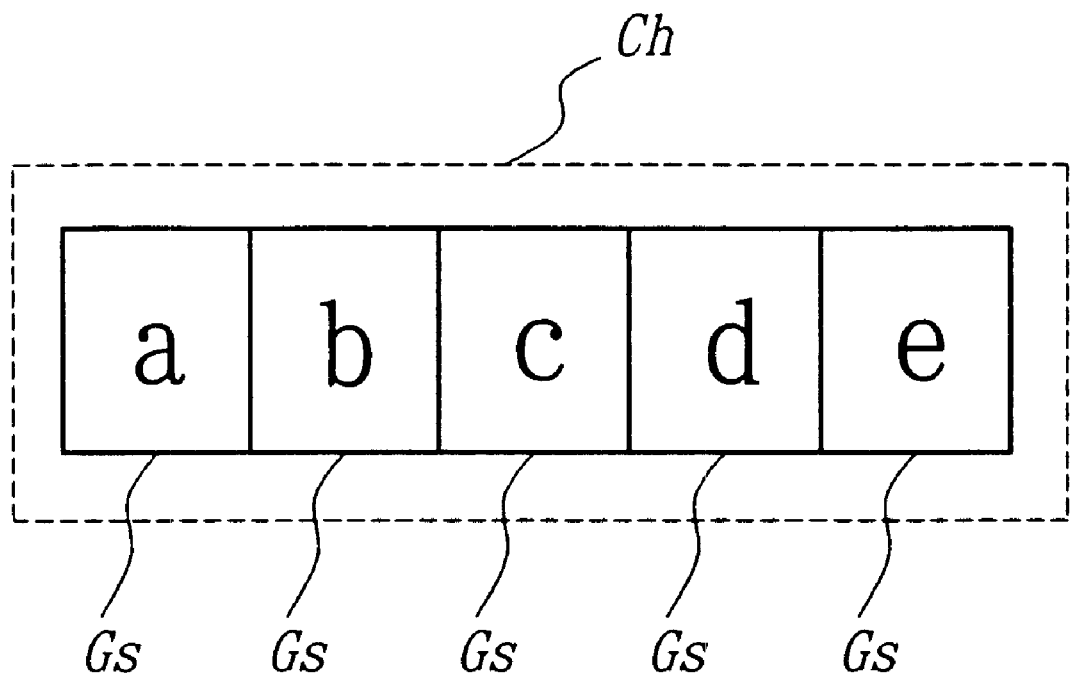
FIG. 9 is an explanatory diagram illustrating a chromosome used in a genetic algorithm.

FIG. 9 illustrates a chromosome. Here, a variable vector x of an optimization problem to be handled is represented by a sequence of M symbols Ai (i=1,2, . . .M), and this is considered as a chromosome composed of M loci. Each symbol Ai is a gene and a value which it can take is an allele. In FIG. 9, symbol Ch represents a chromosome and Gs represents a locus, and the number of loci M is five. As alleles, a certain set of integers, real number values in a certain range, a simple sequence of symbols are determined according to problems. In the example of FIG. 9, alphabetic characters of a to e represent alleles. The set of genes symbolized in such a way is a chromosome of an individual.

In the step S11, a computing method for computing fitness of each individual to an environment is shown. At this time the computing method is designed so that the more or less variable the value of an evaluation function of the optimization problem to be handled is, the higher the fitness of an individual corresponding to it is. And it is designed so that in the subsequent successive generations, the higher fitness an individual has, the higher the probability of survival or generating its descendant than another individual being lower in fitness has. Thus, an individual of lower fitness is considered an individual not well adapted to the environment and is eliminated. This reflects the principle of natural selection in the theory of evolution. Namely, fitness is a measure representing what degree an individual is excellent from a viewpoint of the possibility of survival.

In a genetic algorithm, at the beginning of a search, the problem to be handled is a perfect black box and what individual is desirable is not defined. Therefore, usually the initial population is generated using random numbers. Accordingly, in step S13 after the process has been started in step S12, the initial population is generated using random numbers. When there is some previous knowledge of a search space, such a process that generates a population around a portion whose evaluation value is considered to be high is sometimes performed.

In this case the total number of individuals to be generated is called population size.

Next, in step S14 the fitness of each individual in a population is computed on the basis of the computing method previously determined in step S11. After the fitness of each individual has been obtained, in the next step S15 individuals to be the base for individuals in the next generation is selected from the population. If only the selection is performed however, the percentage of individuals having the highest fitness at the current point of time in the population becomes the optimal result and no new searching points are generated. For this reason, operations called crossover and mutation, to be described below, are performed.

Namely, in the next step S16, a pair of two individuals is randomly selected with a fixed occurrence rate out of individuals of the next generation generated by selection and their chromosomes are recombined and thereby their child chromosomes are made (crossover). Therefore, the probability of occurrence of crossover is called a crossover rate. A descendant individual generated by crossover is an individual which has inherited characters from the respective individuals being its parents. By this crossover process, the diversity of chromosomes of individuals is made high and evolution occurs.

After the crossover process, in the next step S17 genes of individuals are changed in a certain probability (mutation). Here, the probability of occurrence of mutation is called a mutation rate. The phenomenon that the contents of a gene is rewritten is observed also in genes of an actual creature.

However, if the mutation rate is made too large, genetic features of characters of the parents to be inherited by crossover are lost and the search becomes similar to searching at random in a search space. Attention is therefore needed to ensure the mutation rate is set low enough.

Next, in step S18 it is examined whether or not the generated population of the next generation meets a criterion for ending the search. This evaluation standard typically includes the following items, depending on problem to be solved.

The highest fitness in a population has become larger than a certain threshold value.

The average fitness in the whole population has become larger than a certain threshold value.

A generation having an increasing rate of the fitness of a population which the increasing rate is not larger than a certain threshold value has been continued at least for a predetermined period.

The number of successive generations has reached a predetermined number.

When any of the above-mentioned end criterions has been satisfied, the procedure proceeds to step S19 to end the search and takes an individual having the highest fitness in the population at that point of time as a desired solution for the optimization problem. When the end criterions are not satisfied the procedure returns to the process for computing the fitness of each individual in step 14 and continues the search.

By such a repetition of successive generations it is possible to improve the fitness of each individual while keeping constant the number of individuals in a population. The above is an outline of a genetic algorithm.

The framework of a genetic algorithm as described above is so loose that details of an actual program is not prescribed, and the framework does not prescribe a detailed algorithm for an individual problem. Therefore, in order to use a genetic algorithm in adjustment of a filter circuit of this embodiment, it is necessary to implement the following items for adjustment of the circuit.

Figure 10:
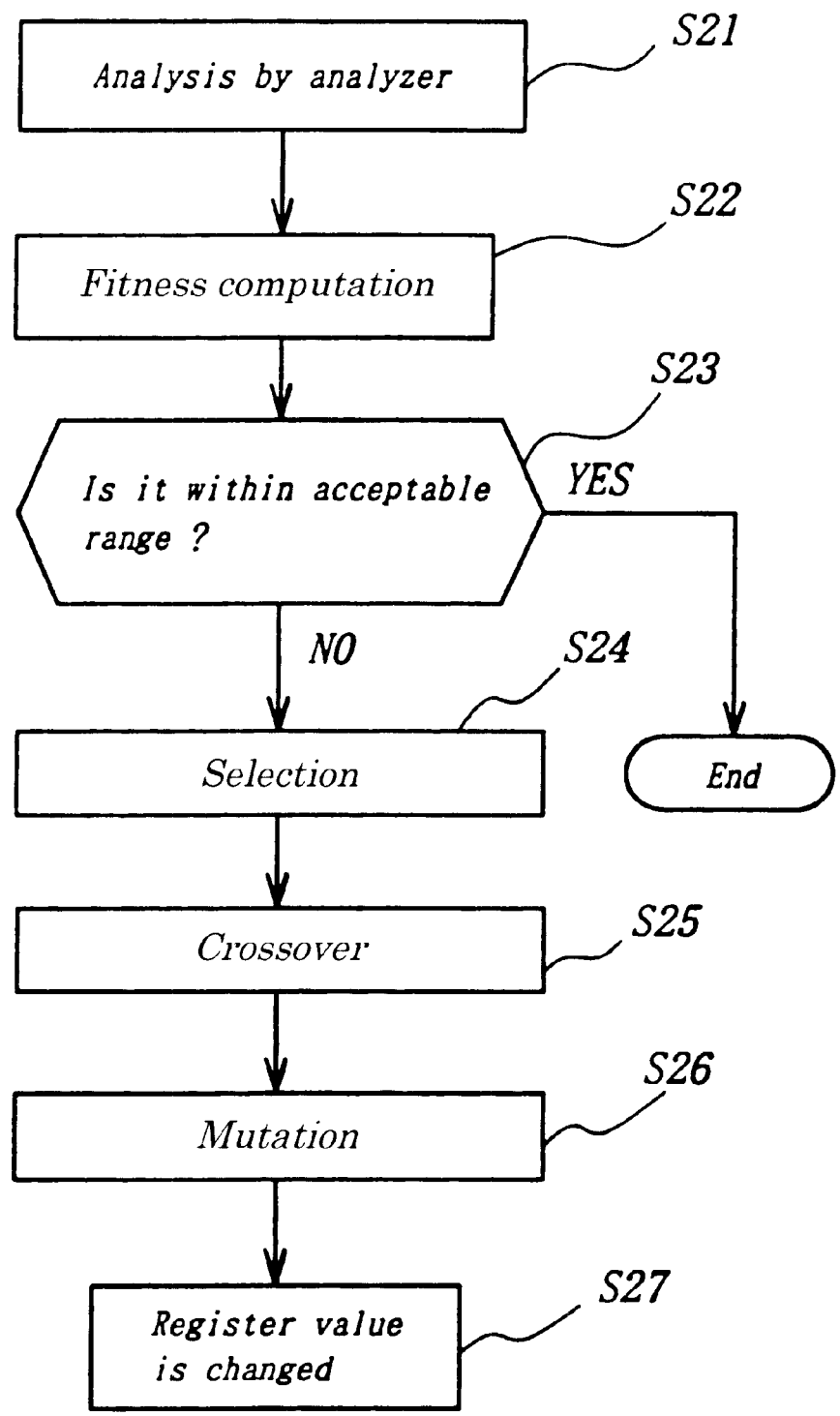
FIG. 10 is a flowchart showing the procedure using a genetic algorithm in the method of the embodiment.
Figure 11:
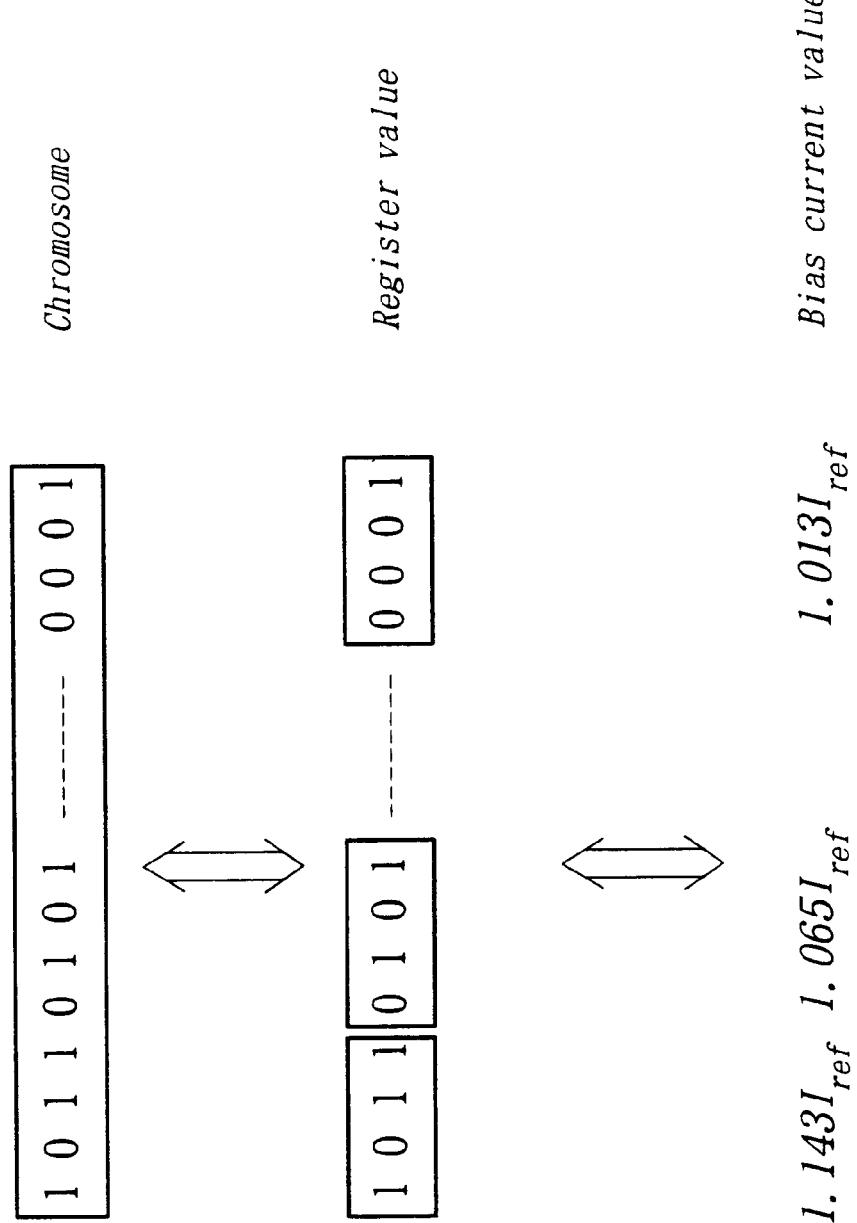
FIG. 11 is an explanatory diagram showing a chromosome used in the genetic algorithm, and the register values and bias current values determined from it in the method of the embodiment.

(a) Method for representing a chromosome
(b) Evaluation function for individuals
(c) Selection method
(d) Crossover method
(e) Mutation method
(f) End criterion for the search FIG. 10 is a flowchart showing the procedure of the setting circuit 8 using a genetic algorithm in this embodiment. A process of FIG. 10 shows an exemplary process from steps S3 to S5 of FIG. 7. This embodiment is characterized by directly using the register values of registers 5 as a chromosome in the genetic algorithm, and thereby can dispense with a circuit, for converting information of a chromosome into register values. Namely, a chromosome in this embodiment is composed of the 39 register values of the registers 5 corresponding to the thirty-nine Gm amplifiers 2A, as shown in FIG. 11. And each of the registers 5 corresponding to the respective Gm amplifiers 2A is of 4 bits. Accordingly, the register length (=length of a chromosome) is 156 bits. Therefore, the size of an adjusting and search space of the filter circuit main part 3F of said embodiment is "2^156≈10^47 (10 to the 47th power)", and it is a matter of course that adjustment cannot be performed by conventional methods.

In the D/A conversion circuit 4 shown in FIG. 6, this embodiment sets the value of 1Ir at 0.013Iref. This value is determined according to variation in performance of the Gm amplifier. For example, when the register value 1011 in FIG. 11 the switch circuits Sw4, Sw2 and Sw1 become on, and bias currents are supplied from the bias current sources Bs5, Bs3 and Bs2 in addition to the bias current source Bs1 and as a result the value of a bias current corresponding to the register value 1011 becomes "Iref+8×0.01 3Iref+2×0.01 3Iref+0.013Iref=1.143Iref". Similarly, the value of a bias current corresponding to the register value 1010 becomes "Iref+4×0.013Iref+0.013Iref=1.065Iref", and the value of a bias current corresponding to the register value 0001 becomes "Iref+0.013Iref=1.013Iref".

As an evaluation function F for individuals of the genetic algorithm used in the process of FIG. 10, a function is used which operates the filter circuit main part 3F by means of the register values represented by a chromosome of an individual and shows how to approximate the resulting frequency response value obtained by the analyzer 9 is to have an ideal frequency response value. For example, a value computed by the following evaluation function F is as the fitness of the genetic algorithm.

(Numerical expression 1)

$F = \Sigma w_i |S(f_i) - O(f_i)|$ $fitness = 1/(1+F)$

The above-mentioned evaluation function F is a weighted sum of the absolute values of the differences between ideal gains $S(f_i)$ (dB) at frequencies $f_i$ and gains $O(f_i)$ (dB) of the filter circuit main part 3F measured by the analyzer 9.

And the smaller the value of F is, the larger the value of said fitness, and in case that the filter circuit main part 3F shows an ideal response, the value of fitness becomes the maximum value of 1.0. This embodiment has obtained the value of the evaluation function F by generating sine waves of 7 frequencies (440.0, 444.5, 449.75, 455.0, 460.25, 465.5 and 470.0 kHz) by means of the inspection signal generating circuit 10. And it weights particularly the gains for inspection signals of 444.5 kHz and 465.5 kHz with a weighting factor of 5.0, and uses a weighting factor of 1.0 for the gains with respect to the other frequencies.

The value of an ideal frequency response has been obtained from the Root Nyquist criterion. Ideal response values $S(f_i)$ corresponding to said 7 sine waves (440.0, 444.5, 449.75, 455.0, 460.25, 465.5 and 470.0 kHz) are respectively −19.0 dB, −3.0 dB, 0 dB, 0 dB, 0 dB, −3 dB and −19.0 dB in order of description. Therefore, for example, assuming that the frequency response values corresponding to said 7 sine waves, of the filter circuit main part 3F operated by the register values represented by a certain chromosome are respectively −23.0 dB, −5.0 dB, 1.0 dB, −1.0 dB, −2.0 dB, −7.0 dB and −25.0 dB, the value of the evaluation function F is as follows:

(Numerical expression 2)

$F = |-19.0-(-23.0)|$
$+5.0 \times |-3.0-(-5.0)|$
$+|0.0-1.0|$
$+|0.0-(-1.0)|$
$+|0.0-(-2.0)|$
$+5.0 \times |-3.0-(-7.0)|$
$+|-19.0-(-25.0)|$
$=44.0$ and the value of fitness is 1.0/45.0.

In order to improve the performance of a circuit, it is preferred to use a population delay value in addition to the frequency response values in computation of an evaluation function.

A plurality of individuals are made using uniform random numbers as the initial population for a genetic algorithm in step S1 of FIG. 7 for use in the process shown in FIG. 10. Namely, this case means that the value of each gene of each chromosome in the initial population takes a value of 1 in a probability of 0.5 and takes a value of 0 in a probability of 0.5. In this embodiment, the number of individuals in a population is set at 40. In case that there is some previous knowledge of the tendency of variation of a circuit, it is possible to make individuals being considered to be higher in fitness into the initial population.

Next, this method operates the filter circuit main part 3F with register values represented by each individual and generates an inspection signal in step S2 of FIG. 7, and then analyzes a filter-processed output of the filter circuit main part 3F by means of the analyzer 9 in step S21 of FIG. 10 corresponding to step S3 of FIG. 7 and sends the resultant frequency response values to the setting circuit 8, and next in steps S22 and S23 of FIG. 10 corresponding to step S4 of FIG. 7, computes fitness using said evaluation function by means of the setting circuit 8 from the frequency response values sent from the analyzer 9 and judges whether or not the performance of the filter circuit main part 3F is within an acceptable range satisfying designated specifications as prescribed in Table 1, for example. And in case that it is not within the acceptable range, then this method performs selection in step S24, crossover in step S25 and mutation in step S26 by means of the setting circuit 8, and generates a population of individuals of the next generation (a candidate population for a solution).

Thus, when the performance of the filter circuit main part 3F has satisfied the designated specifications from judgment in step S23, the adjusting process is ended, but in case that a chromosome (register values) satisfying the specifications cannot be obtained even if repeating the adjusting process for a certain number of generations, the filter circuit main part 3F to be adjusted as well as the filter circuit 1 are judged as defectives and this method handles them as defectives in step S8 of FIG. 7. In this embodiment, the number of generations to end the repetition of adjustment is set at 50.

Figure 12:
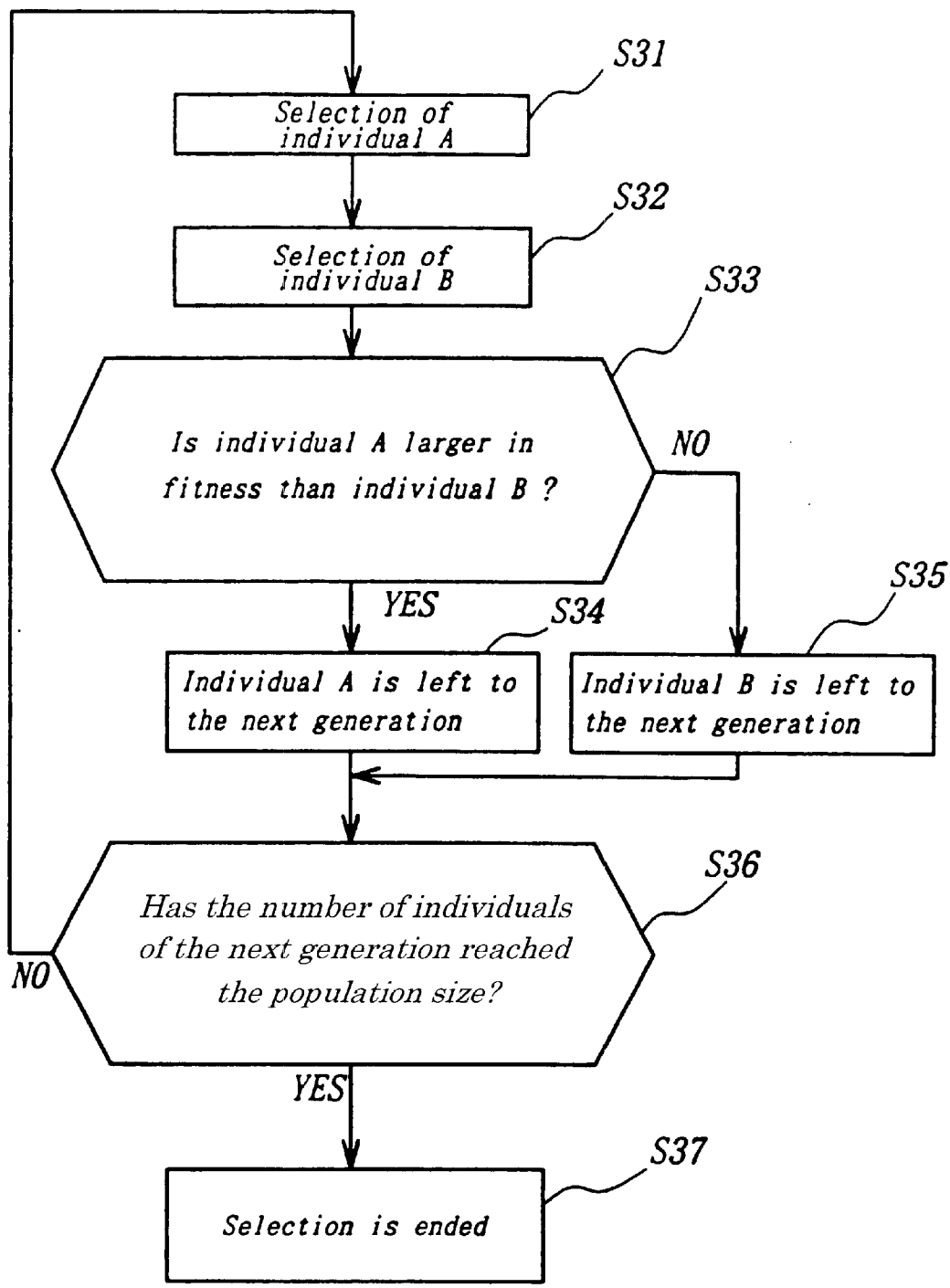
FIG. 12 is a flowchart showing the procedure of a selecting process performed by the genetic algorithm in the method of the embodiment.

Said selecting process of step S24 uses a method shown in FIG. 12. This method first selects two individuals A and B in steps S31 and S32, and then determines the individual having the larger value of fitness out of the two individuals A and B as an individual to survive the next generation. Then the method returns from step S36 to step S31 and repeats this operation until the number of individuals which have survived reaches the number of individuals in the population. By this method, the possibility that an individual being high in fitness is selected as an individual of the next generation is high, but since individuals A and B are selected at random, the possibility that even an individual being low in fitness being selected as an individual of the next generation results is possible. The reason for selecting in such a way is that if only individuals being high in fitness are left the convergence of a population is made quickly and by sticking to a local optimum solution is liable to bring a failure in adjustment.

Figure 13:
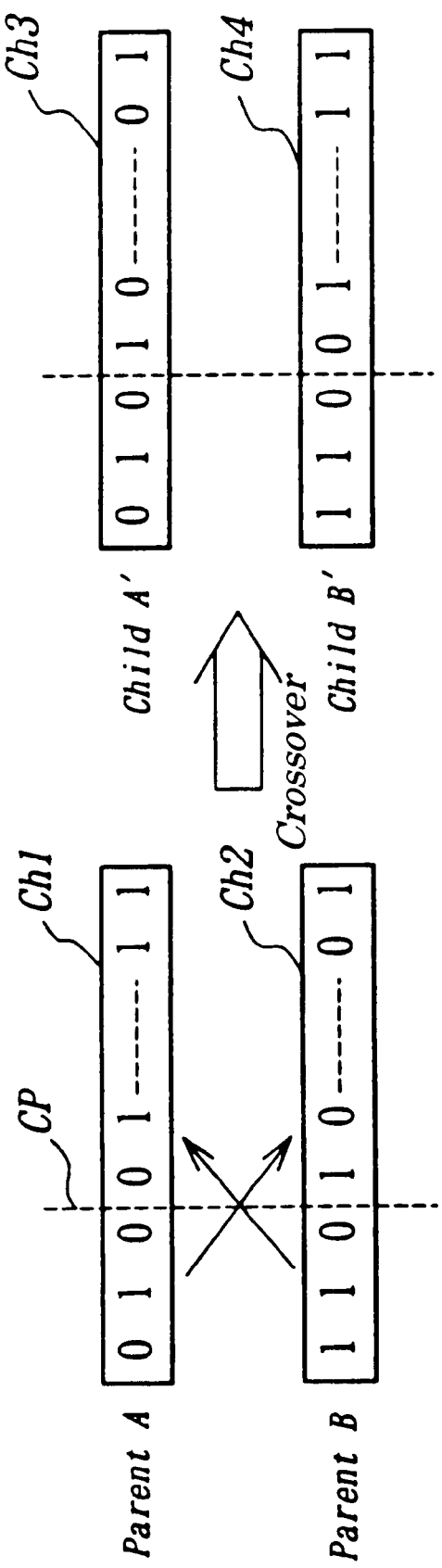
FIG. 13 is an explanatory diagram showing the procedure of a crossover process performed by the genetic algorithm in the method of the embodiment.

Thus, in a crossover process of said step S25, a method shown in an explanatory diagram of FIG. 13 is used. This is an operation for partially replacing chromosomes at random positions and is a technique called a one-point crossover. In FIG. 13, symbols Ch1 and Ch2 are chromosomes of parents A and B which have survived as a result of selection, and the crossover process in this case cuts these chromosomes at a crossover position CP selected at random. The example of FIG. 13 selects a position between the third bit and the fourth bit from the left as the crossover position. And it generates children A' and B' respectively by having chromosomes Ch3 and Ch4 replacing the cut partial gene patterns with each other and replacing the original individuals A and B with these children A' and B'. This embodiment has set the crossover rate, which is the ratio of the number of individuals to be crossed to the total number of individuals at 0.5.

Figure 14:
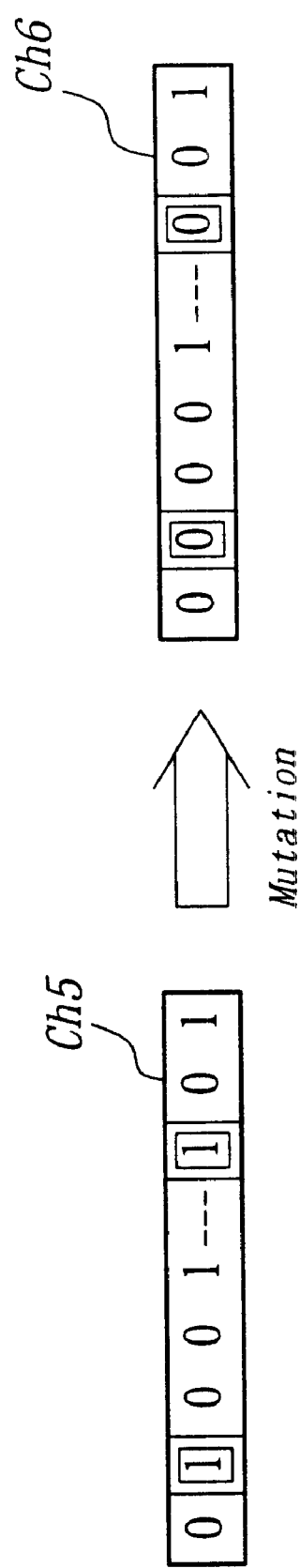
FIG. 14 is an explanatory diagram showing the procedure of a mutation process performed by the genetic algorithm in the method of the embodiment.

Mutation step S26, to be performed after the crossover operation in step S25, is an operation that changes some genes of each chromosome from 0 to 1 or from 1 to 0 in simulation of mutations. FIG. 14 shows an example of mutation. In this figure, mutation has occurred on the genes enclosed with squares, which are the second bit from the left and the third bit from the right, of chromosome Ch5 and these genes have been changed to the respective alleles in chromosome Ch6. This embodiment uses a mutation rate of 0.013.

A result of experiment when applying an adjusting method using a genetic algorithm of this embodiment to the filter circuit 1F (the filter circuit main part 3F in the filter circuit 1F) shown in FIG. 3 is shown in the following. This experiment adjusts the circuit of an LSI chip of silicon.

Figure 15:
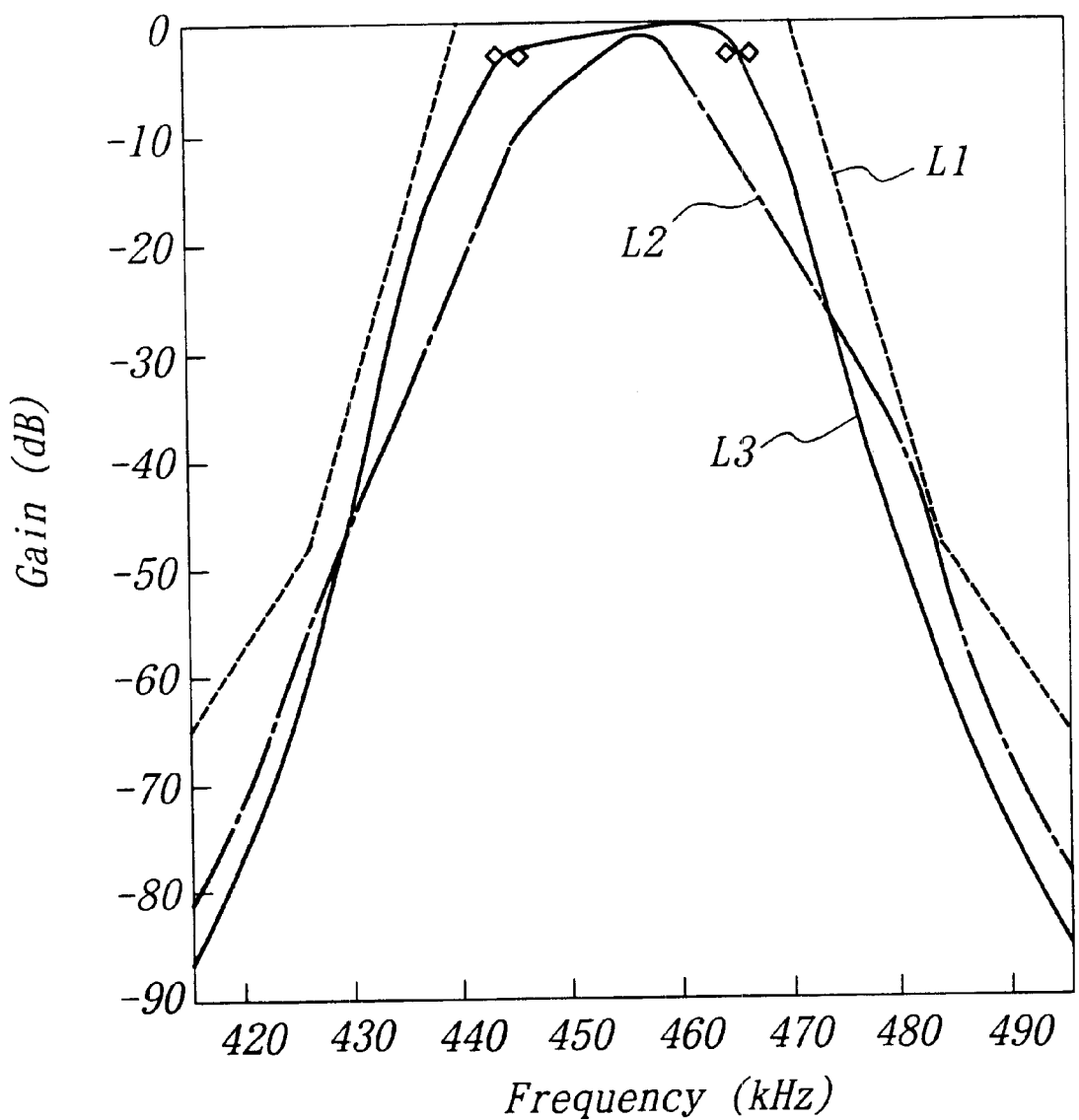
FIG. 15 is a characteristic diagram showing a result of an adjusting experiment of the electronic circuit of the embodiment by means of the method of the embodiment.
Figure 16:
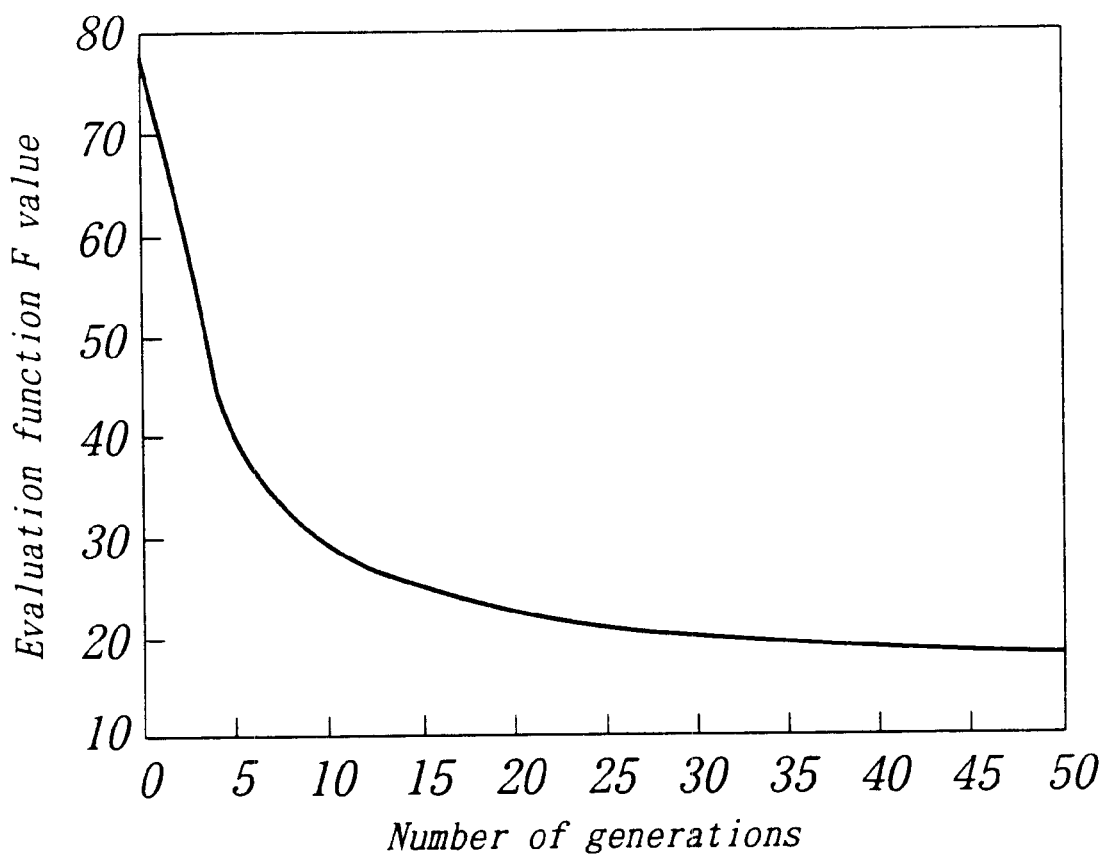
FIG. 16 is a characteristic diagram showing the relation between an evaluation function value and the number of generations in the experiment.

As a result of said experiment, none of 20 chips manufactured satisfies required specifications without adjustment, but as a result of adjusting these chips by means of a method using the genetic algorithm of this embodiment, 18 chips (90% of all the chips) have been able to satisfy the required specifications of Table 1. FIG. 15 shows an example of frequency characteristics of the adjusted filter circuit 1. Here, a chain line L1 shows the required characteristic, an alternate long and short dash line L2 shows the characteristic of a chip not adjusted, and a solid line L3 shows the characteristic of an adjusted chip. It can be seen that the chip has satisfied the required specifications as a result of adjustment. And FIG. 16 shows the relation between the value of an evaluation function F of the best individual in an experimented generation and the number of generations. It can be seen that with the advance of generations in a genetic algorithm the circuit performance becomes closer to an ideal frequency characteristic and the value of evaluation is improved. The effectiveness of the method of this embodiment has been confirmed by this experiment.

As described above, the filter circuit 1F of this embodiment uses a Gm amplifier 2A which is an element capable of changing its output state as each of plural circuit elements of the filter circuit main part 3F and searches the output states of these Gm amplifiers 2A so that the performance of the whole filter circuit main part 3F becomes improved. Accordingly, this embodiment makes it possible to absorb errors in the characteristics of circuit elements caused by process irregularities in a filter circuit manufacturing process, quality irregularities of members, errors in design, and can adjust the filter circuit main part 3F as well as the filter circuit 1F so as to satisfy designated specifications, and this means that a higher efficiency and higher performance can be obtained with less design labor than the prior art.

Next, a variation example of an electronic circuit of the first embodiment of the present invention is described. In the previous embodiment, a register 5 for holding a set value and a D/A conversion circuit 4 for converting the set value into an analog signal and giving it to the filter circuit main part 3F are mounted inside the filter circuit 1F, but a setting circuit 8 and an analyzer 9 are detachably connected to the filter circuit 1F as external apparatuses. In the present invention, however, a circuit equivalent to the setting circuit 8 or the analyzer 9 may be built in the filter circuit 1F as a setting means.

Figure 17:
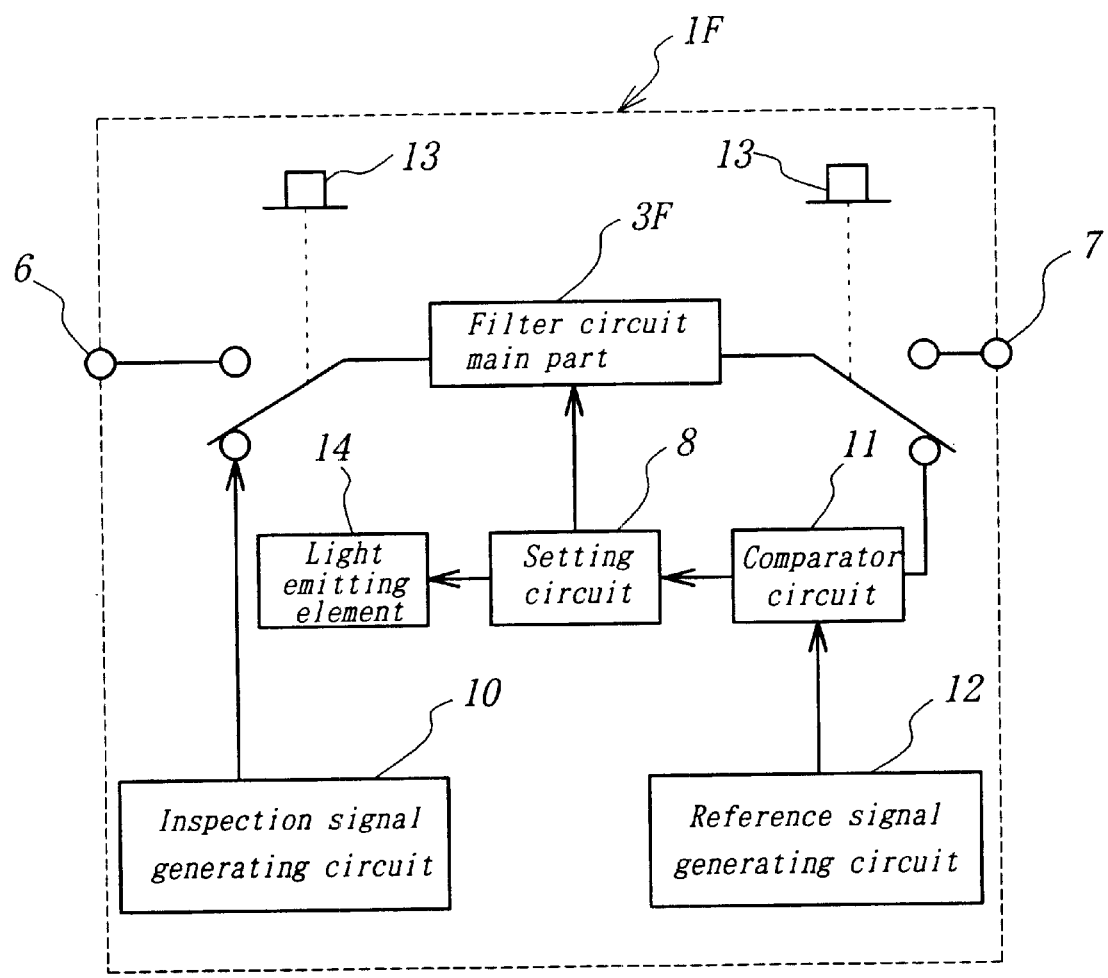
FIG. 17 is a composition diagram showing a variation example of the electronic circuit of the embodiment.

FIG. 17 shows an example composed in such a way. In this case, a circuit equivalent to the setting circuit 8 and the analyzer 9 is built in the filter circuit 1F in addition to the filter circuit main part 3F.

Specifically, a circuit example of FIG. 17 uses a comparison circuit 11 in place of the analyzer 9 in the previous embodiment, compares a reference signal (ideal frequency response value) and output of the filter circuit main part 3F with each other by means of the comparison circuit 11, and in this example a setting circuit 8, a comparison circuit 11, an inspection signal generating circuit 10 and a reference signal generating circuit 12 for generating a reference signal are built in the filter circuit 1F. Switches 13 are provided respectively between the input terminal 6 of the filter circuit 1F and the input of the filter circuit main part 3F, and between the output terminal 7 of the filter circuit 1F and the output of the filter circuit main part 3F. These switches 13 may be provided inside the filter circuit 1F as shown in FIG. 17, but may be also provided outside the filter circuit 1F. Therefore, when the switches 13 are operated, the output of the filter circuit main part 3F is inputted into the comparator circuit 11, and the setting circuit 8, the comparator circuit 11, the inspection signal generating circuit 10 and the reference signal generating circuit 12 start to operate and adjust set values. When the setting has ended, the output of the filter circuit main part 3F is changed over to the output terminal 7 side by operation of the switches 13. This example is provided with a light emitting device (LED) 14 for performing an alarm indication in case that the optimum solution (set value) cannot be obtained.

According to such a variation, it is possible not only to adjust a filter circuit 1F in a manufacturing process but also to adjust the filter circuit 1F by a user at any time after the user has bought a product having the filter circuit 1F built in it. By this an advantage is obtained that even when the filter circuit varies in performance or characteristic, or in case that parts of the filter circuit 1F are deteriorated or in case that the environment where the filter circuit 1F is installed varies in temperature, it is possible to compensate for such variations. Furthermore, it is possible to prevent the function and performance of the electronic circuit from being degraded due to variation of its circuit elements. The switches can be composed so that they are not only manually operated but also automatically operated at the time of turning power on.

And this variation is suitable for being formed into an integrated circuit by using as the setting circuit 8 a genetic algorithm executing circuit described in said article by Kajitani et al.

Next, a composition example of a balance type mixer circuit (image rejection mixer circuit) as a second embodiment of the present invention is described.

A balance type mixer circuit, which is a circuit for performing a frequency conversion which is the main function of a radio communication apparatus, has as input a signal to be frequency-converted (SI) and a local oscillation signal (LO) to be a reference signal for a frequency conversion, and outputs, as an output signal (SO), a frequency signal of the difference or sum in frequency of the input signal (SI) and the local oscillation signal (LO). Generally in the case of receiving, it is desired that a frequency component of the difference in frequency between SI and LO is outputted as SO and a frequency component of the sum in frequency of SI. LO is not outputted at all. And when transmission, it is desired that a frequency component of the sum in frequency of SI and LO is outputted as SO and a frequency component of the difference in frequency between SI. LO is not outputted at all. In such a way a frequency component, being desired not to be outputted as SO at all, out of frequency components of the sum or difference of SI. LO is called an image frequency component (image signal).

And a balance type mixer circuit is used for radio frequencies in a wide frequency range from several 100 kHz to a microwave band and a millimeter wave band. However, it is necessary to modify circuit elements and circuit parameters according to frequencies to be used.

In a balance type mixer circuit actually manufactured, due to errors in characteristic of circuit elements caused by process irregularities in a manufacturing process, irregularities of materials, errors in design, operation of the circuit is not perfect, and an image signal is not completely cancelled and thus appears on the output of the mixer circuit.

Figure 18:
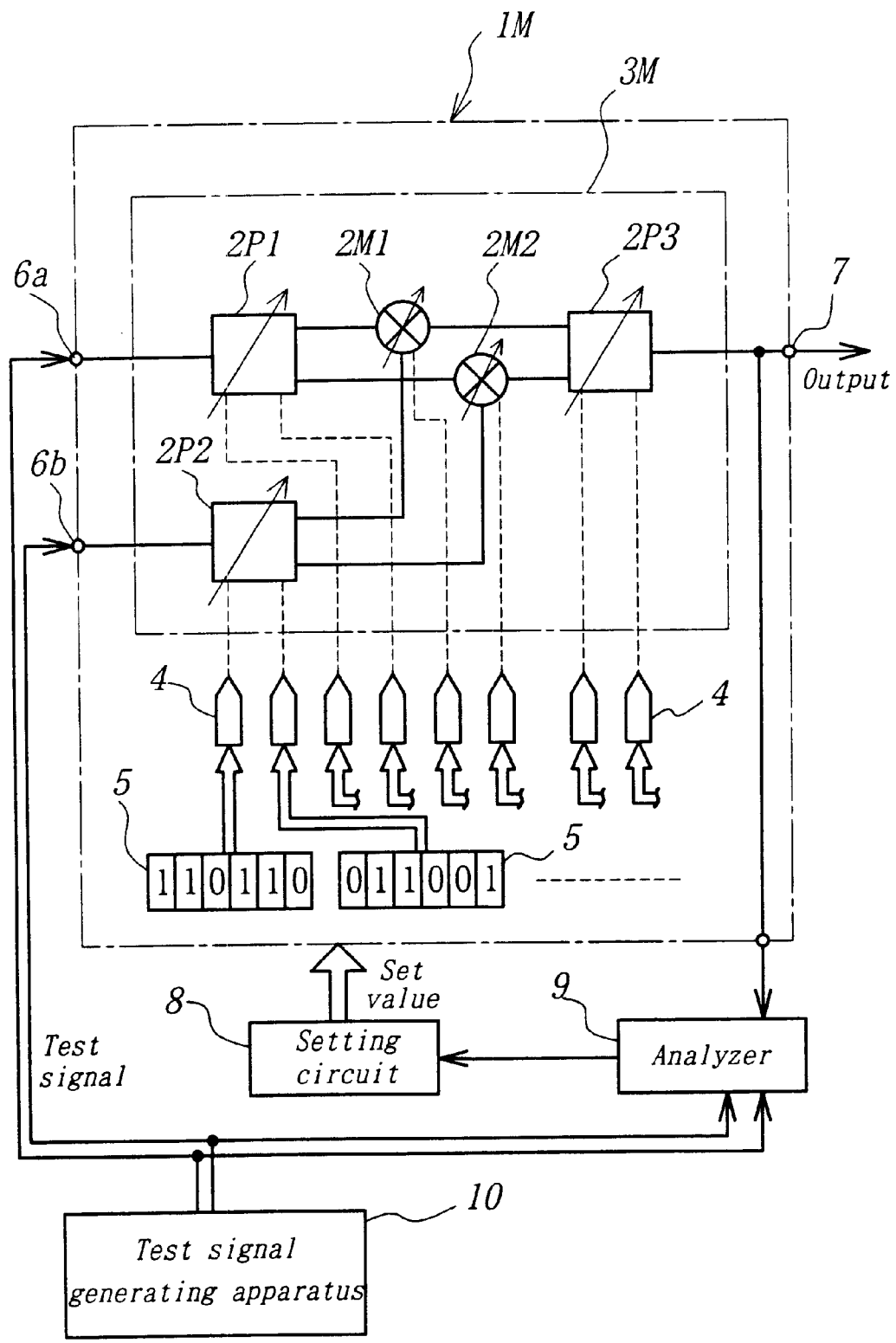
FIG. 18 is an explanatory diagram illustrating a second embodiment of an electronic circuit and its adjusting method.

Therefore, the second embodiment makes adjustments to a plurality of the elements forming a balance type mixer circuit and adjusts the circuit by means of a genetic algorithm so that the image signal output becomes small. FIG. 18 shows the composition of a balance type mixer circuit of the second embodiment, and this balance type mixer circuit (mixer circuit) 1M is composed adopting a mixer circuit main part 3M in place of the filter circuit main part 3F in the first embodiment.

For example, FIG. 18 is a composition example when using a mixer circuit which an electronic circuit of the present invention is applied to, as a receiving apparatus. In this embodiment, a setting circuit 8 and an analyzer 9 are external apparatuses. In the mixer circuit main part 3M, symbols 2P1 and 2P2 each represent a dividing and phase shifting circuit capable of changing transfer characteristics as a circuit element for changing element parameters according to the values of control signals. Symbol 2P3 also represents a phase shifting and composing circuit capable of changing transfer characteristics as a circuit element for changing an element parameter according to the value of a control signal. Symbols 2M1 and 2M2 each represent a mixing circuit capable of changing an operating point (a point where a transistor is biased) and transfer characteristics as a circuit element for changing an element parameter according to the value of a control signal. Therefore, a phase shifting circuit means a circuit to shift the phase of a signal.

In FIG. 18, symbol 4 represents a D/A converter circuit, and this D/A converter circuit 4 provides a voltage having a magnitude corresponding to a digital value held in a register 5 as a holding circuit as a control signal to 2P1, 2P2, 2P3, 2M1 or 2M2 each being an adjusting element. The numbers of D/A converter circuits 4 and registers 5 provided in this case are respectively equivalent to the number of adjusting points.

Figure 19:
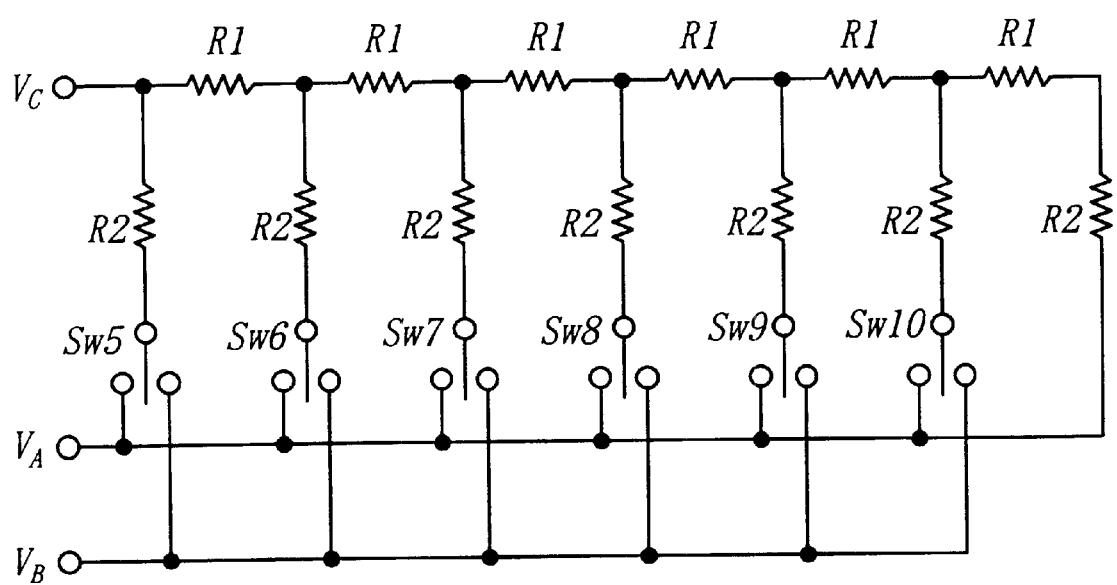
FIG. 19 is a composition diagram illustrating a D/A converter circuit used in the electronic circuit of the second embodiment.

FIG. 19 shows a composition example of said D/A converter circuit 4. Symbol VC is output of a control signal voltage, and symbols VA and VB are respectively fixed voltages and correspond to the upper limit and the lower limit of the control signal voltage VC. The resistance value of a resistor R2 is double that of a resistor R1. Sw5 to Sw10 are electrically switched over according to the value of a bit string (chromosome) of 6 bits of a register 5, and Sw5 corresponds to MSB of this bit string and Sw10 corresponds to LSB of it. Here, Sw5 to Sw10 are switched over according to data of 6 bits of a register 5 to change voltage VC.

In FIG. 18, symbols 6a and 6b respectively are the input terminals for a signal (S1) and a local oscillation signal (LO) to be inputted into the mixer circuit 1M. And symbol 7 is a terminal for outputting an output signal (S0) mixed by the mixer circuit 1M.

And symbol 8 is a setting circuit, which searches the optimum values as values to be held by the plural registers 5 according to a genetic algorithm in the same way as described in detail in the first embodiment.

Figure 20:
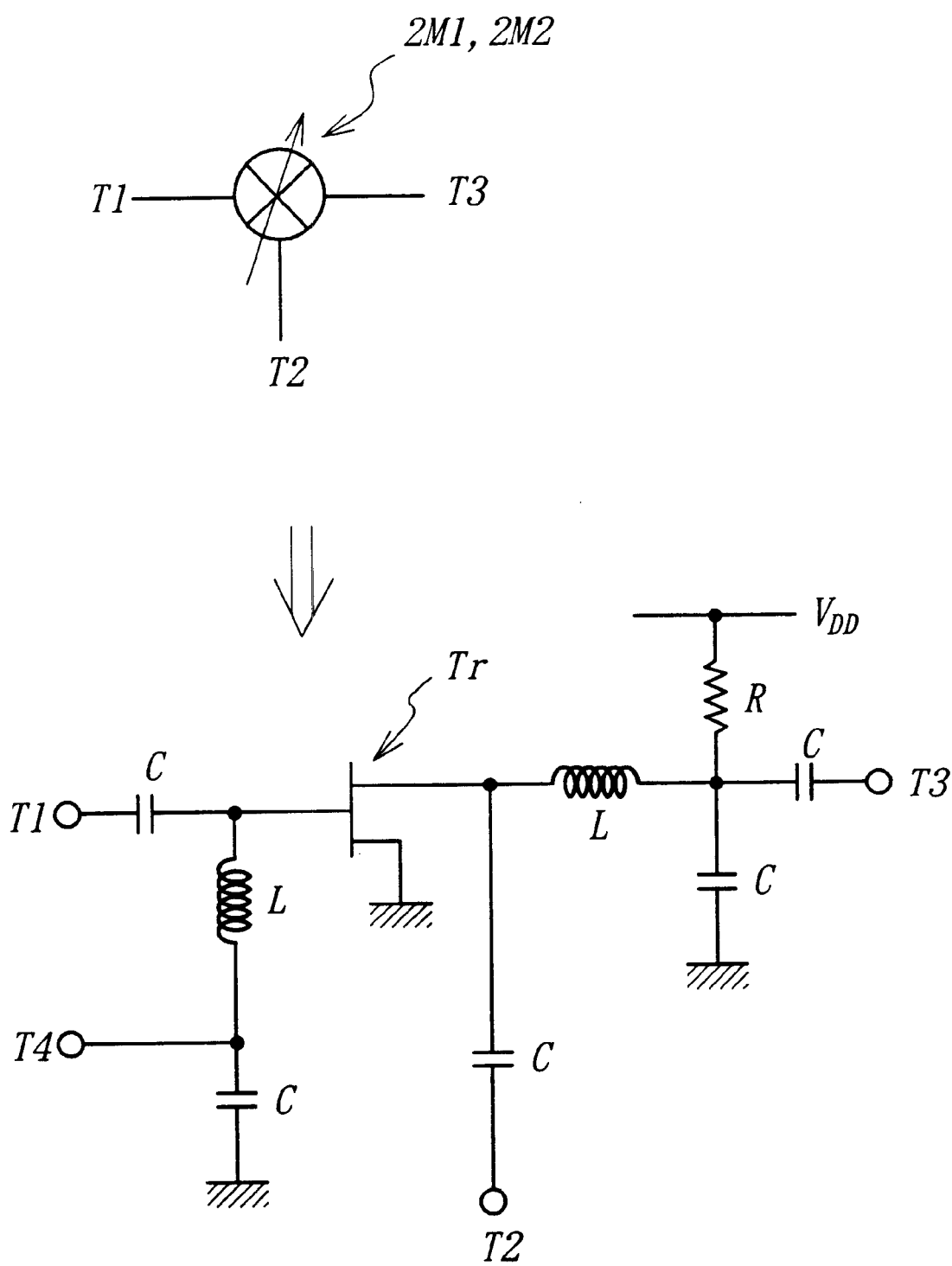
FIG. 20 is a composition diagram illustrating a mixing circuit used in the electronic circuit of the second embodiment.

Said mixing circuits 2M1 and 2M2 are a circuit mainly utilizing the nonlinearity of a semiconductor device, and a composition example of such a mixing circuit is shown in FIG. 20. Symbols T1 and T2 are input terminals of the mixing circuit, T3 is an output terminal and T4 is a terminal for inputting a control signal voltage from the D/A converter 4. Symbol Tr is an FET, which performs operation of the mixing circuit performing a frequency conversion by means of its nonlinearity. Symbol C is a capacitor, L is a coil and R is a resistor. Frequency components of the sum and difference in frequency of signals inputted respectively to T1 and T2 are outputted to T3. Therefore, when the sum component of frequencies of input signals, the phase of the output signal also becomes the sum, and when the difference component of frequencies of input signals, the phase of the output signal also becomes the difference. It is preferable that the mixing circuits 2M1 and 2M2 are formed on the same substrate using the same circuit constants as each other.

When a control signal voltage is changed, such mixing circuits 2M1 and 2M2 vary in operating points, transmission characteristics, signal transfer efficiency and phase characteristics.

Figure 21:
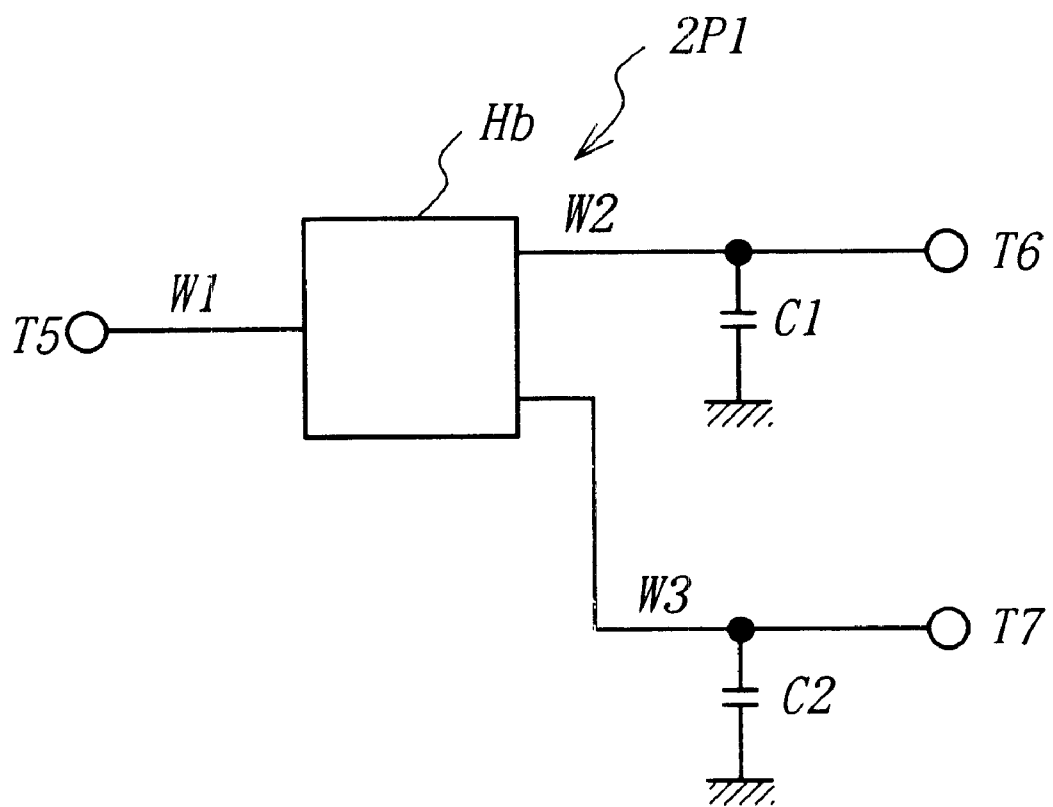
FIG. 21 is a composition diagram illustrating a distributing and phase shifting circuit used in the electronic circuit of the second embodiment.

FIG. 21 shows a composition example of said distributing and phase shifting circuit 2P1. A signal W1 inputted to T5 is divided into signals W2 and W3 by a Wilkinson-type hybrid circuit Hb. When capacitors C1 and C2 are equal in capacitance to each other, the signals W2 and W3 are ideally equal in amplitude and phase to each other. Therefore, if the capacitors C1 and C2 are changed in capacitance, the signals W2 and W3 outputted to T6 and T7 can be respectively changed in amplitude and phase, namely, in transfer characteristics.

Figure 22:
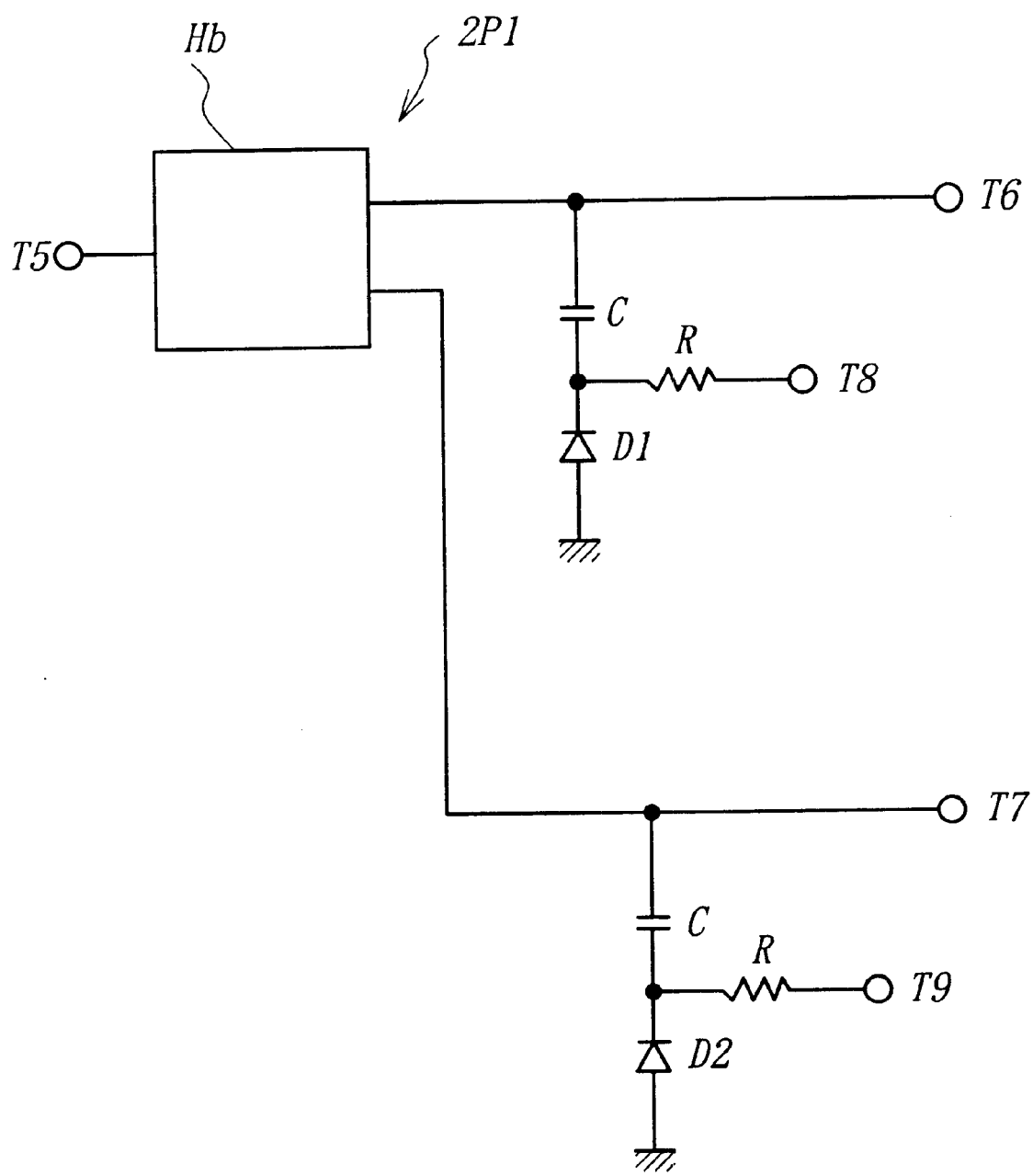
FIG. 22 is a composition diagram illustrating an exemplary composition of the distributing and phase shifting circuit.

FIG. 22 shows a composition example of a circuit capable of changing the distributing and phase shifting circuit 2P1 in transfer characteristics by changing in capacitance the capacitors C1 and C2 of the distributing and phase shifting circuit 2P1 shown in FIG. 21. The capacitor C1 or C2 in FIG. 21 is respectively replaced with a series circuit in which a capacitor C and a variable-capacitance diode D1 or D2 are connected in series with each other. T8 and T9 each have a control signal voltage inputted from a D/A converter circuit 4 and this control signal voltage is applied through a resistor R to the cathode of a variable-capacitance diode D1 or D2 as an reverse bias voltage. The variable-capacitance diodes D1 and D2 each can change its capacitance by a control signal voltage thanks to the property that the junction capacitance is changed by an reverse bias voltage. As the variable-capacitance diode D1 or D2, a diode whose electrostatic capacitance is changed by an reverse bias voltage can be used and a capacitance change by a bias voltage of a bipolar transistor or an FET can also be utilized.

Figure 23:
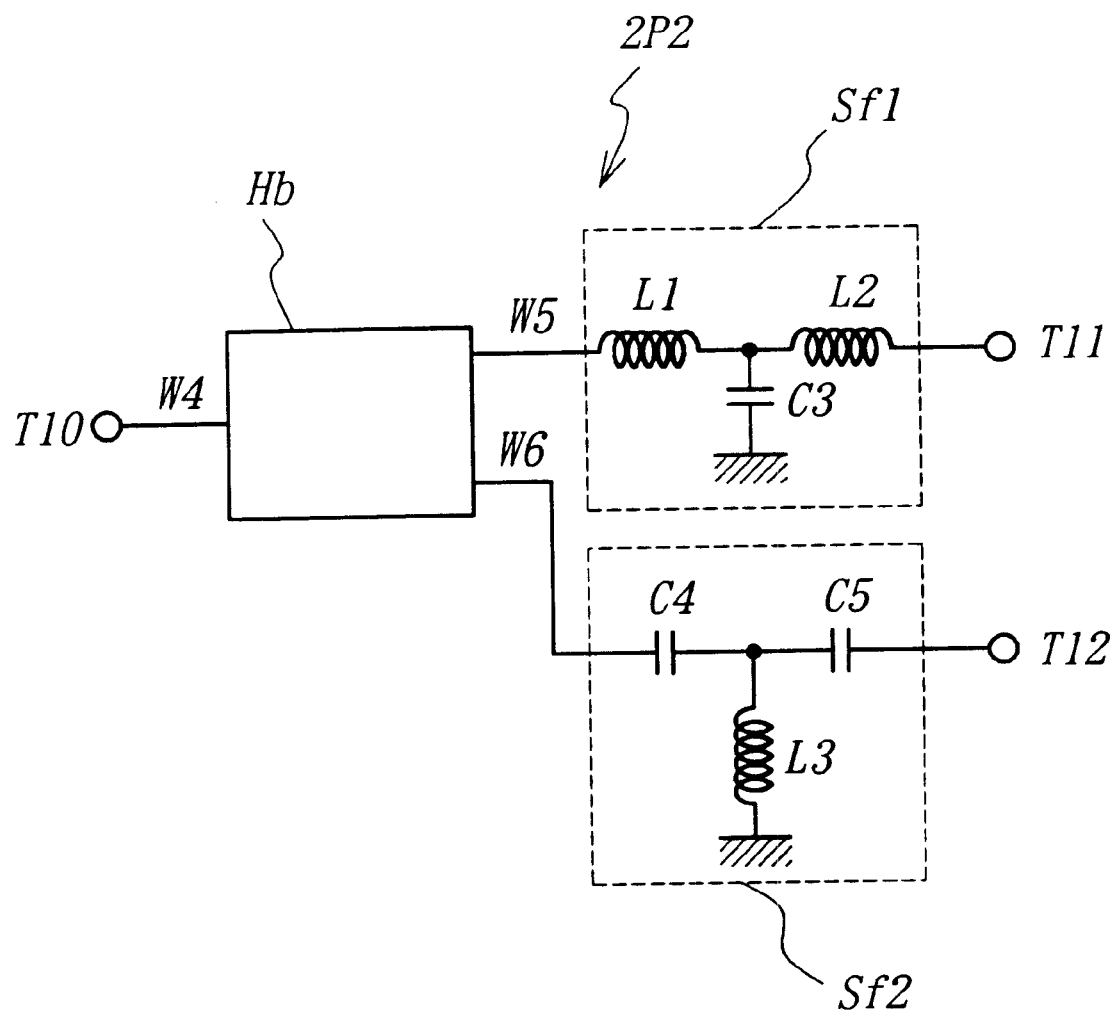
FIG. 23 is a composition diagram illustrating another distributing and phase shifting circuit used in the electronic circuit of the second embodiment.

FIG. 23 shows a composition example of said distributing and phase shifting circuit 2P2. A signal W4 inputted to T10 is divided into signals W5 and W6 by a Wilkinson-type hybrid circuit Hb. The signals W5 and W6 are respectively changed in phase by a phase shifting circuit Sf1 composed of L1, L2 and C3, and a phase shifting circuit Sf2 composed of C4, C5 and L3. Signals to be outputted to T11 and T12 are ideally given the same amplitude as each other and a phase difference of 90 degrees from each other.

Said phase shifting and composing circuit 2P3 is obtained by swapping the input and the output of the distributing and phase shifting and composing circuit 2P2 shown in FIG. 23. Namely, in the phase shifting and composing circuit 2P3, signals inputted to T11 and T12 are respectively changed in phase by a phase shifting circuit Sf1 composed of L1, L2 and C3, and a phase shifting and composing circuit Sf2 composed of C4, C5 and L3 to become signals W5 and W6. These signals W5 and W6 are composed by a Wilkinson-type hybrid circuit Hb and are outputted to T10. Signals to be inputted to T11 and T12 are ideally given a phase difference of 90 degrees from each other and are composed and outputted to T10.

Figure 24:
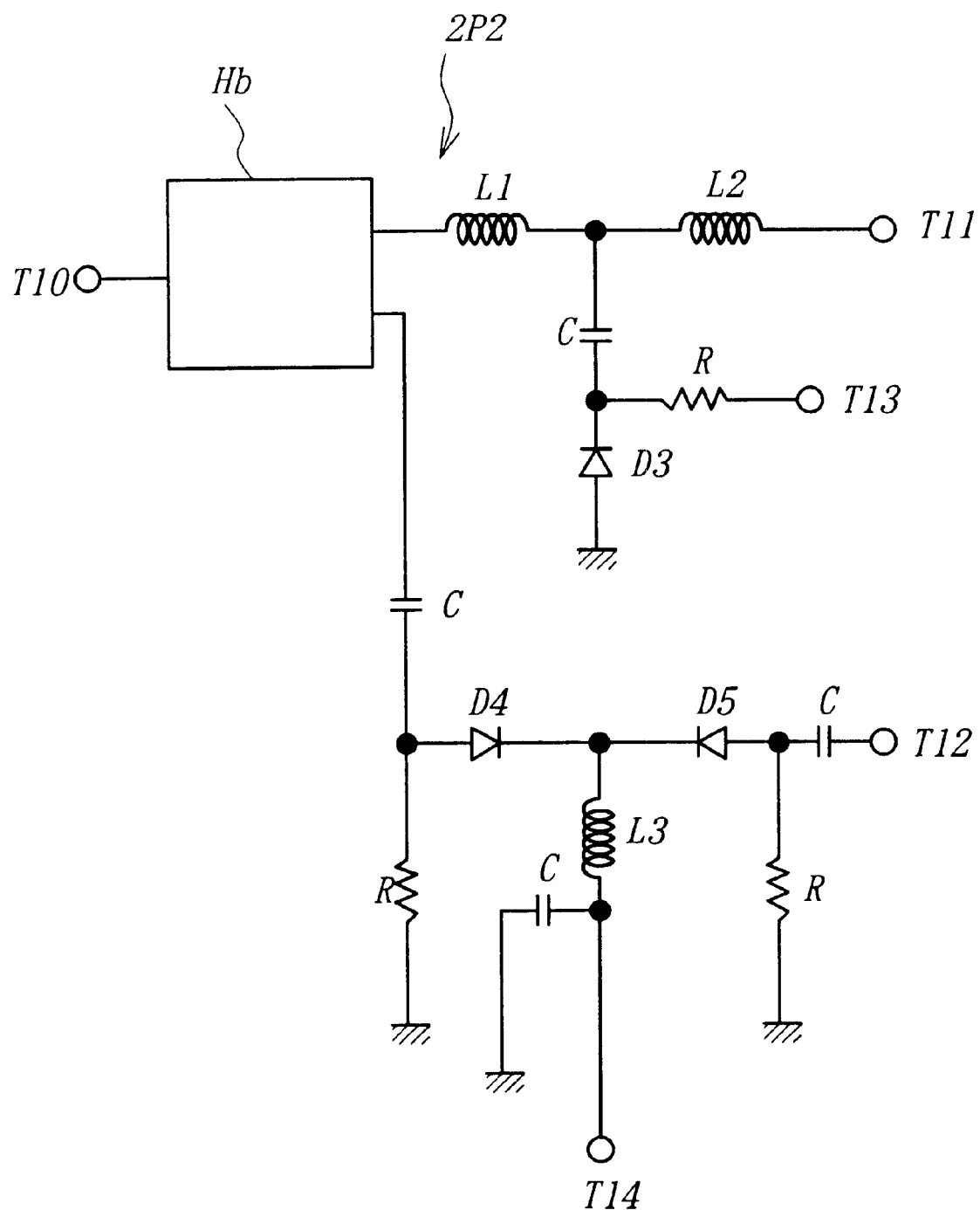
FIG. 24 is a composition diagram illustrating an exemplary composition of the other distributing and phase shifting circuit.

In such a distributing and phase shifting circuit 2P2 and a phase shifting and composing circuit 2P3, the phase of a signal can be changed by changing the capacitance of C3, C4 and C5. FIG. 24 shows a composition example of a circuit capable of changing the transfer characteristics of the distributing and phase shifting circuit 2P2 by changing in capacitance the capacitors C3, C4 and C5 of the distributing and phase shifting circuit 2P2 shown in FIG. 23.

The variable-capacitance diodes D3, D4 and D5 are changed in electrostatic capacitance by control signal voltages inputted through T13 and T14 from the D/A converters 4. Electrostatic capacitance change of D3, D4 and D5 is equivalent to electrostatic capacitance change of C3, C4 and C5. Therefore, the output of the distributing and phase shifting circuit 2P2 and the output of the phase shifting and composing circuit 2P3 can be changed in phase according to control signal voltages. At the same time, however, the output signals are also changed in amplitude.

According to said circuit composition, in the mixer circuit main part 3M in the mixer circuit 1M, ideally, input signals SI having the same phase as each other and local oscillation signals LO being different in phase by 90 degrees from each other are respectively inputted into the two equivalent mixing circuit 2M1 and 2M2. An output signal SO obtained by composing with a phase difference of 90 degrees the output signals of the mixing circuits 2M1 and 2M2 is outputted. At this time, an image signal does not appear on SO at all, since the output signals of the mixing circuit 2M1 and 2M2 are synthesized inversely in phase to cancel each other.

In a mixer circuit actually manufactured, however, due to errors in characteristics of circuit elements caused by process irregularities in a manufacturing process, irregularities of materials, errors in design, a circuit operation of the mixer circuit main part 3M is not perfect, and an image signal is not completely cancelled and thus appears on the output of the mixer circuit.

Therefore, the mixer circuit 1M of this embodiment adjusts in electrostatic capacitance the variable-capacitance diodes D1 and D2 of the distributing and phase shifting circuit 2P1, the variable-capacitance diodes D3 to D5 of the distributing and phase shifting circuit 2P2, the variable-capacitance diodes D3 to D5 of the phase shifting and composing circuit 2P3, and adjusts the operating points of the mixing circuits 2M1 and 2M2 so that a desired signal becomes large and an image signal becomes small.

Next, a second embodiment of an adjusting method of the present invention for adjusting said mixer circuit 1M is described. An adjusting method of this embodiment also is basically similar to said adjusting method of the first embodiment.

After the mixer circuit 1M of the embodiment has been manufactured, in an inspection process, as shown in FIG. 18 the setting circuit 8, the analyzer 9 and the test signal generating apparatus 10 are connected to the mixer circuit 1M, and the test signal generating apparatus 10 inputs test signals to the input terminals 6a and 6b of the mixer circuit 1M. According to the same procedure as that of the adjusting method of the first embodiment, the setting circuit 8 sets the transfer characteristics of the dividing and phase shifting circuits 2P1 and 2P2, the phase shifting and composing circuit 2P3, and the mixing circuits 2M1 and 2M2. An evaluation function of a genetic algorithm evaluates an adjustment as a good adjustment when a desired signal is large and an image signal is small.

A chromosome, a set of register values and a set of control signal voltages correspond to one another in the one-to-one correspondence in the same way as the method of the first embodiment. Namely, in the same way as shown in FIG. 11, a chromosome is composed of the register values of eight registers 5 corresponding to eight adjusting points of the mixer circuit 3M of said embodiment. A register 5 corresponding to each adjusted point is of 6 bits in this case. Therefore, the register length (=chromosome length) is 48 bits. Accordingly, the size of an adjusting search space of the mixer circuit main part 3M of said embodiment is $2^{48} \approx 10^{14}$ (10 to the 14th power), and it is a matter of course that adjustment by the exhaustive search is impossible.

In the D/A converter circuit 4 shown in FIG. 19, this embodiment sets the values of VA and VB respectively at 2V (volts) and 4V (volts). These values are determined according to the circuit characteristics at an adjusting point. For example, the control signal voltage corresponding to a register value "111001" is "$2+(4-2)\times(\frac{1}{2}+\frac{1}{4}+\frac{1}{8}+\frac{1}{64})$= 3.781V (volts)".

As an evaluation function F of a genetic algorithm for an individual, a function is used which represents how close the resulting frequency response value obtained by the analyzer 9 is to an ideal frequency response value. The analyzer 9 analyzes the output of the filter circuit main part 3F, whose Gm values are determined by the register values represented by a chromosome of an individual. For example, a value computed by the following evaluation function F is used as fitness of the genetic algorithm.

(Numerical expression 3)

$F = \Sigma w_i |S(f_i) - O(f_i)|$ fitness = $1/(1+F)$

The above-mentioned evaluation function F is the weighted sum of the absolute values of the differences between outputs $S(f_i)$ of an ideal mixer circuit 1M and outputs $O(f_i)$ of the mixer circuit main part 3M measured by the analyzer 9.

And the smaller the value of F is, the larger the value of said fitness is, and in the case that the mixer circuit 3M shows an ideal response, the value of fitness is the maximum value of 1.0. This embodiment finds the value of F with specified signals SI and SO generated by the inspection signal generating circuit 10.

The weighting factor for output at the frequency of a target output SO is set at 1.0 and the weighting factor for output at an image frequency is set at 3.0. And as an ideal characteristic, it is determined that the output at the frequency of a target output SO is the value of designated specifications (for example "0 dB") and the output at an image frequency is "−60 dB". For example, assuming that the output at the frequency of a target output SO and the output at an image frequency are respectively "−3.4 dB" and "−46 dB", the value of the evaluation function F in this case is "F=1.0×?0−(−3.4)?+3.0×?−60−(−46)?=45.4", and the value of fitness is "0.0216".

In a process corresponding to step S4 of FIG. 7, when it is judged the performance of the mixer circuit main part 3M satisfies designated specifications (for example, output of an image frequency is not more than −40 dB), the adjustment process is ended. On the other hand, when a chromosome (register values) satisfying the specifications cannot be obtained even if repeating the adjustment process for a given number of generations, the mixer circuit main part 3M as well as the mixer circuit 1M are considered to be defective and are processed as defectives.

Since this embodiment adopts a circuit element that has variable transfer characteristics, namely, an FET (field effect transistor) Tr having a variable operating point and variable-capacitance diodes D1 to D5 as adjusting elements 2 in a circuit element of the mixer circuit main part 3M in the mixer circuit 1M, and searches the transfer characteristics of the adjusting elements 2 so that the function of the entire circuit becomes improved. It is thus possible to absorb errors in characteristics of the circuit elements caused by process irregularities in a mixer circuit manufacturing process, irregularities of materials, errors in design, and to thereby adjust the mixer circuit 1M so as to satisfy the designated specifications.

This embodiment is preferable in case that the mixer circuit 1M is composed of a high-frequency integrated circuit.

The following variation examples can be carried out for this embodiment.

(1) At the time of performing adjustment, not only two kinds of a target signal SO and an image signal but also other many kinds of a leaking LO signal, an SI signal, a harmonic distortion component in addition to those two kinds may be taken as measurement items of an output signal of the mixer circuit 1M to be measured and analyzed by the analyzer, and the accuracy of adjustment can be improved by doing in such a way.

(2) The above-mentioned embodiment makes C3, C4 and C5 variable in adjustment of the distributing and phase shifting circuit 2P2, but it may make L1, L2 and L3 variable as described later.

(3) In the case that a coupling circuit being variable in transfer characteristic is provided at a site where adjustment of matching is effective inside the mixer circuit 1M and this coupling circuit is adjusted at the same time by said method of the second embodiment, a higher performance can be obtained.

Figure 25:
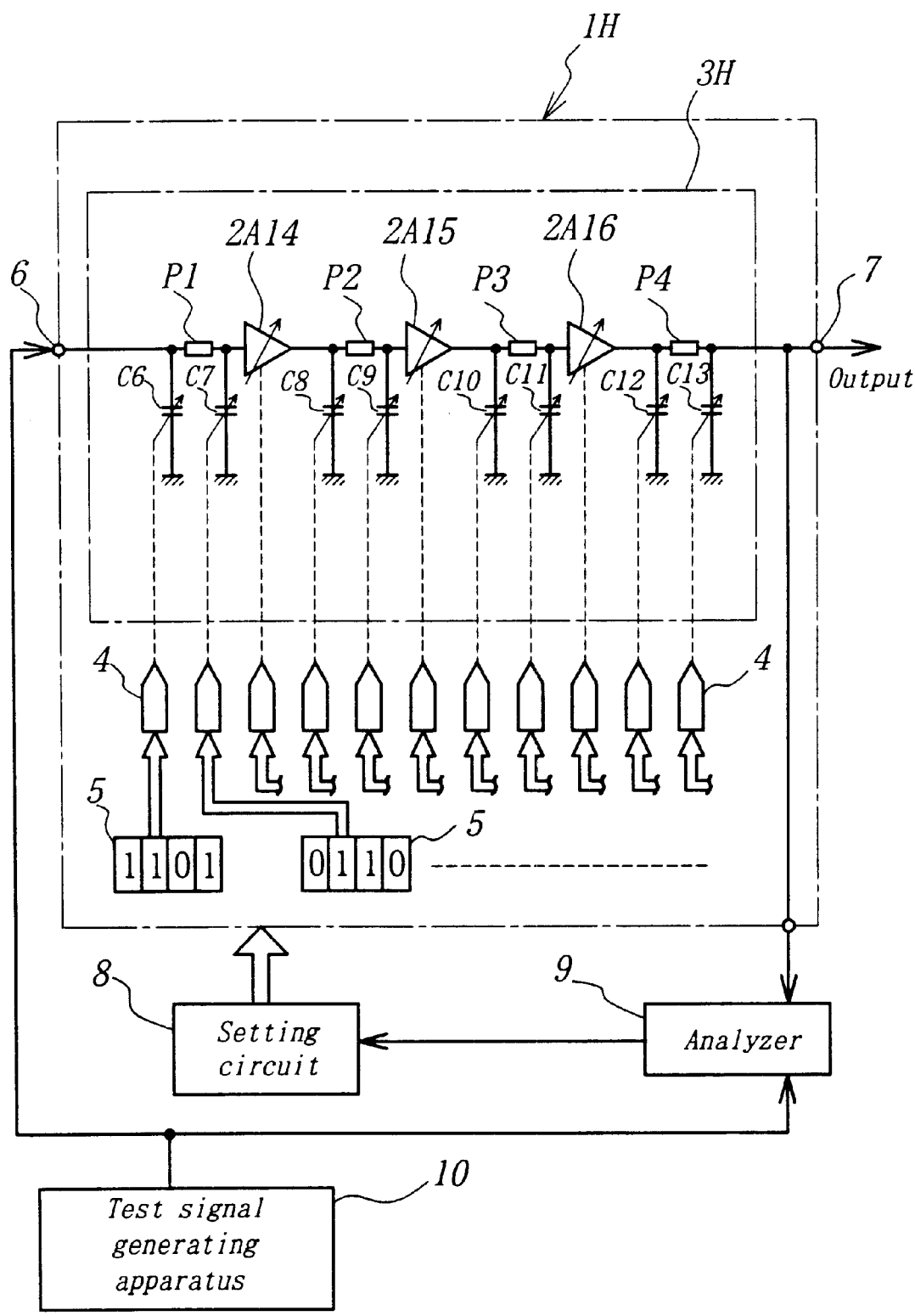
FIG. 25 is an explanatory diagram illustrating a third embodiment of an electronic circuit and its adjusting method of the present invention.

Next, a composition example of a high-frequency amplifier circuit as a third embodiment of an electronic circuit of the present invention is shown. FIG. 25 shows the composition of a high-frequency amplifier circuit of the third embodiment, and in FIG. 25 symbol 1H is a high-frequency amplifier circuit, and this high-frequency amplifier circuit 1H is composed using a high-frequency amplifier circuit main part 3H in place of the filter circuit main part 3F in the first embodiment. The same circuits as shown in FIG. 3 are given the same symbols as those of FIG. 3. In this embodiment, the setting circuit 8 and the analyzer 9 are external apparatuses. In the high-frequency amplifier circuit main part 3H in the high-frequency amplifier circuit 1H, symbols 2A14 to 2A16 each are an amplifier capable of changing its transfer characteristic by changing a bias (operating point) and symbols C6 to C13 each are variable-capacitance elements capable of changing its electrostatic capacitance, and their parameters are adjusted by control signals shown by dotted lines in the figure. This embodiment has eleven adjusting points. Thus, this embodiment uses 11 pairs of a D/A converter 4 and a register 5 for generating control signals. And symbols P1 to P4 each are a transmission line, and symbols 6 and 7 are respectively an input terminal and an output terminal.

Amplifiers, 2A14 to 2A16, each are composed of semiconductor elements, and are changed in such transfer characteristics as an amplification factor, maximum output level, distortion factor, efficiency, noise figure, input/output impedance, S parameter (scattering factor) by changing a bias (operating point). Since an example composing method of such an amplifier is publicly known, its detailed description is omitted and operation of circuits related to this embodiment is described in the following.

Therefore, the input impedance of the amplifier 2A14 and the standard impedance of the input terminal 6 can be matched with each other by adjusting the variable-capacitance elements C6 and C7. And the output impedance of the amplifier 2A14 and the output impedance of the amplifier, 2A15 can be matched with each other by adjusting the variable-capacitance elements C8 and C9. The other variable-capacitance elements and amplifiers can be done in the same way. When the operating point of an amplifier is changed, however, the optimum value of adjustment with respect to said matching is also changed. In order to adjust the high-frequency amplifier circuit main part 3H to come into such an improved state that its characteristics satisfy designated specifications. Therefore, it is necessary to comprehensively adjust the adjusting points of the variable-capacitance elements C6 to C13 and the amplifiers 2A14 to 2A16 as a whole.

A third embodiment of an adjusting method of the present invention for adjusting said high-frequency amplifier 1H is described. An adjusting method of this embodiment is also basically similar to the adjusting method of the first embodiment.

After the high-frequency amplifier circuit 1H has been manufactured, in an inspection process, as shown in FIG. 25 a setting circuit 8, an analyzer 9 and a test signal generating apparatus 10 are connected to the high-frequency amplifier circuit 1H, and the test signal generating apparatus 10 inputs a test signal to the input terminal 6 of the high-frequency amplifier circuit 1H. The analyzer 9 gives, for example, a noise figure, a distortion factor, an amplification factor, the maximum signal level and efficiency to the setting circuit 8 as values for an evaluation function, and the setting circuit 8 performs an evaluation using an evaluation function which has weighted, for example, its noise figure, distortion factor, amplification factor, maximum signal level and efficiency in order of importance of these characteristics. The setting circuit 8 sets the adjustment values of the variable-capacitance elements C6 to C13 and the amplifiers 2A14 to 2A16 of the high-frequency amplifier circuit main part 3H according to the same procedure as shown in FIG. 7.

Since this embodiment uses circuit elements (adjusting elements) C6 to C13 and 2A14 to 2A16 which are variable in transfer characteristics and capacitance as a plurality of circuit elements of a high-frequency amplifier circuit main part 3H in a high-frequency amplifier circuit 1H and searches such transfer characteristics of these adjusting elements that the entire circuit becomes improved in function, this embodiment can perform such an adjustment that it absorbs errors in characteristics of the circuit elements caused by process irregularities in a high-frequency amplifier circuit manufacturing process, irregularities of materials, errors in design, and makes the high-frequency amplifier circuit 1H have a function to satisfy designated specifications. And this embodiment is improved in the case that the high-frequency amplifier circuit 1H is composed of a high-frequency integrated circuit.

Although this embodiment uses three stages of amplifiers, it is a matter of course that the present invention does not care about the number of stages of amplifiers. A transmission line is effective when its electrical length is between ⅛ wavelength and ¼ wavelength of a signal to be amplified. And when additionally a variable-capacitance element is provided at a middle point of the transmission line and the electrical length of the transmission line connecting adjacent variable-capacitance elements to each other is made ⅛ wavelength, since the range of adjustment is made broad, it is possible to make wide an adjustable range of the impedance of the amplifier.

This embodiment is also effective to adjust for obtaining broad band characteristics of a high-frequency amplifier circuit 1H. In this case, it is possible to improve the accuracy of adjustment by using a large number of input signal frequencies.

As shown in the first to third embodiments described above, the present invention can be applied to various electronic circuits. That is to say, it is possible to provide a plurality of adjusting points in an electronic circuit to be adjusted and adjust the said adjusting points by means of a method according to the present invention. In the next, fourth, embodiment, a case that the present invention is applied to a general electronic circuit is described.

Figure 26:
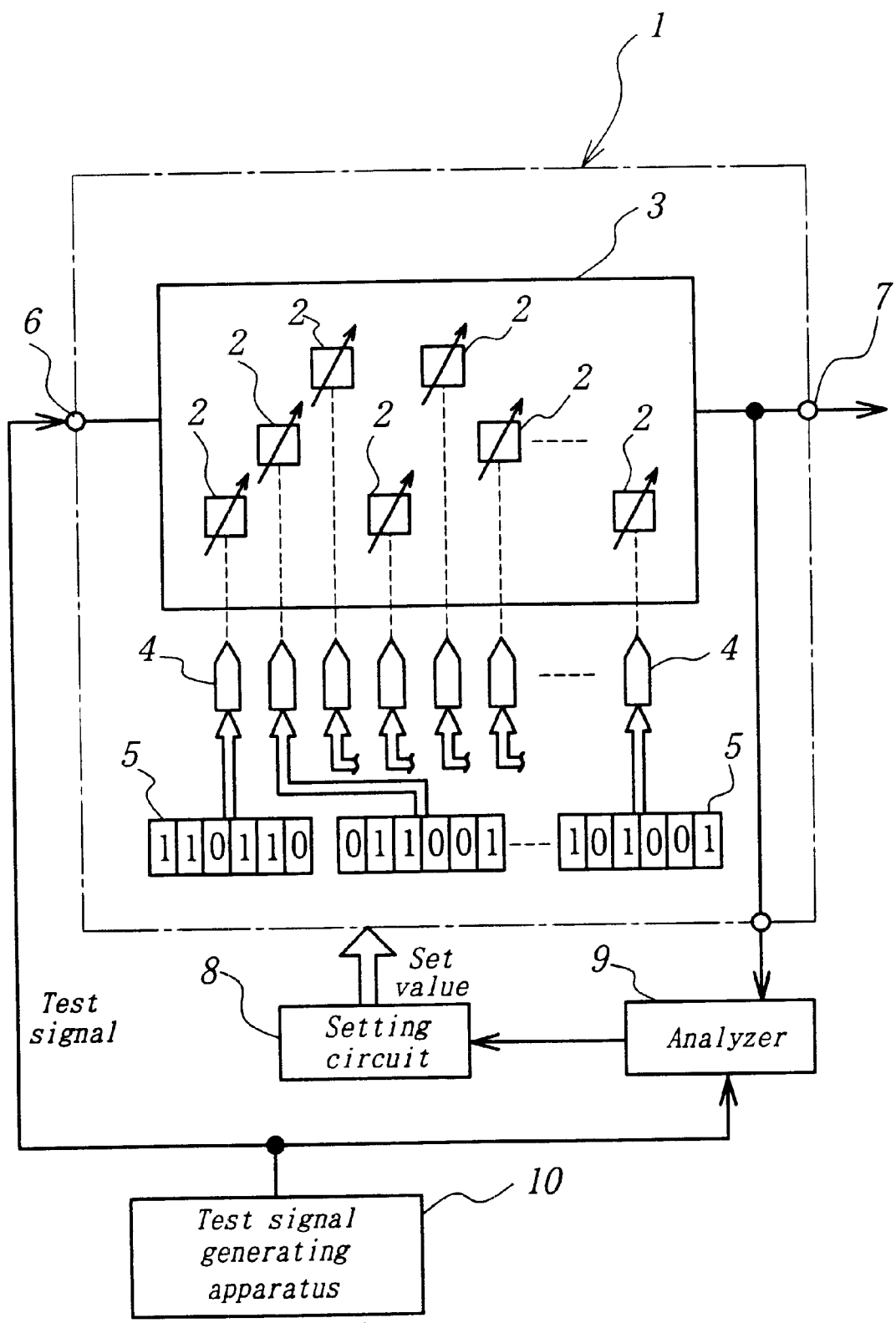
FIG. 26 is an explanatory diagram illustrating a fourth embodiment of an electronic circuit and its adjusting method of the present invention.

FIG. 26 is a composition example of an electronic circuit which the present invention is applied to. In FIG. 26, symbol 1 is an electronic circuit for performing a specified basic function and symbol 3 is a basic circuit performing said specified basic function in said electronic circuit. In this embodiment, a setting circuit 8 and an analyzer 9 are external apparatuses. In the basic circuit 3 to be adjusted, symbol 2 is an adjusting element being variable in transfer characteristics and the said basic circuit 3 has a plurality of adjusting elements 2.

This embodiment also adjusts transfer characteristics of the adjusting elements 2 in the same way as the first to third embodiments described above.

That is to say, in FIG. 26, symbol 4 is a D/A converter circuit, and this D/A converter circuit 4 provides a voltage or current as a control signal to an adjusting element 2 having a magnitude corresponding to a digital value held by a register 5 as a holding circuit. The numbers of the D/A converters 4 and registers 5 provided in this case respectively coincide with the total number of adjusting points to be adjusted by the adjusting elements 2. The register 5 outputs a digital value which it holds to the D/A converter 4, and its holding value can be changed by an external apparatus, which is the setting circuit 8 in this embodiment. It is preferable that a nonvolatile memory capable of holding its digital value even after power is turned off, for example, an EEPROM, FeRAM, Fused ROM or the like is used in the register 5.

In FIG. 26, symbols 6 and 7 are respectively terminals for a signal inputted into the electronic circuit 1 (input signal) and a signal outputted from the electronic circuit 1 (output signal).

In FIG. 26, symbol 10 is a test signal (inspection signal) generating apparatus, which generates a test signal for adjusting the basic circuit 3 in the electronic circuit 1. This test signal is inputted into the electronic circuit 1 and the analyzer 9. The analyzer 9 is inputted with an output signal of the electronic circuit 1 and a test signal from the test signal generating apparatus 10, analyzes these input signals and computes the difference value between an ideal output signal corresponding to the test signal and an actual output signal.

This difference value is delivered to the setting circuit 8. The analyzer 9 and the test signal generating circuit 10 can be also formed into one body.

The basic circuit 3 has main components which may be in the form of 2-terminal circuit elements (resistor, capacitor, diode, (semiconductor pn junction diode, Schottky barrier diode, variable-capacitance diode, constant-voltage diode, light emitting diode, Esaki diode, PIN diode, photodiode and the like), coil, thermistor, varistor, piezoelectric element, speaker, electric lamp, motor/generator, crystal oscillator, Josephson device, light emitting element, light receiving element), 3-terminal circuit elements (bipolar transistor (npn transistor, pnp transistor, IGBT, thyristor, triac element), uni polar transistor (field effect transistor (FET), vacuum tube), 4 or more-terminal circuit elements (transformer, transistor having plural electrodes, operational amplifier, logic gate circuit element, vacuum tube, magnetic amplifier, semiconductor integrated circuit), and circuit elements composed by combining the above-mentioned circuit elements.

This embodiment has one input terminal 6 and one output terminal 7, but the present invention permits the numbers of input terminals 6 and output terminals 7 of the electronic circuit 1 respectively to be an optional number including the plural, and can also accept such a case having no input terminal 6 as an oscillator or a constant voltage power source circuit. And it can accept a circuit handling signals bidirectionally. In this case, since the input terminal 6 and the output terminal 7 change places with each other according to the direction of a signal, adjustment according to the present invention is performed by changing over the test signal generator 10 and the analyzer 9 in connection.

In case that the electronic circuit 1 is a circuit which has a plurality of adjusting elements 2 as illustrated in FIG. 2(b) and in which adjusting an adjusting element 2 influences the result of adjustment of another adjusting element 2, and a large number of combinations of an adjusting and search space occurs, the present invention is particularly effective.

The electronic circuit 1 of this embodiment is characterized by being provided with adjusting elements 2 to be adjusted by an electric signal, D/A converters 4 and registers 5.

Operation of the electronic circuit 1 of this embodiment is described in the following.

The adjusting element 2 is a variable-gain amplifier, a variable-conductance element, a variable-capacitance diode or the like, and is an electronic element capable of changing its transfer characteristics and changes its parameters according to the value of an output voltage or output current of the D/A converter 4. And this embodiment is characterized in that the number of such adjusting elements 2 is plural. The plurality of adjusting elements 2 do not care whether or not they are electronic elements of the same kind. And the number of terminals, through which the adjusting element 2 is connected to the basic circuit 3, may be any number.

Figure 27:
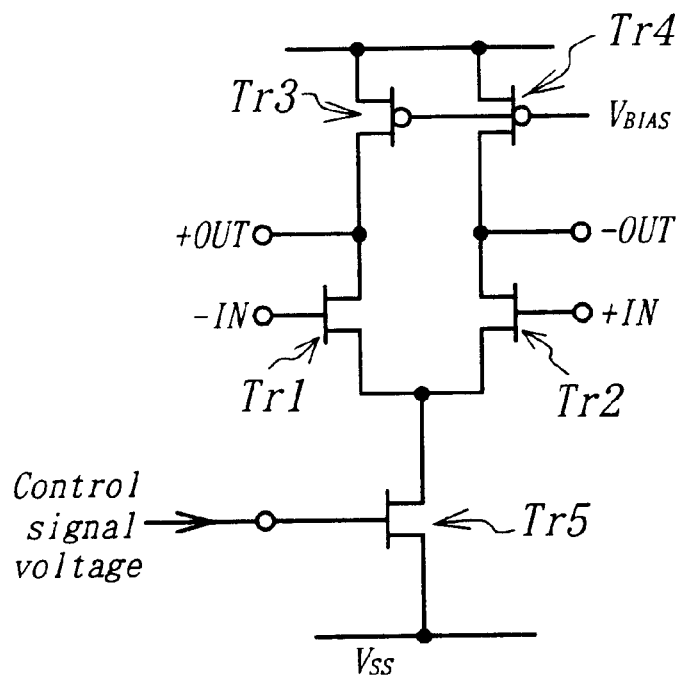
FIG. 27 is a composition diagram showing an example of a Gm amplifier used in the electronic circuit of the third or fourth embodiment.

The adjusting element 2 may be a circuit comprising an active element to change its operating point according to the value of an output voltage or output current of the D/A converter 4, and in case that the adjusting element 2 is a Gm amplifier (variable-gain amplifier), it can use a composition shown in FIG. 27 in addition to said composition of FIG. 5. Therefore, symbols Tr1 to Tr5 each are an MOS FET in the same way as the case of FIG. 5.

Figure 28:
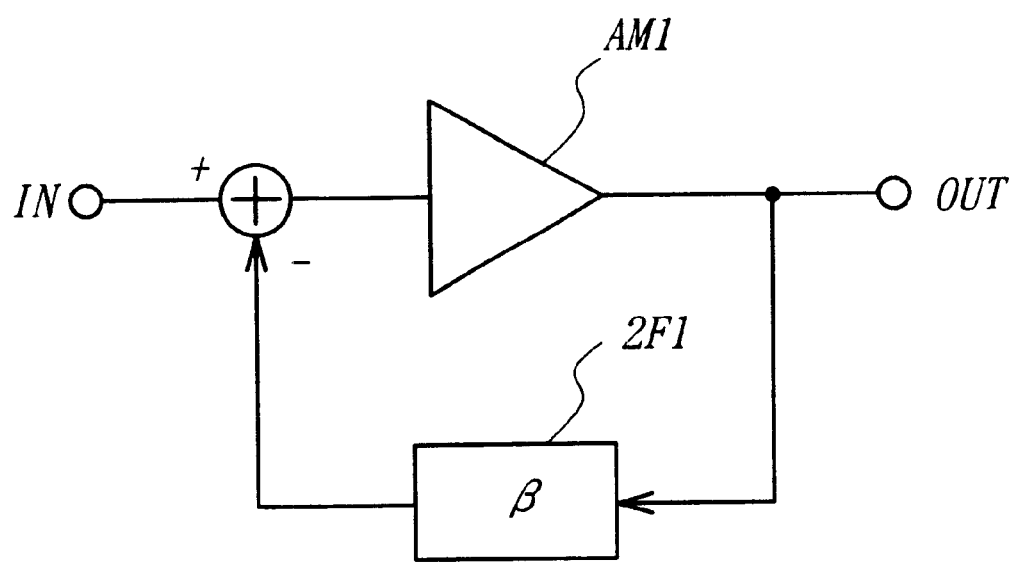
FIG. 28 is a composition diagram showing another example of a Gm amplifier used in the electronic circuit of the third or fourth embodiment.

Another composition example of a Gm amplifier is shown in FIG. 28. In FIG. 28, symbol AM1 is an amplifier circuit, and 2F1 is a feedback circuit, whose transfer characteristics can be changed by means of a variable-resistance element and/or a variable-capacitance element. A feedback signal is added at the input side of the amplifier circuit AM1. It is possible to change transfer characteristics (gain and delay characteristics) between the input and output (IN and OUT) by changing the resistance value of a variable-resistance element or the capacitance value of a variable-capacitance element which are components of the feedback circuit 2F1. In addition to these, the adjusting element 2 can be also composed of a circuit described in pp.169 to 175 of "Monolithic Microwave Integrated Circuit" edited by The Institute of Electronics, Information and Communication Engineers of Japan.

Figure 29A:
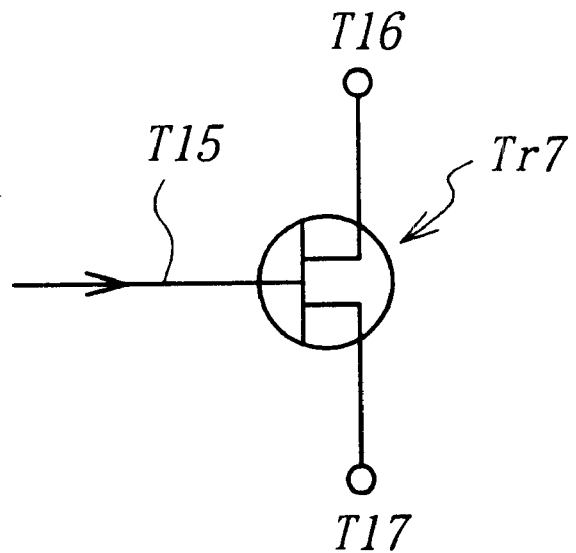
FIGS. 29a and 29b are composition diagrams showing two examples of an adjusting element used in the electronic circuit of the third or fourth embodiment.

In case that the adjusting element 2 is a gain conductance element (field effect transistor), its variable transfer characteristic is resistance. FIG. 29(a) shows a composition example of an adjusting element using an field effect transistor Tr7. The resistance value between T16 and T17 is changed according to the voltage of a control signal inputted to the base electrode T15.

Figure 29B:
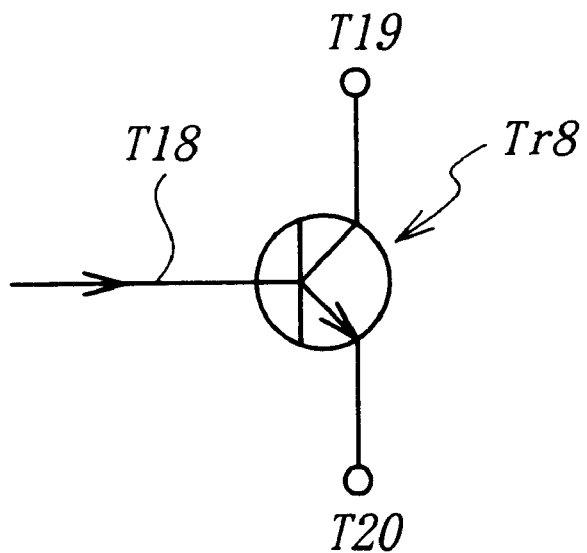

FIG. 29(b) shows a composition example of an adjusting element using a bipolar transistor Tr8. The resistance value between T19 and T20 is changed according to the current of a control signal inputted to the gate electrode T18.

Figure 30A:
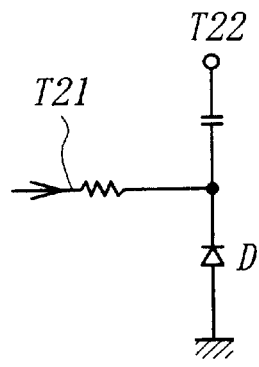
FIGS. 30a to 30f are composition diagrams showing other examples of an adjusting element used in the electronic circuit of the third or fourth embodiment.
Figure 30B:
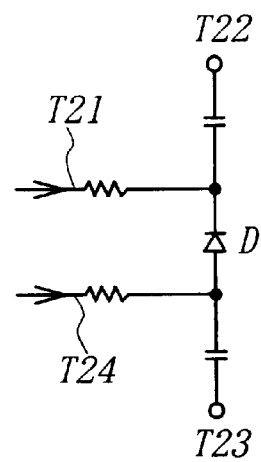
Figure 30C:
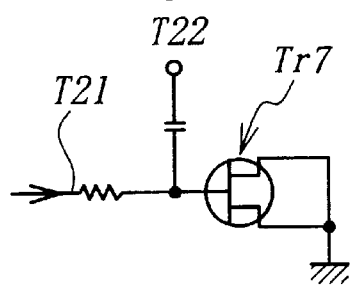
Figure 30D:
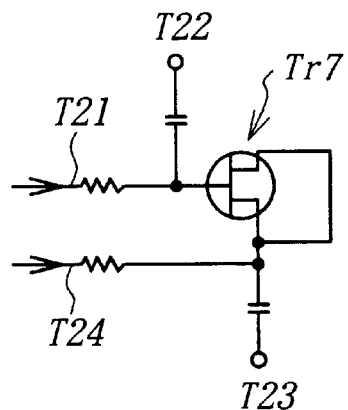
Figure 30E:
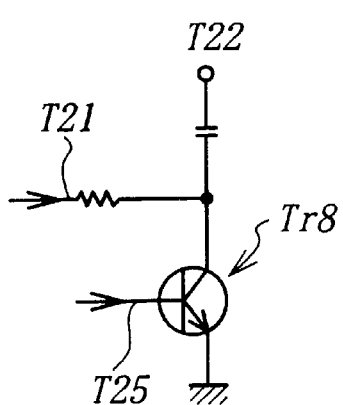
Figure 30F:
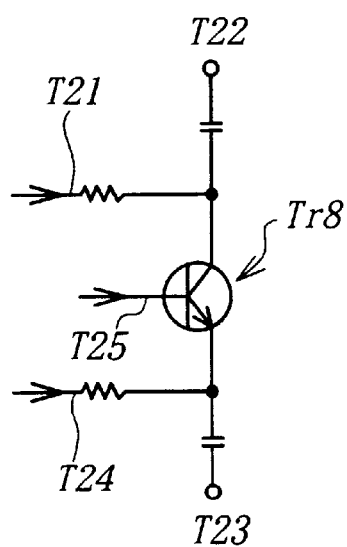

In case that the adjusting element 2 is a variable-capacitance diode or the like (a variable-capacitance circuit which can utilize also a capacitance change by a bias voltage of a transistor, in addition to a variable-capacitance diode), its variable transfer characteristic is electrostatic capacitance. FIGS. 30(a) to (f) show composition examples of an adjusting element to change its electrostatic capacitance value. Symbol D is a variable-capacitance diode, Tr7 is a field effect transistor and Tr8 is a bipolar transistor. FIGS. 30(a), (c) and (e) show cases in each of which one side of the electrostatic capacitance circuit is grounded. The electrostatic capacitance of T22 is changed according to a control signal voltage inputted to T21. FIGS. 30(b), (d) and (f) show cases in which these adjusting elements are not grounded, and the electrostatic capacitance between T22 and T23 is changed according to a control signal voltage inputted to T21 or T24. To T25, ordinarily a bias is applied but a control signal current can also be inputted.

In case that an adjusting element 2 changes its inductance, it can be composed by combining an impedance converter circuit composed of a transistor, and said variable-capacitance circuit. In this case, the sign of a reactance is inverted by the impedance converter circuit. Also, the inductance can be changed by taking a control signal current as a bias current using a saturable reactor.

Figure 31:
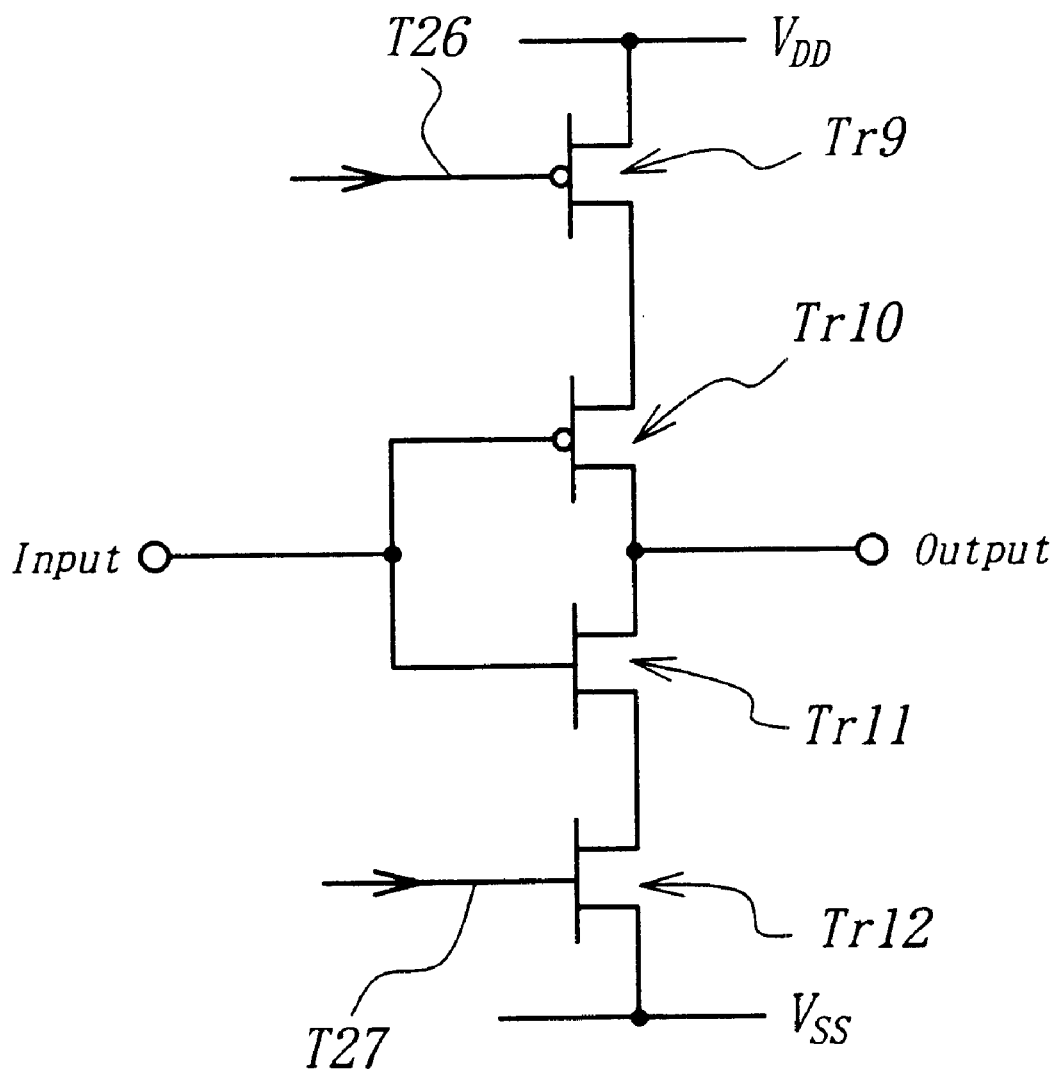
FIG. 31 is a composition diagram showing still another example of an adjusting element used in the electronic circuit of the third or fourth embodiment.
Figure 32:
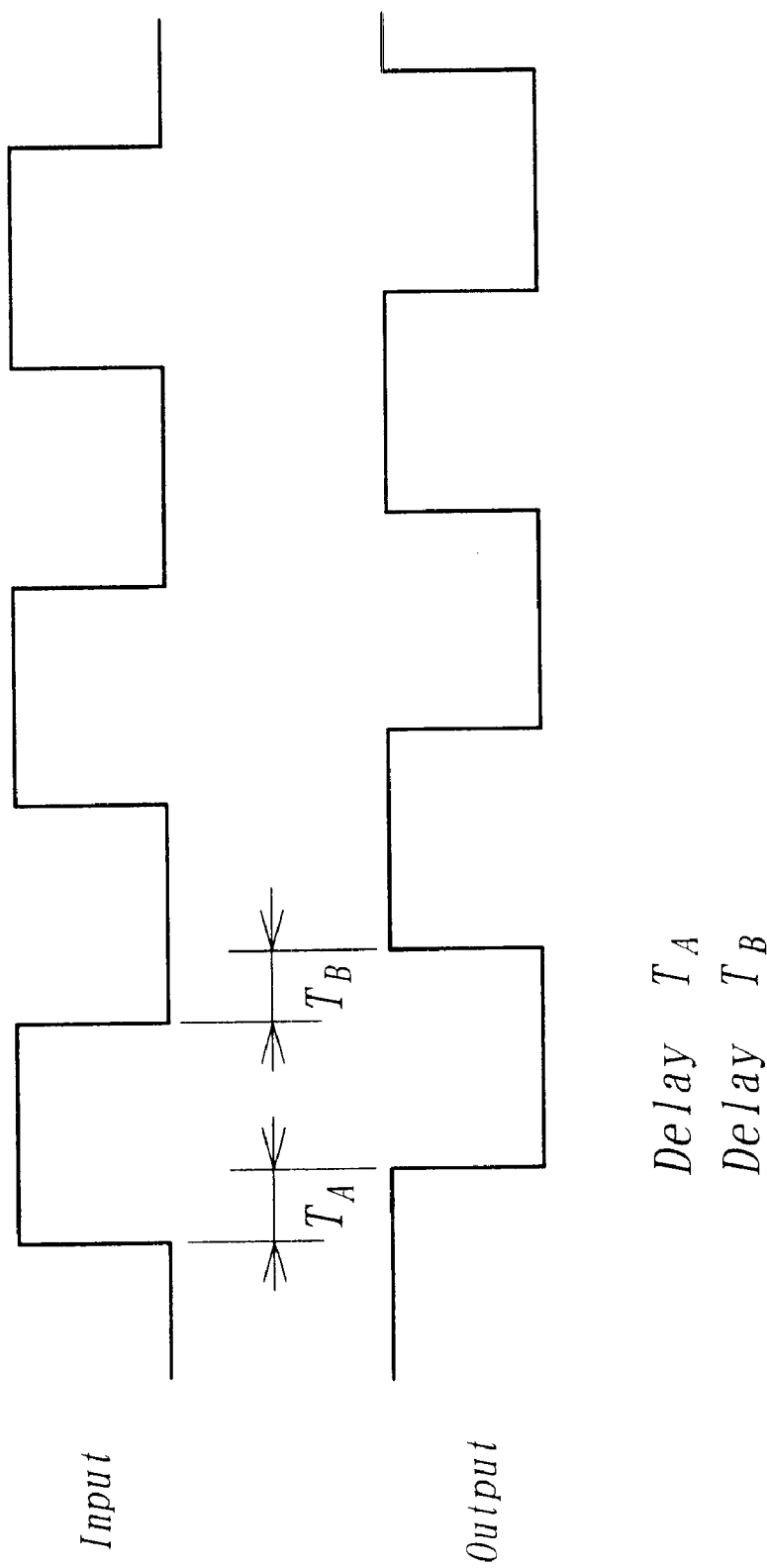
FIG. 32 is an explanatory diagram showing the characteristic of the adjusting element shown in FIG. 31.

FIG. 31 shows a composition example when changing a delay time (signal transfer timing) in an adjusting element 2. This is a circuit in which p-channel FETs Tr9 and Tr10, and n-channel FETs Tr11 and Tr12 are connected in series with one another, and Tr10 and Tr11 function as an inverter circuit. In this case, since the current in the circuit is changed depending upon the resistance values of Tr9 and Tr12, a time for charging or discharging a floating capacitance (parasitic capacitance) and a load capacitance. FIG. 32 shows the waveform of an input signal (input clock signal) to said inverter circuit and the waveform of an output signal (output clock signal) from said inverter circuit. The delay time TA can be adjusted by a control signal voltage inputted to T27, and the delay time TB can be adjusted by a control signal voltage inputted to T26. In case that it is enough to adjust the delay time of the rise time or the fall time of a clock signal, one of Tr9 and Tr12 can be omitted.

In FIG. 26, symbol 8 is a setting circuit, and this setting circuit 8 searches the optimum values as values to be held by a plurality of registers 5 according to a genetic algorithm in the same way as described in detail in the description of the first embodiment.

An adjusting method of the fourth embodiment of the present invention, said method being applied to the electronic circuit 1 of the embodiment shown in FIG. 26 is described in the following. The performance of the electronic circuit 1 can be represented by an evaluation function F using the transfer characteristics of a plurality of adjusting elements 2 as parameters. Making the performance of the electronic circuit 1 satisfy designated specifications is equivalent to obtaining parameter values to optimize the evaluation function F. The setting circuit 8 changes the values of the registers 5 by means of this evaluation function according to a genetic algorithm as described above.

Adjustment of the basic circuit 3 in the electronic circuit 1 is performed according to the flowchart shown in FIGS. 7 and 10 in the same way as the first embodiment. This embodiment is greatly characterized by directly using the values of the registers 5 as a chromosome in the genetic algorithm. Thanks to this, it does not need a circuit for converting information of a chromosome into register values. A D/A converter circuit 4 in this case outputs an adjusting signal voltage or an adjusting signal current according to the kind of an adjusting element 2.

And this embodiment uses as an evaluation function F for individuals in the genetic algorithm a function representing how close a characteristic obtained by the analyzer 9 is to an ideal characteristic, as a result of operating the electronic circuit 1 by means of the register values represented by the chromosome of an individual.

In step SI of FIG. 7, a plurality of individuals are generated using uniform random numbers as the initial population of the genetic algorithm. That is to say, this means that the value of each gene of each chromosome of the initial population takes a value of 1 in a probability of 0.5 and a value of 0 in a probability of 0.5.

Then, this embodiment operates the electronic circuit 1 by means of the register values represented by each individual, and uses a result of analysis by the analyzer 9 in step S3 and computes fitness using said evaluation function by the setting circuit 8 in step 4. Subsequently, this embodiment performs in order a selection process in step 24, a crossover process in step S25 and a mutation process in step S26, and thereby generates a population of individuals of the next generation (a candidate population for a solution).

In step S4, it is judged whether or not the performance of the electronic circuit 1 satisfies designated specifications, and when it has satisfied the designated specifications, the adjusting process is ended. And in case that chromosomes (register values) to satisfy the specifications cannot be obtained even when repeating the adjustment for a certain number of generations, the basic circuit 3 to be adjusted as well as the electronic circuit 1 are judged to be defective and are processed as such in step S8.

As described above, this embodiment uses a plurality of circuit elements being variable in transfer characteristics, namely, a plurality of adjusting elements 2 as circuit elements of the basic circuit 3 in the electronic circuit 1 and searches transfer characteristics of these adjusting elements 2 so that the function of the entire circuit becomes improved. Therefore, this embodiment makes it possible to absorb errors in characteristics of circuit elements caused by process irregularities in an electronic circuit manufacturing process, irregularities of materials, errors in design and the like, and to thus perform an adjustment so that the electronic circuit 1 has a function satisfying the designated specifications. This means that a higher function and a higher performance can be obtained by this embodiment, with a less design labor as compared to the prior art.

As a variation example of this embodiment, a circuit equivalent to the setting circuit 8 and the analyzer 9 may be built in the electronic circuit 1 in the same way as the first embodiment.

The first to fourth embodiments described above have used a genetic algorithm in a method for taking the initial values of the registers 5 and a method for changing the register values from the initial set values. However, in an evaluation function F representing fitness in a genetic algorithm, namely, representing how close the register set values are to an ideal solution, in case that the number of the local optimum solution is small (probably solutions of one digit), an algorithm called a simulated annealing method can be used in place of a genetic algorithm.

For details of a simulated annealing method, refer, for example, to "Simulated Annealing and Boltzmann Machines" written by E. Aarts and J. Korst, published by JOHN WILEY & SONS in 1989. A simulated annealing method is a kind of hill-climbing method, in which the search is not trapped by a local optimum solution, by using a control parameter called temperature.

Figure 33:
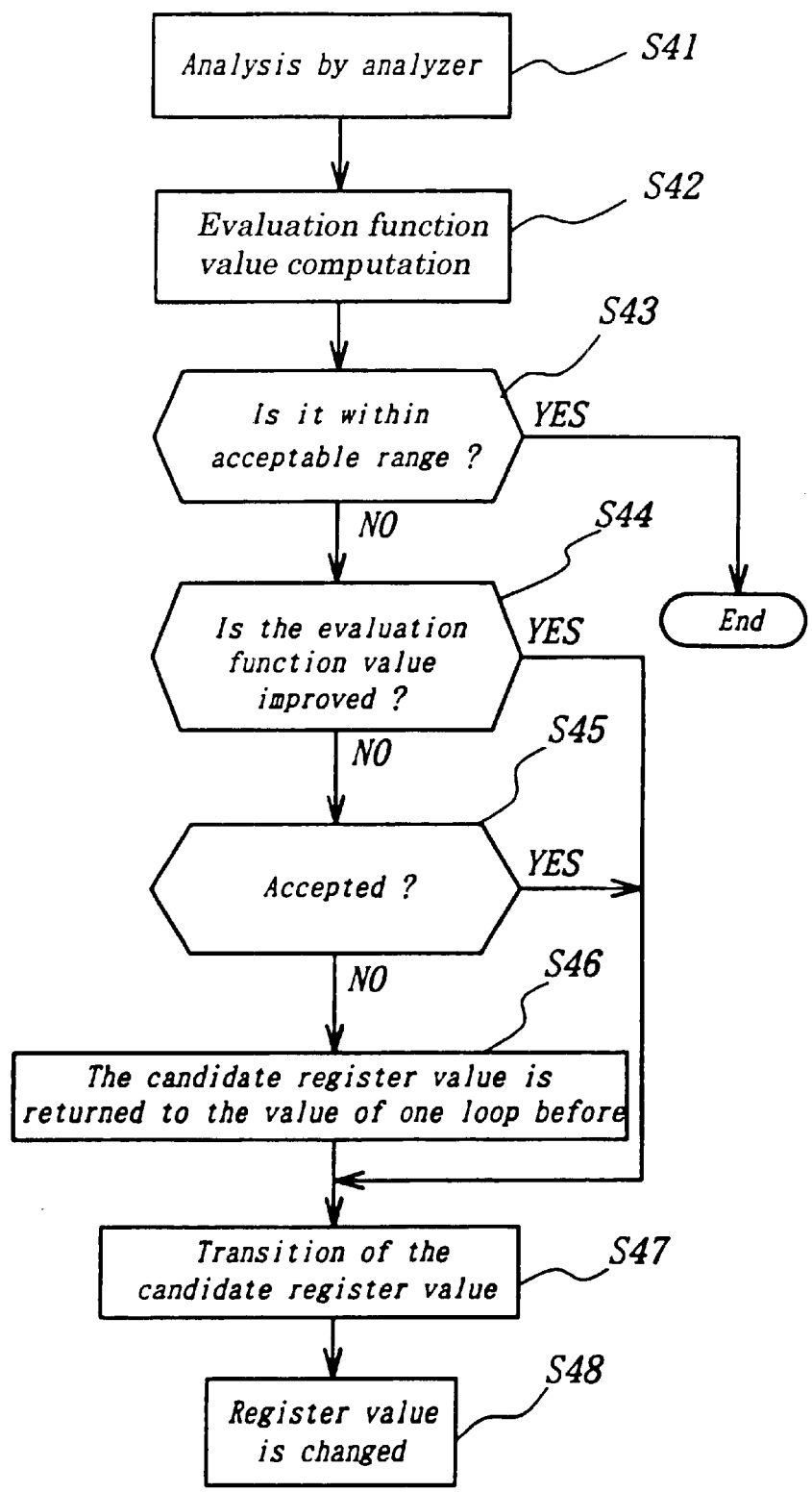
FIG. 33 is a flowchart showing a procedure using a simulated annealing method in a fifth embodiment of an electronic circuit and its adjusting method.

In a fifth embodiment of an electronic circuit and its adjusting method, as shown in FIG. 33, in the same circuit composition as the fourth embodiment, the setting circuit 8 changes the values of the registers 5 according to the simulated annealing method. This embodiment is characterized by directly using the values of the registers 5 as a candidate for a solution in the simulated annealing method. By doing in such a way, like the first embodiment, it is possible to make unnecessary a circuit for converting information of a candidate for a solution into register values.

Namely, the method of this embodiment operates the electronic circuit 1, as shown in FIG. 33, using a result of analysis by the analyzer 9 in step S41, and makes the setting circuit 8 compute the evaluation function value of a candidate for a solution by means of said evaluation function F in step S42. Then, in step S44, it judges whether or not this evaluation function value has been improved in comparison with the evaluation function value in the previous loop.

When it has been improved, this method takes the register values at this point of time as the next register values, and proceeds to step S47 and applies an operation to this candidate value of changing a part of these candidate register values by means of random numbers. This operation is called transition and corresponds to mutation in a genetic algorithm.

In case that the values have not been improved in step S44, this method computes the value of a function to be described later whose range is not less than 0 and not more than 1, in step S45, and said function is called an acceptance function. In case that this function value and the values of uniform random numbers generated between 0 to 1 are compared with each other and the random numbers are smaller than this function value, this method judges that this function value is to be accepted and proceeds to said step S47. In this case, the search results in going temporarily in the direction in which the evaluation function is degraded. In case that the random number values are larger than the acceptance function value, this method returns the candidate register values to the register values in the previous loop in step S46, and then proceeds to step S47.

The acceptance function is described by the following expression:

(Numeral expression 4), $$\exp(-(F(k)-F(k-1))/T(k))$$

where $F(k-1)$ is the evaluation function value in the previous loop and $F(k)$ is the evaluation function value in the current loop. $T(k)$ is a parameter called temperature, and the higher the temperature is, the closer the acceptance value is to 1. In other words, the higher the temperature is, the more the search proceeds in the direction of degradation. This is performed for the purpose of preventing the search from being stuck to a local optimum solution. Therefore, it is expected that a true optimum solution is finally attained by setting the temperature high at the initial stage of search and lowering gradually the temperature with the advance of the search. Such an operation is called "annealing".

In case that the relation between the performance of an electronic circuit 1 and an adjusting element 2 is comparatively simple and the evaluation function F of the electronic circuit 1 does not have a number of local optimum solutions, a simulated annealing method can perform a more efficient search in comparison with a genetic algorithm. In case that the evaluation function F has a number of local optimum solutions, however, it is necessary to very slowly lower the temperature and therefore it is not possible to find a solution satisfying designated specifications in a practical time. In such a case, the setting circuit 8 needs to use a genetic algorithm.

In step S48 then this method changes the register values so as to take the candidate register values as the register values and repeats the above-mentioned operation until evaluation function value is high and a satisfactory solution is obtained (until the performance of the electronic circuit 1 satisfies the designated specifications), and thereby performs adjustment of the electronic circuit 1.

In case that all combinations of the possible set values have been searched, or in case that no optimum solution can be obtained even if the process is repeated specified times or for a specified period of time, the electronic circuit 1 to be adjusted is determined as a defective product and is processed as a defective.

According to the above-mentioned simulated annealing method, in case that the evaluation function F of an electronic circuit 1 has only a small number of local optimum solutions, it is possible to prevent degradation of the function and performance of the electronic circuit 1 caused by variation of its circuit elements.

Figure 34:
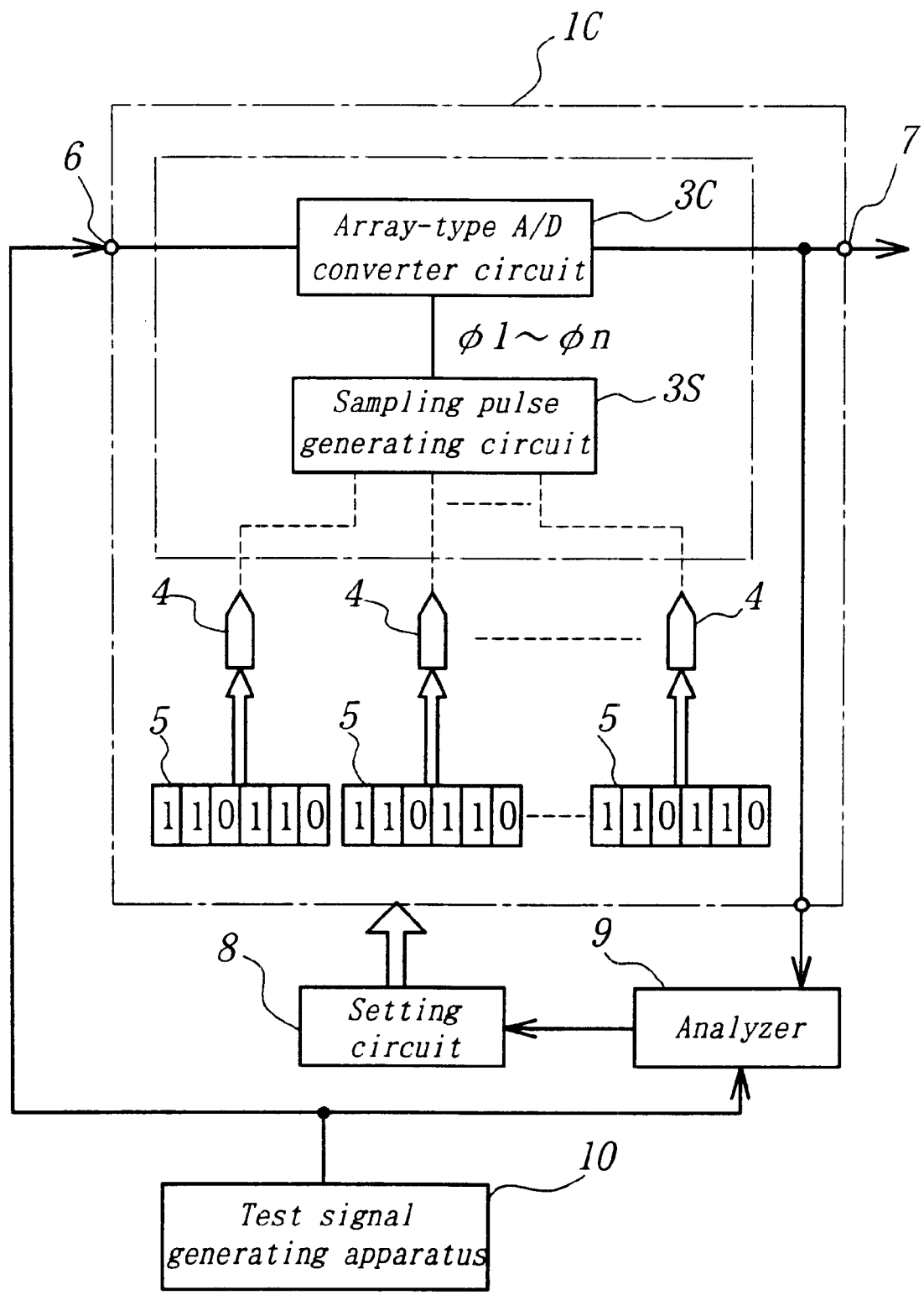
FIG. 34 is an explanatory diagram illustrating a sixth embodiment of an electronic circuit and its adjusting method.

FIG. 34 shows a composition example of an array-type analog-to-digital (A/D) converter circuit as a sixth embodiment of the present invention. In FIG. 34, symbol 1C represents an array-type A/D converter circuit as an electronic circuit, and this array-type A/D converter circuit 1C comprises an array-type A/D converter circuit basic part 3C and a sampling pulse generating circuit 3S as a basic circuit to be adjusted. In FIG. 34, the components equivalent to those of FIG. 3 are given the same symbols as them.

Figure 35:
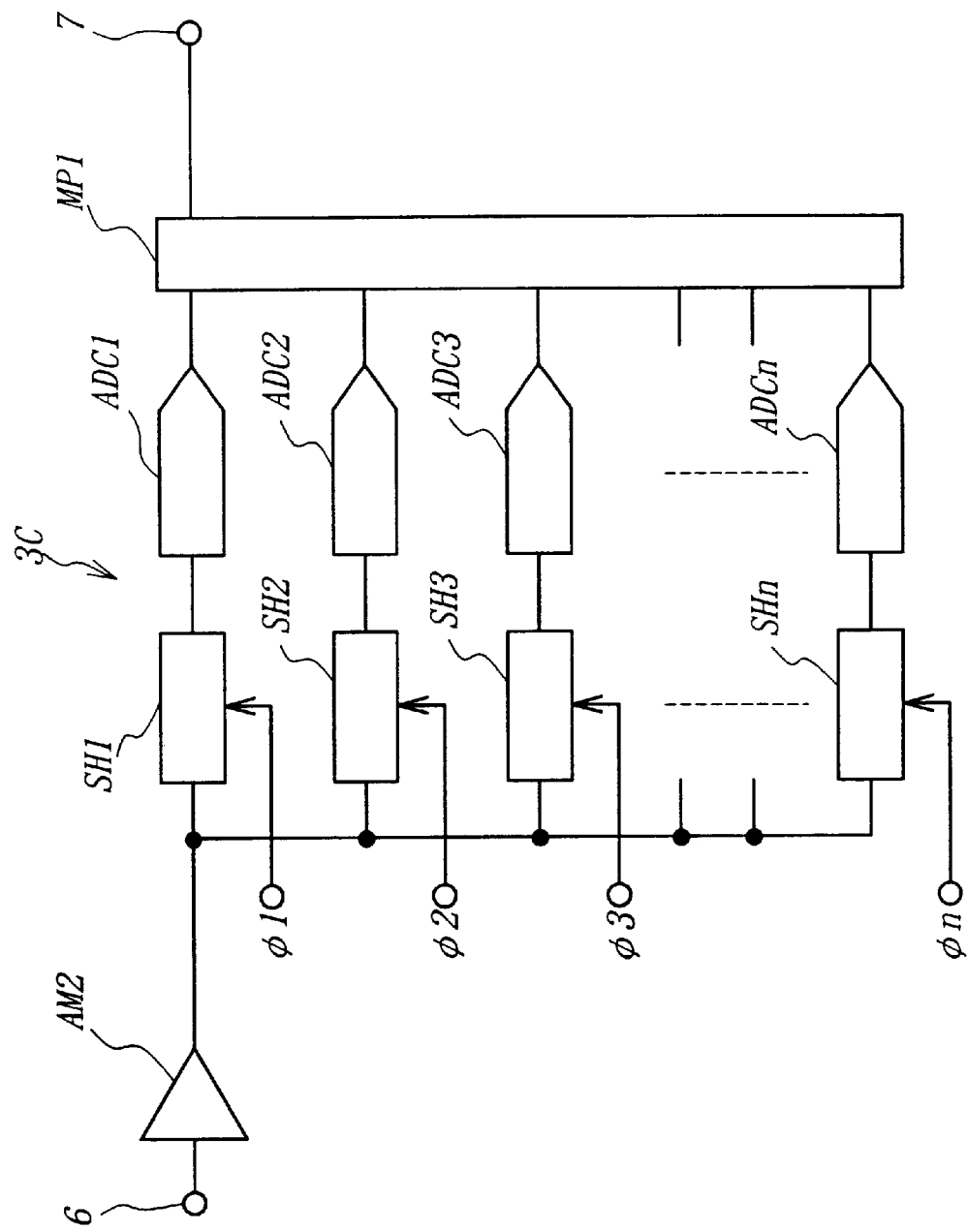
FIG. 35 is a composition diagram illustrating the main part of an array-type A/D converter circuit used in an electronic circuit of the fifth or sixth embodiment.

The array-type A/D converter circuit basic part 3C can fast perform an A/D conversion by operating a plurality of A/D converter circuits in parallel, and a composition example of it is shown in FIG. 35. Here, symbol AM2 is a buffer circuit, symbols SH1 to SHn represent sample-and-hold circuits composed equally to one another, ADC1 to ADCn represent A/D converter circuits composed equally to one another, MP1 represents a multiplexer circuit, and $\phi 1$ to $\phi n$ represent sampling pulses having two levels of H and L.

In this array-type A/D converter circuit basic part 3C, an analog signal inputted to an input terminal 6 is inputted through the buffer circuit AM2 into the n sample holding circuits SH1 to SHn in parallel. A sample holding circuit SH1 holds and outputs the value of a signal inputted at the moment of falling of a sampling pulse $\phi 1$ (transition from level H to level L). A sample holding circuit SH2 holds and outputs the value of a signal inputted at the moment of falling of a sampling pulse $\phi 2$. Sample holding circuits SH3 to SHn also operate in the same way respectively on the basis of sampling pulses $\phi 3$ to $\phi n$. The A/D converter circuits ADC1 to ADCn respectively convert inputted analog signals into digital signals and output them. The multiplexer circuit MP1 synthesizes parallel inputted n signals into one signal and outputs it.

When using such a composition, a conversion speed being n times a conversion speed obtained by a single A/D converter ADC can be obtained. In order to obtain the maximum conversion accuracy, however, it is ideal that all of the sample holding circuits SH1 to SHn are equal in performance to one another and all of the phase differences among the sampling pulses $\phi 1$ to $\phi n$ are equal to one another, namely, all of the phase difference between sampling pulses $\phi 1$ and $\phi 2$, the phase difference between $\phi 2$ and $\phi 3$ and so forth and the phase difference between $\phi(n-1)$ and $\phi n$ and the phase difference between On and $\phi 1$ are equal to one another.

Figure 36:
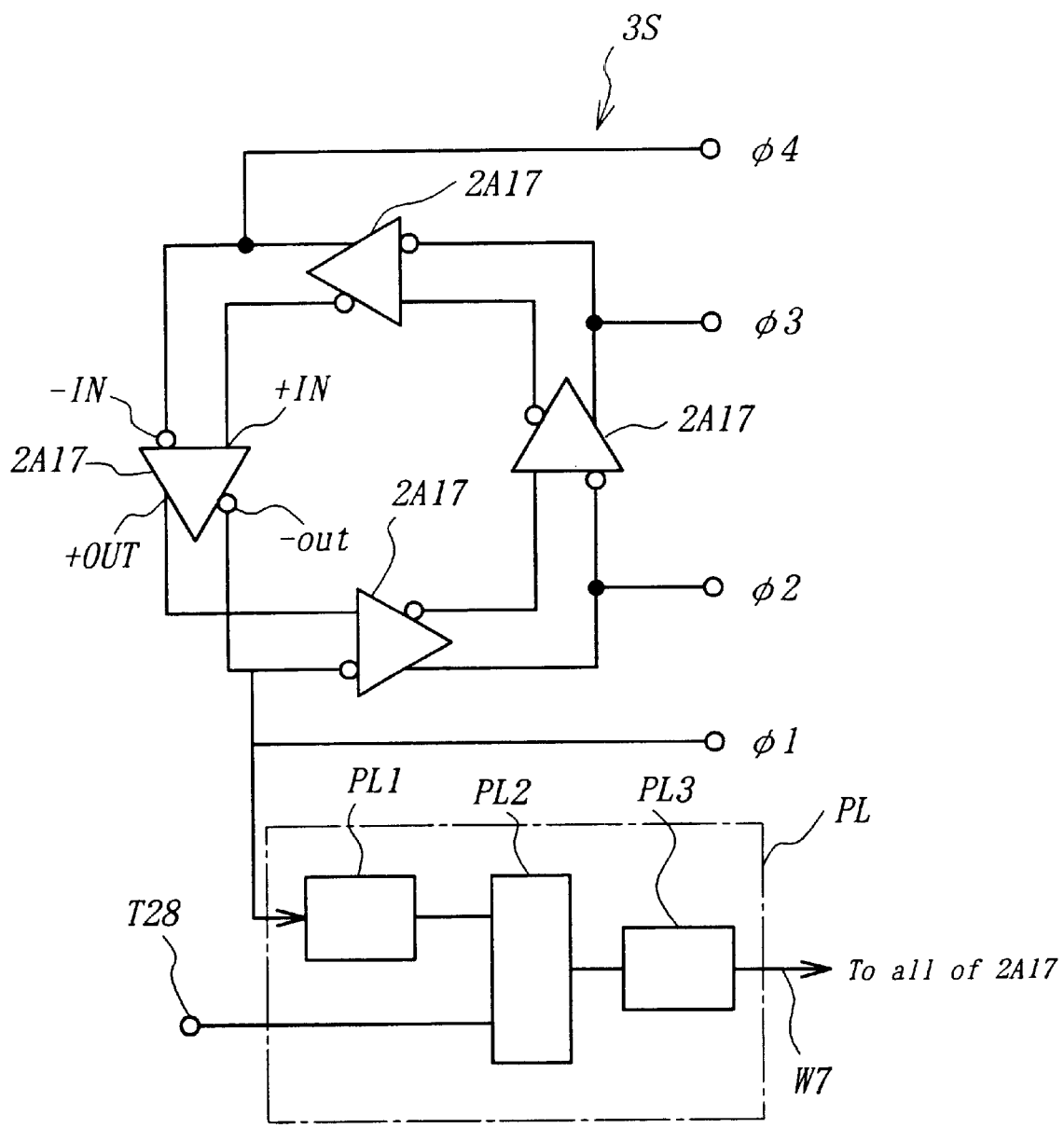
FIG. 36 is a composition diagram illustrating a sampling pulse generating circuit used in an electronic circuit of the fifth or sixth embodiment.

FIG. 36 shows a composition example of a sampling pulse generating circuit 3S used in said array-type A/D converter circuit 1C. Here, for convenience, a case of "n=4" is described. In FIG. 36, symbol 2A17 is differential amplifiers being variable in delay characteristic, symbols $\phi 1$ to $\phi 4$ are sampling pulses outputted, PL is a PLL control circuit, T28 is an input terminal for a synchronizing signal and W7 is a frequency control signal which is inputted into each of the differential amplifiers 2A17 as a control signal.

The PLL control circuit PL is composed of a frequency divider circuit PL1, a phase comparator circuit PL2 and a loop filter (integrator) PL3, and synchronizes the sampling pulses $\phi 1$ to $\phi 4$ with a synchronizing signal from T28. The frequency divider circuit PLI divides the frequency of a sampling pulse $\phi 1$. This dividing ratio is equal to the ratio of the frequency of a synchronizing signal to the frequency of a sampling pulse. The phase comparator circuit PL2 detects a phase difference between the sampling pulse $\phi 1$ and the synchronizing signal and generates a signal for controlling the frequency of a loop oscillator by the differential amplifier 2A17. The loop filter PL3 outputs a stable frequency control signal which is a direct current component by an integrating process.

The differential amplifiers 2A17 are connected to one another in the form of a loop to form a loop-type oscillator. When all of the differential amplifiers 2A17 have the same characteristics, the sampling pulses $\phi 1$ to $\phi 4$ are different in phase by 360/4 degrees (=90 degrees) from one another.

In order to make the timing of sampling an input signal in the array-type A/D converter circuit basic part 3C be a specified timing, it is necessary to adjust in phase the sampling pulses $\phi 1$ to $\phi n$ ($\phi 1$ to $\phi 4$ in the example illustrated) by adjusting the sampling pulse generating circuit 3S. By the way, the time difference between a sampling pulse and an actual sampling operation is not uniform due to errors in a manufacturing process of the A/D converters ADC1 to ADCn. Therefore, it is necessary to adjust the characteristics of the sampling pulse generating circuit 3S so as to be adapted to the characteristics of the array-type A/D converter circuit basic part 3C, and the delay in the individual differential amplifiers 2A17 are adjusted.

Figure 37:
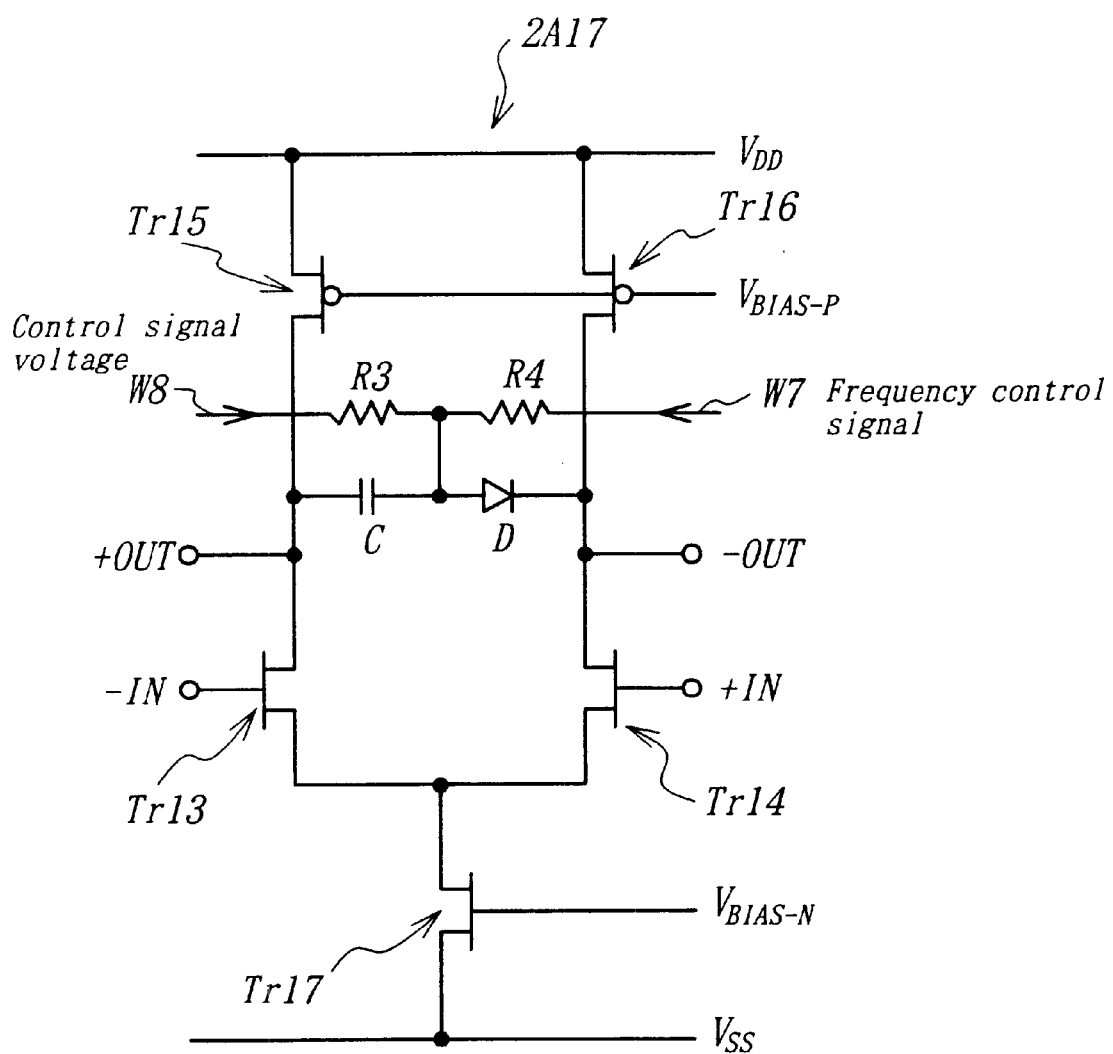
FIG. 37 is a composition diagram illustrating a differential amplifier used in the sampling pulse generating circuit.

FIG. 37 shows a composition example of a differential amplifier 2A17. Symbols Tr13 and Tr14 are MOS FETs, which respectively amplify signals −N and +N inputted to their gates and output signals +OUT and −OUT to their drains. Symbols Tr15 and Tr16 are MOS FETs, whose sources are connected to a power line VSS and whose gates are connected to a bias voltage VBIAS-P. Symbol Tr17 is an MOS FET, which has its source connected to the power line VSS and its gate connected to the bias voltage VBIAS-N, and outputs a bias current from its drain to Tr13 and Tr14. A capacitor C and a variable-capacitance diode D are connected in series between +OUT and −OUT, and the variable-capacitance diode D varies in electrostatic capacitance according to an reverse bias voltage.

A control signal voltage W8 from an external D/A converter 4 and a frequency control signal W7 from the PLL control circuit PL are synthesized through the resistors R3 and R4 to change the reverse bias voltage of the variable-capacitance diode D and change the electrostatic capacitance value of the variable-capacitance diode D. Thus, since the delay quantities of +OUT and −OUT are changed, the delay quantities in the differential amplifiers 2A17 can be changed according to the set values of the registers 5.

A sixth embodiment of an adjusting method of the present invention for adjusting such a array-type A/D converter circuit 1C is described. A method of this embodiment also is basically similar to the adjusting method of the first embodiment.

After the array-type A/D converter circuit 1C as well as the array-type A/D converter circuit basic part 3C and the sampling pulse generating circuit 3S have been manufactured, in an inspection process as shown in FIG. 34, the setting circuit 8, the analyzer 9 and the test signal generating apparatus 10 are connected to said circuits 3C and 3S, and the test signal generating apparatus 10 inputs a test signal to the input terminal 6. The test signal is, for example, a sine wave which is synchronized with the synchronizing signal and is as small as possible in distortion.

In case that the timing of a sampling operation is shifted from a specified timing, an output from the output terminal 7 is slipped from a value expected from a test signal. Therefore, it is enough that the setting circuit 8 uses the magnitude of a discrepancy of data from an expected value of an output signal outputted by the analyzer 9 in an evaluation function. For example, in case that an expected value of an output signal is "1010110100" in binary notation and its actual output signal is "1010111001, the magnitude of a discrepancy of data is represented by the following expression:

(Numeral expression 5)
|011010110100-1010111001|=101 (binary number)=5 (decimal number)

The method of this embodiment performs adjustment by using the magnitude of such a discrepancy of data as described above in an evaluation function. The setting circuit 8 sets the adjustment value (capacitance value of D) of the differential amplifier 2A17 according to the same procedure as the method of the first embodiment.

Namely, this embodiment uses circuit elements being variable in capacitance (variable-capacitance diode) D and searches signal delay quantities in the differential amplifiers 2A17 (capacitance values) so that the function of the entire circuit becomes improved. According to this embodiment, therefore, it is possible to absorb errors in characteristics of circuit elements caused by process irregularities in a manufacturing process of an array-type A/D converter circuit basic part 3C and a sampling pulse generating circuit 3S, quality irregularities of members, errors in design and perform adjustment so that the array-type A/D converter circuit basic part 3C and the sampling pulse generating circuit 3S as well as the array-type A/D converter circuit 1C satisfy designated specifications.

As described above, the present invention is also effective when adjusting a circuit to be directly adjusted (sampling pulse generating circuit 1S) so as to compensate for the characteristics of another circuit (array-type A/D converter circuit basic part 3C) forming a basic circuit in cooperation with said sampling pulse generating circuit.

Figure 38:
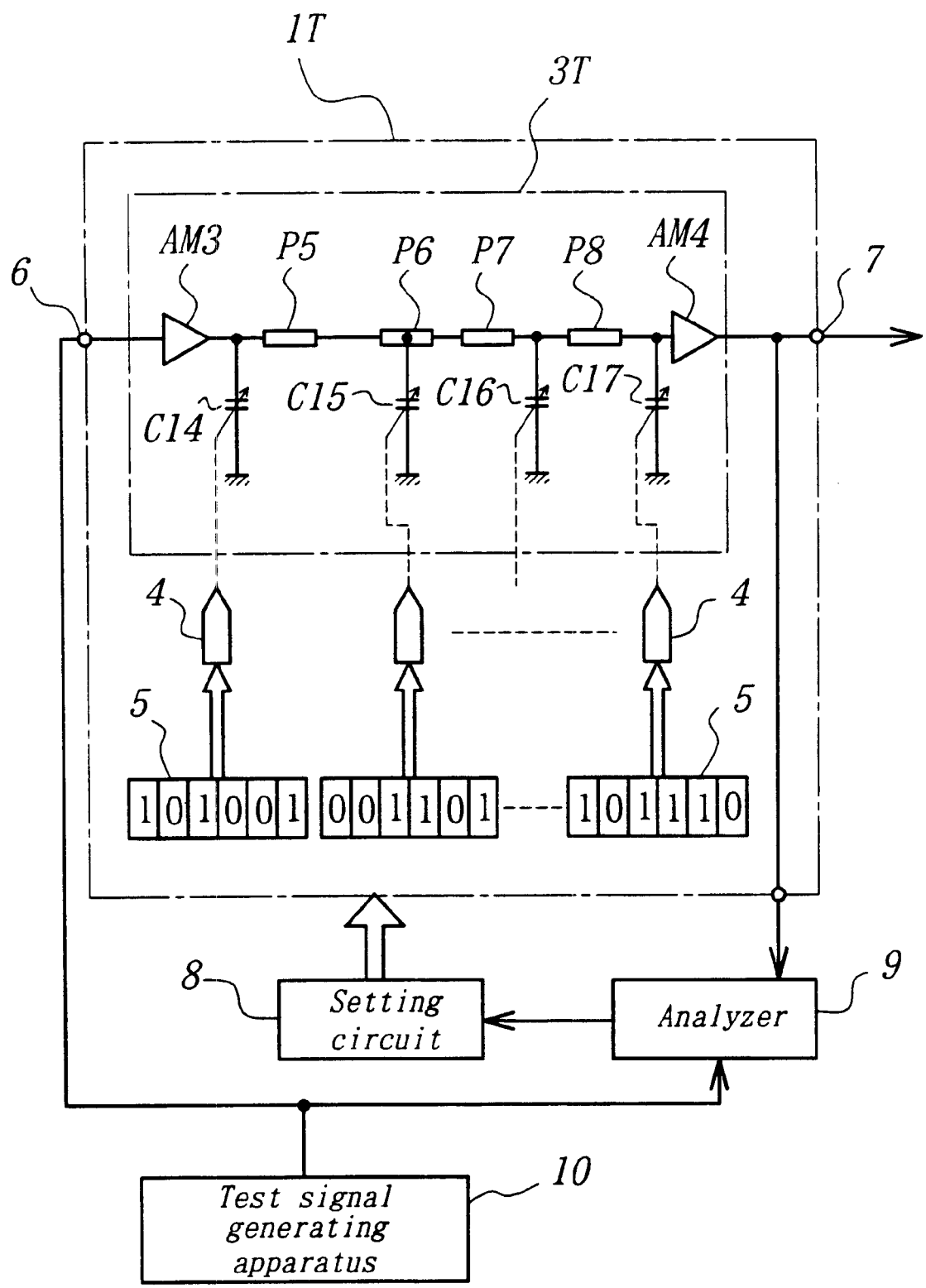
FIG. 38 is an explanatory diagram illustrating a seventh embodiment of an electronic circuit and its adjusting method.

FIG. 38 shows a composition example of a circuit provided with buffers on a data transmission line (hereinafter referred to as a data transmission circuit) as a seventh embodiment of an electronic circuit of the present invention. Therefore, a data transmission line means a line for mainly transmitting digital data, and the data transmission line is made by combining wiring on a printed circuit board, a connector part, a cable, wiring inside an 1C, and is often composed of a plurality of parts. When the plurality of parts of such a data transmission line are different in characteristic impedance, a signal to be transmitted is reflected and distorted in waveform at a point where the characteristic impedance changes, and a transmission error of digital data sometimes occurs. Therefore, this embodiment adds a plurality of capacitors for reducing such a distortion and adjusts the electrostatic capacitance values of these capacitors so that the distortion is minimized. In FIG. 38, the same components as those of FIG. 3 are given the same symbols as those.

In FIG. 38, symbol IT is a data transmission circuit, 3T is a data transmission circuit main part to be adjusted as a basic circuit, P5 to P8 are transmission lines, and AM3 and AM4 are buffers. The transmission lines P5 to P8 are different in characteristic impedance from one another. In the data transmission circuit main part 3T, symbols C14 to C17 are variable-capacitance elements capable of being changed in electrostatic capacitance and are properly connected to the transmission lines. The variable-capacitance elements C14 to C17 have their respective parameters adjusted by control signals shown by dotted lines in FIG. 38. In this embodiment, the number of such adjusting points are four. Accordingly, this embodiment uses four pairs of D/A converter 4 and register 5 for generating control signals.

And in FIG. 38, symbols 6 and 7 represent respectively an input signal terminal and an output signal terminal, and a setting circuit 8 and an analyzer 9 are external apparatuses.

Therefore, the buffer AM3 functions as a transmission buffer for sending out an input signal from the input signal terminal 6 to a transmission line, and the buffer AM4 functions as a receiving buffer for outputting data (signal) from a transmission line to the output signal terminal 7. The variable-capacitance elements C14 to C17 can be composed, for example, in the same way as the second embodiment.

In such a data transmission circuit main part 3T, when the adjustment value (capacitance) of one variable-capacitance element is changed, the optimum adjustment values of the other variable-capacitance elements are also changed. In order to adjust the transmission circuit main part 3T so as to come into such an improved state (a state where a transmission error is minimum) that its characteristics satisfy designated specifications, therefore, it is necessary to comprehensively adjust the adjusting points C14 to C17.

Next, a seventh embodiment of an adjusting method of the present invention for adjusting said data transmission circuit 1T is described. An adjusting method of this embodiment also is basically similar to the adjusting method of the first embodiment, and according to this adjusting method, the variable-capacitance elements C14 to C17 are adjusted so that the waveform distortion of a signal propagating on the transmission lines P5 to P8 is minimized.

After the data transmission circuit IT of this embodiment has been manufactured, in an inspection process, as shown in FIG. 38 the setting circuit 8, the analyzer 9 and the test signal generating apparatus 10 are connected to this transmission circuit 1T, and the test signal generating apparatus 10 inputs a test signal to the input terminal 6 of the transmission circuit 1T. An evaluation function in this case, for example, adopts the error rate of data transmission, where the error rate of an ideal data transmission is 0. The setting circuit 8 sets the adjustment values of the variable-capacitance elements C14 to C17 of the data transmission circuit main part 3T according to the same procedure as the adjusting method of the first embodiment.

This embodiment uses the circuit elements C14 to C17 being variable in capacitance of their transmission characteristics as circuit elements of the data transmission circuit IT, and searches the characteristics of these adjusting elements so that the function of the entire circuit becomes improved. According to this embodiment, therefore, it is possible to absorb errors in characteristics of the circuit elements caused by process irregularities in a manufacturing process of the data transmission circuit IT, irregularities of materials, errors in design and adjust the data transmission circuit IT so as to satisfy designated specifications (to minimize the error rate of data transmission).

Although this embodiment uses four transmission lines, it is a matter of course that the present invention does not care about the number of transmission lines being different in impedance. It is effective that the space between variable-capacitance elements adjacent to each other is made less than one-fourth the wavelength corresponding to the maximum bit rate (frequency) of handled data. And it is more effective to adjust in characteristics the buffers AM3 and AM4 in addition to the variable-capacitance elements C14 to C17.

In case that there are a plurality of conditions for operating an electronic circuit and said conditions have respectively the optimum adjustment results of the electronic circuit being different from one another, the present invention can adopt a method of providing plural sets of registers for each adjusting element and of changing over the registers for each condition.

And since the operation characteristics of an electronic circuit sometimes varies according to the temperature of the circuit, the optimum adjustment result may also be changed with the temperature. Furthermore, it may be sometimes necessary to change the specifications of an electronic circuit (for example, the center frequency of a filter circuit) from its initial specifications.

Figure 39:
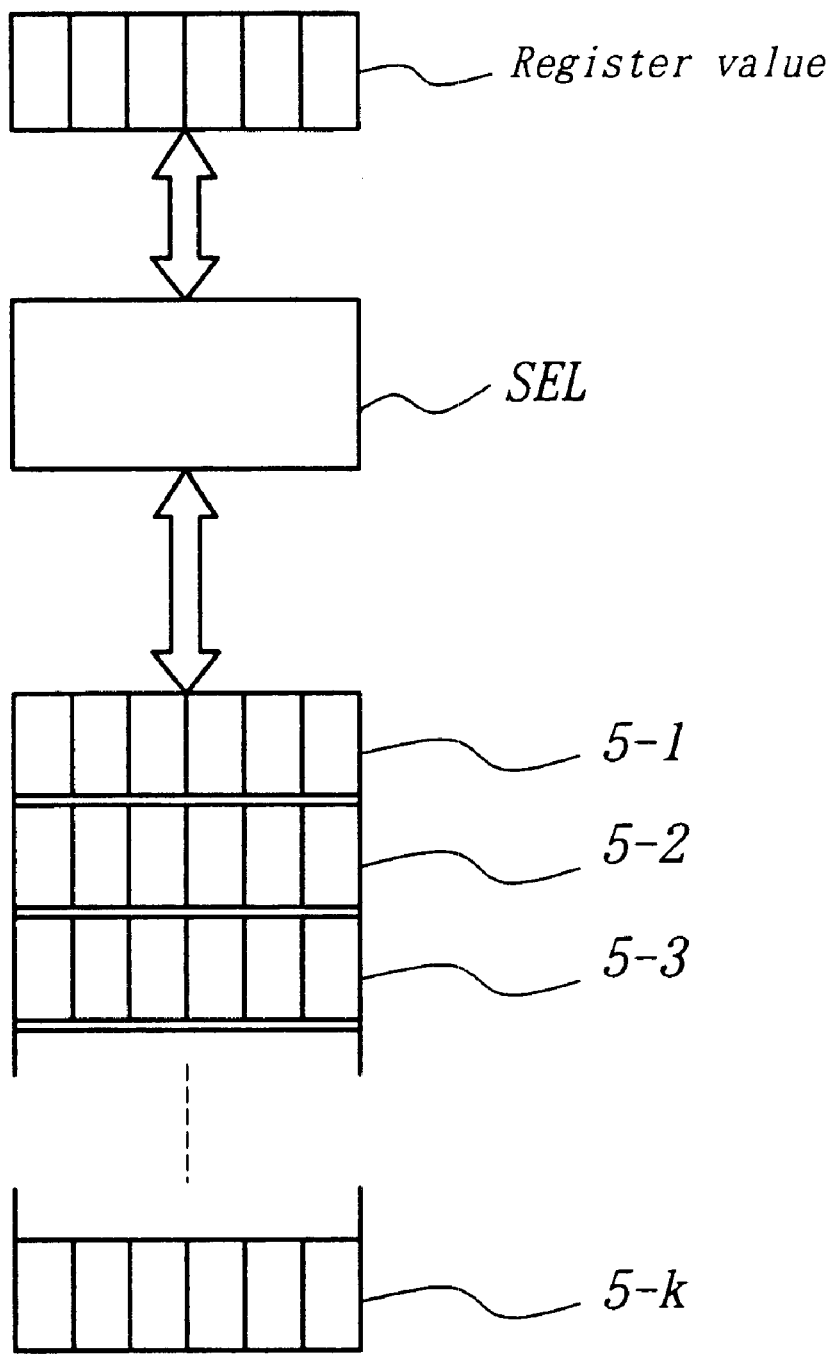
FIG. 39 is an explanatory diagram showing another composition of a register which can be used in an electronic circuit and its adjusting method.

FIG. 39 shows a composition example when changing over registers for each condition. Therefore, it is assumed that the number of conditions is k. Symbol SEL is a selector for changing over the corresponding registers 5 according to a condition and symbols "5-1" to "5-k" are the k registers 5. Therefore, for convenience, "i" in "5-i" is referred to as a register number.

An adjusting method when using such a composition can perform adjustment in the following manner, for example. When attempting to keep constant the characteristics of an electronic circuit even when the temperature of the circuit is changed, this method makes temperatures and register numbers correspond to each other in advance, and in an inspection process, performs adjustment by means of a method of the present invention at a temperature corresponding to each register number, and stores the adjustment result in the registers 5-1 to 5-k.

And when using the electronic circuit, the electronic circuit detects the temperature of it and selects a corresponding register number by means of the selector SEL.

The above-mentioned method can omit adjustment at temperatures corresponding to some register numbers, and in such a case it is enough to store register values estimated by interpolation from other adjusted register values in the said registers in advance. A linear approximation, a spline function can be used as a method for interpolation.

It is possible also to change over the characteristics of an electronic circuit corresponding to a plurality of specified conditions. In this case, this method makes specified conditions and register numbers correspond to each other in advance, and in an inspection process, performs adjustment by means of a method of the present invention at a specified condition corresponding to each register number, and stores the adjustment result in the registers 5-1 to 5-k. And when using the electronic circuit, this circuit selects a register number corresponding to a specified condition by means of the selector SEL.

The above-mentioned method similarly can omit adjustment at specified conditions corresponding to some register numbers, and in such a case it is enough to store register values estimated by interpolation from other adjusted register values in the said registers in advance.

Figure 40:
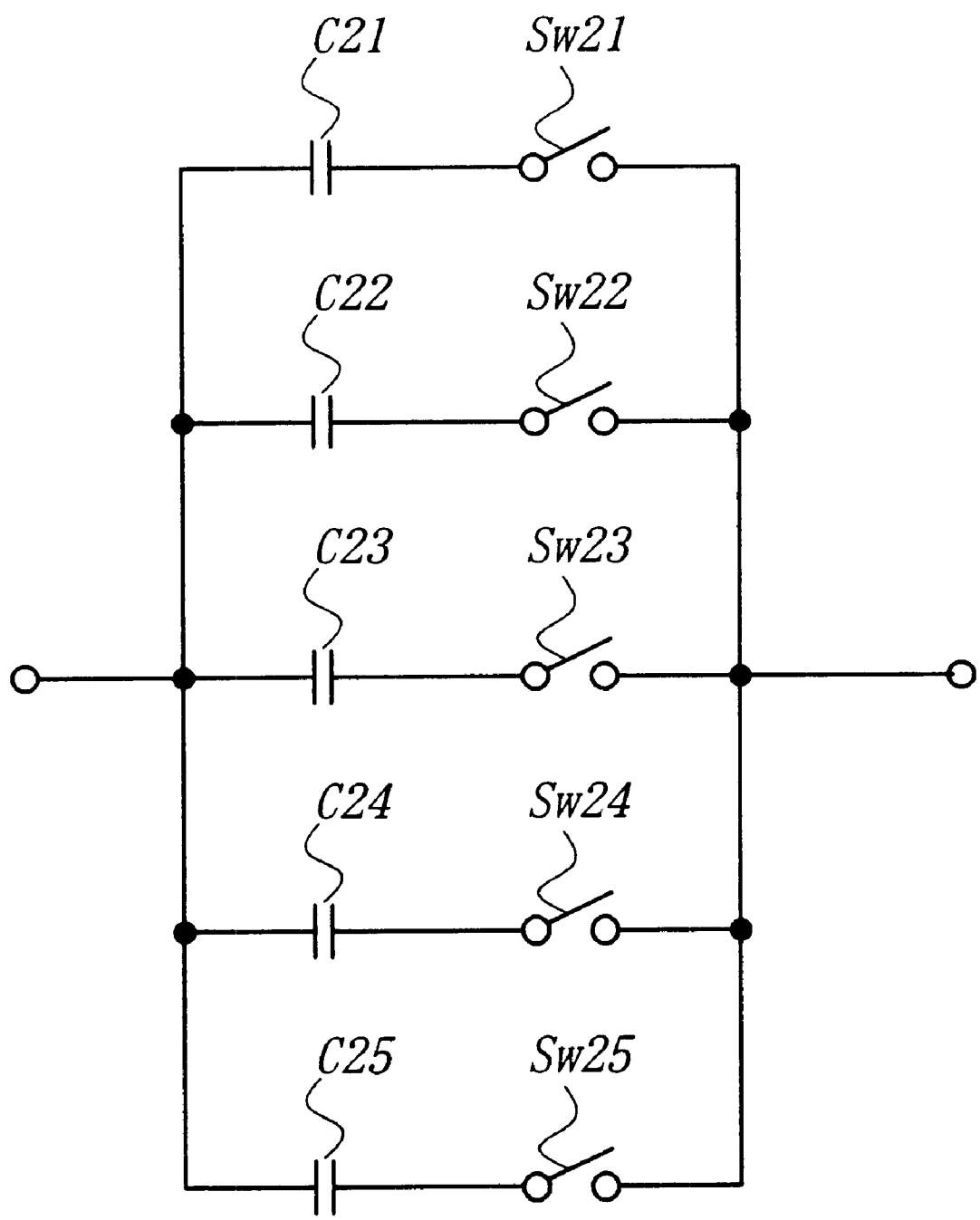
FIG. 40 is an explanatory diagram showing another composition of an adjusting element which can be used in an electronic circuit and its adjusting method.

An adjusting element 2 in an electronic circuit of the present invention can be also composed as shown in FIG. 40. In this case a D/A converter 4 can be omitted, and it is possible to directly set a parameter of an adjusting element 2 by means of the register value of a register 5.

FIG. 40 shows a composition example when adjusting an adjusting element 2 by changing over elements having different characteristics by means of switches, and in FIG. 40 symbols C21 to C25 are respectively capacitors having capacitance values being different from one another, and symbols Sw21 to Sw25 are switches turning on/off correspondingly to the register values of the registers 5. In this case, five capacitors and the respective switches corresponding to them are connected in series with each other and these series circuits are connected in parallel with one another, and the electrostatic capacitance of a capacitor C21 is taken as a reference value CU and the other capacitors are weighted in the binary system, and it is set that the electrostatic capacitance value of the capacitor C22 is 2CU, the electrostatic capacitance value of the capacitor C23 is 4CU, the electrostatic capacitance value of the capacitor C24 is 8CU and the electrostatic capacitance value of the capacitor C25 is 16CU.

Switches Sw21 to Sw25 are in the on state when the corresponding bits of the registers 5 are "1" respectively, and are in the off state when the said bits are "0", respectively. The resultant electrostatic capacitance of this circuit can be changed within a range from 0CU to 31CU by turning on/off the switches Sw21 to Sw25 corresponding to the register values of the registers 5.

This composition example is an example in case that a register 5 corresponding to an adjusting element 2 is of 5 bits, but an adjusting element 2 can be composed in the same way by using the same number of capacitors and the same number of switches as the number of bits of the register 5 regardless of the number of bits.

And such an adjusting element 2 can be similarly composed by connecting such a switch in series with another element, for example, a resistor, a coil, a Gm amplifier or the like in place of a capacitor, and in such a case it is possible to change a resistance value, an inductance value or a transconductance value, respectively.

Figure 41:
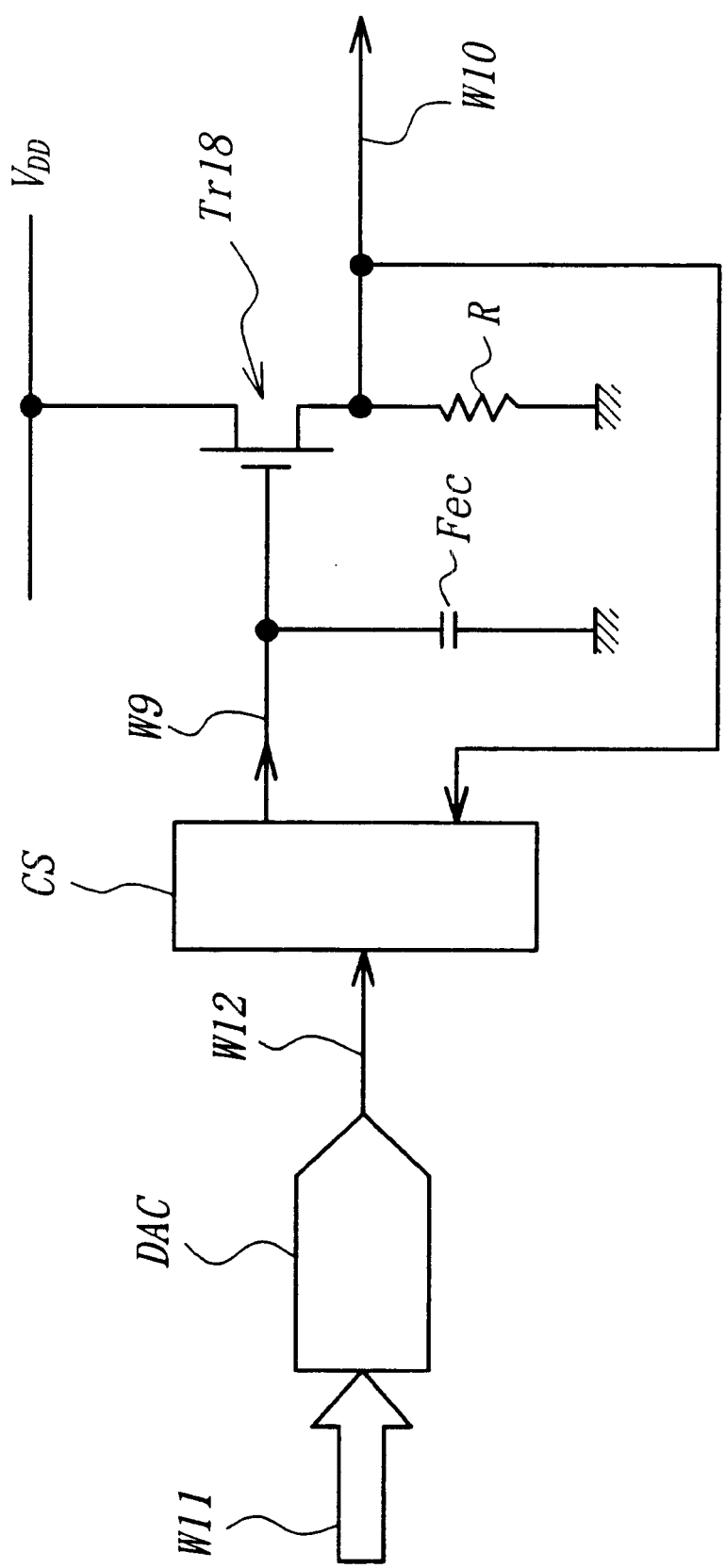
FIG. 41 is an explanatory diagram showing still another composition of an adjusting element which can be used in an electronic circuit and its adjusting method.

On the other hand, a register 5 in an electronic circuit of the present invention can be also composed as shown in FIG. 41. In this case it is possible to directly set a parameter of an adjusting element 2 by means of an analog control signal value of the register 5. Namely, this is a composition which holds an analog value as a control signal by means of a holding circuit for holding a control signal to control an element parameter.

In FIG. 41, symbol Fec is an electric charge storing element using ferroelectrics, and this electric charge storing element Fec can increase or decrease its stored electric charge according to an electric current from the outside. In this electric charge storing element, a voltage is generated at both ends of it according to its stored charge. And the stored charge is kept constant for a long period of time (almost 1 to 10 years or longer) so long as an electric current is not applied intentionally from the outside. Thanks to this, the electric charge storing element Fec can hold a constant analog voltage.

And in FIG. 41, symbol CS is a write control circuit of the electric charge storing element Fec, symbol W9 is a write current of Fec, and Tr18 is an MOS FET. The drain of Tr18 is connected to a power line VDD, its gate is connected to Fec and the write control circuit CS, and its source is connected to a resistor R and the write control circuit CS. The voltage of the electric charge storing element Fec is inputted to the gate of Tr18 and a voltage corresponding to the input voltage at the gate is generated at the source of Tr18, and a control signal voltage W10 to the adjusting element is outputted from there.

In FIG. 41, symbol W11 is a set value outputted from the setting circuit 8, and this set value W11 is converted into an analog signal W12 by a D/A converter DAC and is inputted into the write control circuit CS. When writing a set value into the electric charge storing element Fec, the write control circuit CS outputs a write current W9 so that the voltage value of the control signal voltage W10 and the voltage value of the analog signal W12 of the set value become equal to each other, and adjusts the amount of stored electric charge of the electric charge storing element Fec.

Except when writing into the electric charge storing element, it is necessary that an electric current in the circuit connected to the electric charge storing element is always very small, and the current value of the write current W9 is set as 0.

According to this composition example, since the register 5 functions as a memory circuit for storing a control signal having an analog value, the D/A converter 4 in the electronic circuit 1 of the present invention can be omitted and the register 5 can be also made small in size.

The present invention can be of course applied to any of the whole, a part and plural parts of an apparatus using an electronic circuit, and does not care about the scale of the electronic circuit.

And adjustment by a method of the present invention has little difficulty even in case that the output voltage/current of a D/A converter is low in accuracy and its monotonicity is not guaranteed. Therefore, a D/A converter 4 used in the present invention can be made in a smaller area than the prior art on a semiconductor substrate.

While this invention has been described with specific embodiments thereof, it is evident that many alternatives, modifications, and variations will be apparent to those skilled in the art. Accordingly, the preferred embodiments of the invention as set forth herein are intended to be illustrative, not limiting. Various changes may be made without departing from the spirit and scope of the invention.

What is claimed is:

1. An electronic circuit being provided with a plurality of circuit elements and performing a specified function, comprising:
    a plurality of specific circuit elements related to a basic circuit performing said specified function,
    said plurality of circuit elements are composed of circuit elements changing their element parameters according to values indicated by control signals,
    said electronic circuit is provided with a plurality of holding circuits for holding a plurality of control signals to be given to said plurality of specific circuit elements,
    the values of said plurality of control signals which said plurality of holding circuits hold are changed by an external apparatus according to a probabilistic searching technique so that said specified function of said electronic circuit satisfies designated specifications.

2. An electronic circuit according to claim 1, wherein the probabilistic search technique changes the values of said control signals according to a genetic algorithm.

3. An electronic circuit according to claim 1, wherein the probabilistic search technique changes the values of said control signals according to a simulated annealing method.

4. An electronic circuit according to claim 1, wherein;
    said external apparatus uses an evaluation function for weighting and integrating a plurality of evaluation results of said electronic circuit in searching said optimum values.

5. An electronic circuit according to claim 1, wherein;
    said circuit is an analog filter circuit.

6. An electronic circuit according to claim 5 wherein;
    said circuit is a Gm-C filter circuit.

7. An electronic circuit according to claim 1, wherein;
    said circuit is a high-frequency circuit.

8. An electronic circuit according to claim 1, wherein;
    said circuit is an integrated circuit.

9. An electronic circuit being provided with a plurality of circuit elements and performing a specified function, wherein;
    a plurality of specific circuit elements related to a circuit performing said specified function out of said plurality of circuit elements are composed of circuit elements changing their element parameters according to values indicated by control signals,
    said electronic circuit is provided with a plurality of holding circuits for holding a plurality of control signals to be given to said plurality of specific circuit elements, and
    said electronic circuit is provided with a setting means for changing the values of a plurality of control signals which said plurality of holding circuits hold so that said specified function of said electronic circuit satisfies designated specifications according to a probabilistic searching technique.

10. An electronic circuit according to claim 9, wherein said setting means changes in order the values of said control signals according to a genetic algorithm.

11. An electronic circuit according to claim 9, wherein said setting means changes in order the values of said control signals according to a simulated annealing method.

12. An electronic circuit according to claim 9, wherein;
    said setting means uses an evaluation function for weighting and integrating a plurality of evaluation results of said electronic circuit in searching said optimum values.

13. An electronic circuit according to claim 9, wherein; said circuit is an analog filter circuit.

14. An electronic circuit according to claim 9, wherein; said circuit is a high-frequency circuit.

15. An electronic circuit according to claim 9, wherein; said circuit is an integrated circuit.

16. A method for adjusting an electronic circuit being provided with a plurality of circuit elements and performing a specified function, wherein;
    a plurality of specific circuit elements related to a circuit performing said specified function out of said plurality of circuit elements are composed of circuit elements changing their element parameters according to values indicated by control signals, a plurality of holding circuits provided in said electronic circuit hold a plurality of control signals to be given to said plurality of specific circuit elements, the values of said plurality of control signals which said plurality of holding circuits hold are changed by an external apparatus according to a probabilistic searching technique so that said specified function of said electronic circuit satisfies designated specifications.

17. A method for adjusting an electronic circuit according to claim 16, wherein;

said external apparatus changes in order the values of said control signals according to a genetic algorithm.

18. A method for adjusting an electronic circuit according to claim 16, wherein said external apparatus changes in order the values of said control signals according to a simulated annealing method.

19. A method for adjusting an electronic circuit according to claim 16, wherein;

said external apparatus uses an evaluation function for weighting and integrating a plurality of evaluation results of said electronic circuit in searching said optimum values.

20. A method for adjusting an electronic circuit according to claim 16, wherein said circuit is an analog filter circuit.

21. A method for adjusting an electronic circuit according to claim 20, wherein said circuit is a Gm-C filter circuit.

22. A method for adjusting an electronic circuit according to claim 16, wherein said circuit is a high-frequency circuit.

23. A method for adjusting an electronic circuit according to claim 16, wherein said circuit is an integrated circuit.

24. A method for adjusting an electronic circuit being provided with a plurality of circuit elements and performing a specified function, wherein;

a plurality of specific circuit elements related to a circuit performing said specified function out of said plurality of circuit elements are composed of circuit elements changing their element parameters according to values indicated by control signals, a plurality of holding circuits provided in said electronic circuit hold a plurality of control signals to be given to said plurality of specific circuit elements, the values of said plurality of control signals which said plurality of holding circuits hold are changed, according to a probabilistic searching technique, by a setting means provided in said electronic circuit so that said function of said electronic circuit satisfies designated specifications.

25. A method for adjusting an electronic circuit according to claim 24, wherein said setting means changes in order the values of said control signals according to a genetic algorithm.

26. A method for adjusting an electronic circuit according to claim 24, wherein said setting means changes in order the values of said control signals according to a simulated annealing method.

27. A method for adjusting an electronic circuit claims 24, wherein;

said setting means uses an evaluation function for weighting and integrating a plurality of evaluation results of said electronic circuit in searching said optimum values.

28. A method for adjusting an electronic circuit according to claim 24, wherein said circuit is an analog filter circuit.

29. A method for adjusting an electronic circuit according to claim 24, wherein said circuit is a high-frequency circuit.

30. A method for adjusting an electronic circuit according to claim 24, wherein said circuit is an integrated circuit.

* * * * *